United States Patent
Yamazaki et al.

(10) Patent No.: US 10,662,055 B2
(45) Date of Patent: May 26, 2020

(54) MEMS ELEMENT, SEALING STRUCTURE, ELECTRONIC DEVICE, ELECTRONIC APPARATUS, AND VEHICLE

(71) Applicant: SEIKO EPSON CORPORATION, Tokyo (JP)

(72) Inventors: Takashi Yamazaki, Shiojiri (JP); Akihiko Ebina, Fujimi-machi (JP); Osamu Kawauchi, Shiojiri (JP); Yoshihiko Yokoyama, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 1 day.

(21) Appl. No.: 15/961,564

(22) Filed: Apr. 24, 2018

(65) Prior Publication Data

US 2018/0312395 A1 Nov. 1, 2018

(30) Foreign Application Priority Data

| Apr. 27, 2017 | (JP) | 2017-087982 |
| Apr. 27, 2017 | (JP) | 2017-087986 |
| May 17, 2017 | (JP) | 2017-097934 |
| May 30, 2017 | (JP) | 2017-106272 |
| Jul. 28, 2017 | (JP) | 2017-146224 |
| Jul. 28, 2017 | (JP) | 2017-146226 |

(51) Int. Cl.
*B81B 7/00* (2006.01)
*B81C 1/00* (2006.01)

(52) U.S. Cl.
CPC .......... *B81B 7/007* (2013.01); *B81C 1/00301* (2013.01); *B81B 2207/096* (2013.01)

(58) Field of Classification Search
CPC ............................ B81B 7/007; B81C 1/00301
USPC ............................................ 257/415; 438/50
See application file for complete search history.

(56) References Cited

U.S. PATENT DOCUMENTS

| 2007/0190680 A1 | 8/2007 | Fukuda et al. |
| 2008/0079142 A1 | 4/2008 | Carmona et al. |
| 2008/0188025 A1 | 8/2008 | Nakamura |
| 2009/0267165 A1* | 10/2009 | Okudo ............... B81C 1/00269 257/415 |
| 2010/0327380 A1 | 12/2010 | Chang |
| 2011/0133295 A1 | 6/2011 | Fujii et al. |
| 2011/0156242 A1 | 6/2011 | Sakaguchi et al. |
| 2013/0001710 A1 | 1/2013 | Daneman et al. |
| 2014/0239769 A1 | 8/2014 | Johnson et al. |
| 2015/0183634 A1* | 7/2015 | Wang ................... B06B 1/0292 73/643 |

(Continued)

FOREIGN PATENT DOCUMENTS

| JP | 2001-141463 A | 5/2001 |
| JP | 2006-021332 A | 1/2006 |

(Continued)

*Primary Examiner* — Didarul A Mazumder
(74) *Attorney, Agent, or Firm* — Oliff PLC

(57) ABSTRACT

A MEMS element includes a surface silicon layer on which an element is formed and on which a first electrode and a second electrode as element electrodes and an electrode pad connected to the first electrode and the second electrode are disposed, and in which a first wiring through-hole is disposed at a position overlapping with the electrode pad of the surface silicon layer and a wiring electrode electrically connected to the electrode pad is disposed in the first wiring through-hole, in plan view.

4 Claims, 37 Drawing Sheets

(56) References Cited

U.S. PATENT DOCUMENTS

2016/0187299 A1\* 6/2016 Wang ................. G01N 29/2406
73/643
2017/0156209 A1\* 6/2017 Wang ................. G01N 29/2406

FOREIGN PATENT DOCUMENTS

| | | | |
|---|---|---|---|
| JP | 2007-210083 | A | 8/2007 |
| JP | 2008-091334 | A | 4/2008 |
| JP | 2008-188711 | A | 8/2008 |
| JP | 2009-296569 | A | 12/2009 |
| JP | 2010-207987 | A | 9/2010 |
| JP | 2010-223850 | A | 10/2010 |
| JP | 2011-103473 | A | 5/2011 |
| JP | 2011-131309 | A | 7/2011 |
| JP | 2011-139018 | A | 7/2011 |
| JP | 2011-218463 | A | 11/2011 |
| JP | 2013-045893 | A | 3/2013 |
| JP | 2014-065099 | A | 4/2014 |
| JP | 2014-523815 | A | 9/2014 |
| JP | 2015-160293 | A | 9/2015 |
| JP | 2015-227970 | A | 12/2015 |
| JP | 2016-013879 | A | 1/2016 |
| JP | 2016-511607 | A | 4/2016 |
| JP | 2016-103550 | A | 6/2016 |
| JP | 2016-122759 | A | 7/2016 |
| JP | 2016-171393 | A | 9/2016 |
| WO | 2013/003784 | A2 | 1/2013 |
| WO | 2014/134301 | A1 | 9/2014 |
| WO | 2016/084343 | A1 | 6/2016 |

\* cited by examiner

MEMS ELEMENT, SEALING STRUCTURE, ELECTRONIC DEVICE, ELECTRONIC APPARATUS, AND VEHICLE

CROSS-REFERENCE TO RELATED APPLICATIONS

This application claims priority to Japanese Patent Application No. 2017-087982, filed Apr. 27, 2017, No. 2017-146224, filed Jul. 28, 2017, No. 2017-097934, filed May 17, 2017, No. 2017-106272, filed May 30, 2017, No. 2017-087986, filed Apr. 27, 2017, and No. 2017-146226, filed Jul. 28, 2017, the entirety of which are hereby incorporated by reference.

BACKGROUND

1. Technical Field

The present invention relates to a MEMS element, a sealing structure, an electronic device, an electronic apparatus, and a vehicle.

2. Related Art

In the related art, a MEMS vibrator in which an actuating element is formed on a silicon substrate using a micro electro mechanical system (MEMS) technology is known. For example, in the following JP-A-2016-171393, a method of manufacturing a MEMS vibrator by bonding a lid substrate also formed of a silicon substrate and provided with a through-hole electrode (TSV: Through Silicon Via) for external connection to a silicon substrate (element substrate) on which the actuating element is formed, vacuum sealing (decompression sealing) actuating space (internal space) of the actuating element, and dividing it into individual pieces is disclosed.

In addition, it is desired to realize a small and thin electronic devices and an electronic device accommodating a functional element using, for example, a silicon MEMS technology is being developed.

As such an electronic device, for example, in JP-A-2013-45893, an electronic device (electronic apparatus) which includes a covering structural body for separating a cavity portion (internal space) accommodating a functional element disposed above a substrate and has a sealing structure in which a first through-hole and a second through-hole larger than the first through-hole, which are provided in a first covering layer of the structural body and each of which is in communication with the cavity portion, are closed by a second covering layer disposed above the first covering layer is described.

For example, in JP-A-2007-210083, a MEMS element which includes a vehicle (functional element) mounted on a substrate and a lid for covering the vehicle so as to dispose the vehicle inside a cavity and has a sealing structure in which a through-hole provided in the lid so as to communicate the inside and the outside of the cavity is filled with a sealing film to be sealed is described.

However, in the MEMS vibrator described in JP-A-2016-171393, in order to vacuum-seal the actuating space, there is a problem that a high-level processing method for processing the bonding surface of the lid substrate provided with a through-hole electrode into a uniform surface without irregularities is required.

Also, there is a problem that technical difficulty is high, the apparatus becomes large, and the manufacturing cost increases in order to seal the element substrate and the lid substrate together in a vacuum atmosphere (reduced pressure atmosphere).

In the sealing structure in which the first through-hole and the second through-hole are covered with the second covering layer disposed above the first covering layer, as described in JP-A-2013-45893, since the second covering layer is disposed only on surfaces of openings of the first through-hole and the second through-hole, there is a concern that a desired sealing effect cannot be obtained unless the second covering layer disposed on opening portions of the first through-hole and the second through-hole is made sufficiently thick. Further, in the sealing structure in which the through-hole provided in the lid is filled with the sealing film, as described in JP-A-2007-210083, since the sealing film is disposed on the entire through-hole, there is a concern that stress relief due to a difference in the linear expansion coefficient between the lid and the sealing film cannot be sufficiently achieved and reliability of sealing may be impaired.

SUMMARY

An advantage of some aspects of the invention is to solve at least a part of the problems described above, and the invention can be implemented as the following aspects or application examples.

Application Example 1

A MEMS element according to this application example includes an element substrate on which an element is formed and an element electrode and an electrode pad connected to the element electrode are disposed, and in which, in plan view, a first wiring through-hole is disposed at a position overlapping with the electrode pad of the element substrate and a wiring electrode electrically connected to the electrode pad is disposed in the first wiring through-hole.

According to this application example, the first wiring through-hole is disposed at the position overlapping with the electrode pad, and the wiring electrode electrically connected to the electrode pad is disposed in the first wiring through-hole and thus, the electrode pad may easily be electrically connected to the element electrode on a surface of the element substrate opposite to a side on which the element is formed. For that reason, a MEMS element having excellent reliability may be obtained without requiring a high-level processing method.

Application Example 2

A MEMS element according to this application example includes an element substrate on which an element is formed, a support substrate supporting the element substrate, and a lid which is connected to the element substrate and constitutes internal space with the element substrate and the support substrate, and a first sealing hole for sealing the internal space is disposed in the element substrate.

According to this application example, since the first sealing hole for sealing the internal space constituted with the element substrate, the support substrate, and the lid is disposed, the internal space may be sealed by closing the first sealing hole after bonding the element substrate and the lid, the manufacturing cost may be suppressed without requiring an expensive apparatus and a MEMS element having excellent reliability may be obtained at low cost.

Application Example 3

It is preferable that the MEMS element according to the application example further includes a support substrate supporting the element substrate and a lid which is connected to the element substrate and constitutes internal space with the element substrate and the support substrate, and a first sealing hole for sealing the internal space is disposed in the element substrate in the MEMS element.

According to this application example, since the first sealing hole for sealing the internal space is disposed in the element substrate, the internal space may be sealed after bonding the element substrate and the lid and it becomes easy to manufacture the MEMS element without requiring an expensive apparatus.

Application Example 4

In the MEMS element according to the application example, it is preferable that a second wiring through-hole communicating with the first wiring through-hole is disposed in the support substrate.

According to this application example, since the second wiring through-hole communicating with the first wiring through-hole is disposed in the support substrate, the wiring electrically connected to the element electrode may be easily led out onto a surface of the support substrate opposite to aside on which the element substrate is supported. Since the element substrate is supported by the support substrate, mechanical strength of the element substrate is increased, and a MEMS element in which a mechanical strength of the element substrate is increased and which has excellent reliability may be obtained.

Application Example 5

In the MEMS element according to the application example, it is preferable that a second sealing hole communicating with the first sealing hole is provided in the support substrate.

According to this application example, since the second sealing hole communicating with the first sealing hole is provided in the support substrate, the internal space may be sealed in a state where the mechanical strength of the element substrate is increased.

Application Example 6

In the MEMS element according to the application example, it is preferable that the second wiring through-hole or the second sealing hole includes a tapered portion that expands toward a surface of the support substrate that faces a surface on which the element substrate is supported.

According to this application example, since the second wiring through-hole includes the tapered portion that expands toward the surface of the support substrate that faces the surface on which the element substrate is supported, the wiring electrode can be easily disposed on the wiring connected to the first wiring through-hole and the electrode pad. Since the second sealing hole includes a similar tapered portion, the sealing film is made to reach the first sealing hole and becomes easy to seal the first sealing hole.

Application Example 7

In the MEMS element according to the application example, it is preferable that an element adjustment layer is disposed between the element and the element electrode and the element adjustment layer is also disposed between the electrode pad and the element substrate.

According to this application example, since the element adjustment layer for adjusting temperature characteristics of the element is disposed between the electrode pad and the element substrate, when the electrode pad and the wiring connecting the element electrode and the electrode pad are formed, the surface of the element substrate becomes substantially flat and disconnection or the like due to step difference may be prevented.

Application Example 8

In the MEMS element according to the application example, it is preferable that the same metal layer as the wiring electrode seals the first sealing hole.

According to this application example, since the same metal layer as the wiring electrode seals the first sealing hole, when the wiring electrodes are disposed in the first wiring through-hole and the second wiring through-hole, the first sealing hole may be sealed and sealing becomes easier.

Application Example 9

In the MEMS element according to the application example, it is preferable that the wiring electrode is a sputtered layer, and has a plating layer stacked on the sputtered layer.

According to this application example, since the wiring electrode is the sputtered layer, it becomes easy to form a layer on the inner surfaces of the first wiring through-hole and the second wiring through-hole. Since the plating layer stacked on the sputtered layer is included, reliability of the electrical connection with the electrode pad may be improved.

Application Example 10

In the MEMS element according to the application example, an element includes a movable portion and a base portion, two through-electrodes connected to the element electrode for driving the element, a sealing hole penetrating the substrate, and a seal film for sealing the sealing hole are disposed on a substrate including the element substrate and the support substrate, and the sealing hole is disposed at a side facing the movable portion with respect to the base portion of the element substrate in plan view.

According to this application example, the internal space containing the element may be airtightly sealed easily by sealing the sealing hole communicating with the internal space constituted with the substrate and the lid by the sealing film. For that reason, a MEMS element having excellent reliability may be obtained without requiring a high-level processing method. Since the sealing hole for sealing is disposed on the side facing the movable portion with respect to the base portion of the element, it may be possible to reduce that the sealing film enters the internal space and adheres to the movable portion of the element when the sealing hole is sealed, and a MEMS element having stable characteristics may be obtained. Furthermore, since the sealing hole is disposed in the vicinity of the base portion, vibration of the movable portion may be alleviated by the sealing hole, leakage of vibration of the movable portion to the entire substrate may be reduced, and a MEMS element having a high Q value may be obtained.

Application Example 11

In the MEMS element according to the application example, it is preferable that a bonding surface between the lid and the substrate includes a plurality of corner portions, the two through-electrodes are disposed in a portion of a region which is in contact with two corner portions facing each other in plan view, and the sealing hole is disposed in a portion of a region which is in contact with the corner portions other than the two corner portions in which the two through-electrodes are disposed in plan view.

According to this application example, since the sealing hole is disposed in the portion of the region which is in contact with the corner portions other than the two corner portions in which the two through-electrodes are disposed, that is, since the sealing hole is disposed at a position away from the two through electrodes, fluctuations in an insulation resistance value generated caused by adhesion of the sealing film at the time of sealing the sealing hole to the wiring or the electrode pad connected to the through-electrode disposed in the internal space may be reduced. Accordingly, a MEMS element having stable characteristics may be obtained.

Application Example 12

In the MEMS element according to the application example, it is preferable that the sealing hole includes the first sealing hole and a second sealing hole communicating with the first sealing hole, an opening width of the first sealing hole is narrower than an opening width of the second sealing hole and a communication portion between the first sealing hole and the second sealing hole is sealed by the sealing film disposed on a side of the second sealing hole.

According to this application example, since the opening width of the first sealing hole is narrower than the opening width of the second sealing hole, the communication portion between the first sealing hole and the second sealing hole is closed by the sealing film disposed on the second sealing hole side so that the internal space containing the element may be airtightly sealed easily.

Application Example 13

A sealing structure according to this application example includes a substrate and a sealing hole penetrating the substrate, and in which the sealing hole includes a second sealing hole and a first sealing hole communicating with the second sealing hole and having a first opening width narrower than a second opening width of the second sealing hole and a communication portion between the first sealing hole and the second sealing hole is sealed by a sealing film disposed on a side of the second sealing hole.

According to this application example, the communication portion between the second sealing hole and the first sealing hole having the first opening width narrower than the second opening width of the second sealing hole is sealed by the sealing film disposed on the second sealing hole side. As such, since the first sealing hole having a narrow opening width is closed by the sealing film disposed on the second sealing hole side, the sealing film reaches the middle of the first sealing hole which is the narrow first opening width and the sealing film may be easily formed. In other words, since sealing is performed by allowing the sealing film to fill up to a portion of the first sealing hole, a desired sealing effect may be easily obtained. Since a portion which is not filled with the sealing film is present in the first sealing hole, stress caused by the difference in linear expansion coefficients between the substrate and the sealing film may be easily released and reduction in sealing reliability may be suppressed.

Application Example 14

In the sealing structure according to the application example, it is preferable that the sealing film includes a first layer and a second layer.

According to this application example, a film formation condition of the first layer and a film formation condition of the second layer may be changed. In other words, in a case where the first layer and the second layer are formed by, for example, a vacuum evaporation method, a sputtering method, or the like, growth of crystal grain boundaries of each film formation layer and the like are different depending temperature conditions and a deposition environment (degree of vacuum and the like). Accordingly, in a case where the first layer is disposed on the side of the first sealing hole, by providing a film formation layer including the first layer and the second layer, defects of the sealing film, which may be generated in the first layer by being influenced by the first sealing hole, are canceled and are not generated in the second layer due to a difference in growth of the crystal grain boundary of the film formation layer. As such, it becomes possible to easily suppress appearance of defects in the sealing film and sealing reliability may be further increased by forming the sealing film into at least two layers including the first layer and the second layer.

Application Example 15

In the sealing structure according to the application example, it is preferable that a first underlying layer is disposed between the inner surface of the first sealing hole and the first layer.

According to this application example, adhesion between the inner surface of the first sealing hole and the first layer may be enhanced and reliability of sealing may be improved by the first underlying layer disposed between the inner surface of the first sealing hole and the first layer.

Application Example 16

In the sealing structure according to the application example, it is preferable that a second underlying layer is disposed between the first layer and the second layer.

According to this application example, it may be possible to improve the adhesion between the first layer and the second layer and make it difficult for defects in the sealing film that may be generated in the first layer or the second layer due to the influence of the first sealing hole, by the second underlying layer disposed between the first layer and the second layer.

Application Example 17

In the sealing structure according to the application example, it is preferable that an aspect ratio between a depth and the first opening width of the first sealing hole is in a range of 1 or more to 100 or less.

According to this application example, a depth dimension of the first sealing hole is preferably 2 μm to 10 μm from a viewpoint of a desired thickness of the sealing structure and the like. In the dimension of the first opening width, the dimension for which the first sealing hole can be processed is 0.1 μm or more, and when the dimension of the first opening width exceeds 2 μm, there is a concern that sealing reliability of the sealing film may be deteriorated. From these, a sealing structure that does not impair sealing reliability may be obtained by setting the ratio between the depth and the first opening width of the first sealing hole to be 1 or more and 100 or less.

Application Example 18

In the sealing structure according to the application example, it is preferable that the aspect ratio between the depth and the first opening width of the first sealing hole is in the range of 2.5 or more to 100 or less.

According to this application example, rigidity of the substrate may be further enhanced by setting the depth of the first sealing hole to more preferably 5 μm to 10 μm and setting the aspect ratio to more preferably 2.5 to 100, and a sealing structure which may obtain rigidity of a structural body in addition to reliability of sealing may be formed.

Application Example 19

In the sealing structure according to the application example, it is preferable that the first sealing hole is, in plan view, positioned at the central portion of the second sealing hole and is disposed in a disposition region having a width of 1/10 of the second opening width.

According to this application example, in forming the sealing film inside the second sealing hole, the first sealing hole is positioned, in plan view, at the central portion of the second sealing hole, which is hardly influenced by a wall surface of the second sealing hole, and is disposed in the disposition region having the width of 1/10 of the second opening width. With this, it becomes hard to be influenced by the wall surface of the second sealing hole at the time of forming the sealing film for closing the first sealing hole and the sealing film in the central portion of the second sealing hole is thicker and more rigid than the peripheral portion thereof, so that the sealing film may be stably formed.

Application Example 20

In the sealing structure according to the application example, it is preferable that a hole width adjustment layer is disposed between the sealing film and the inner surface of the first sealing hole.

According to this application example, after the first sealing hole that needs to narrow the first opening width as the opening width of the sealing hole is formed to have a relatively wide opening width, a desired opening width (first opening width) may be obtained by providing the hole width adjustment layer. As such, the first sealing hole may easily be made to have a desired opening width of a narrow width.

Application Example 21

In the sealing structure according to the application example, it is preferable that the substrate includes a support substrate and an element substrate stacked on the support substrate through an oxide film, the second sealing hole penetrates the support substrate and the oxide film, the first sealing hole penetrates the element substrate, and the communication portion is configured to include a back surface portion which is a surface of the element substrate on a side of the support substrate.

According to this application example, the communication portion between the second sealing hole penetrating the support substrate and the oxide film and the first sealing hole penetrating the element substrate includes the back surface portion which is the surface of the element substrate at the support substrate side and thus, a surface area on which the sealing film for closing the first sealing hole is disposed may be increased, and bonding strength of the sealing film may be increased and thus, sealing reliability may be improved.

Application Example 22

In the sealing structure according to the application example, it is preferable that the element substrate includes an element adjustment layer on a surface facing the back surface portion and the first sealing hole penetrates the element substrate and the element adjustment layer.

According to this application example, it is possible to easily perform processing considering temperature characteristics of a resonance frequency relating to the element substrate by providing the element adjustment layer penetrating the first sealing hole on the surface of the element substrate.

Application Example 23

An electronic device according to this application example includes a substrate, a functional element which is mounted on the substrate and includes a sealing hole penetrating the substrate, a lid body which is connected to the substrate and constitutes internal space, in which the functional element may be subjected to internal sealing, between the lid body and the substrate and a sealing structure in which the sealing hole includes a second sealing hole and a first sealing hole communicating with the second sealing hole and having a first opening width narrower than a second opening width of the second sealing hole and a communication portion between the first sealing hole and the second sealing hole is sealed by a sealing film disposed on a side of the second sealing hole.

According to this application example described above, an electronic device having enhanced reliability may be obtained by applying the sealing structure in which the functional element is accommodated in the internal space constituted with the substrate and the lid body connected to the substrate, and accommodating space thereof may be easily and reliably sealed.

Application Example 24

An electronic apparatus according to this application example includes the MEMS element described in the application examples.

According to this application example described above, a high-performance electronic apparatus may be provided by utilizing the MEMS element having excellent reliability in an electronic apparatus.

Application Example 25

A vehicle according to this application example includes the MEMS element described in the application examples.

According to this application example, a high-performance vehicle may be provided by utilizing a MEMS element having excellent reliability in the vehicle.

BRIEF DESCRIPTION OF THE DRAWINGS

The invention will be described with reference to the accompanying drawings, wherein like numbers reference like elements.

DESCRIPTION OF EXEMPLARY EMBODIMENTS

In the following, embodiments embodying the invention will be described with reference to the drawings. The following is one embodiment of the invention and does not limit the invention. In the following respective drawings, in order to make the explanation easier to understand, scale of respective components and an actual scale thereof are made different.

First Embodiment

MEMS Element

First, a MEMS element 1 according to a first embodiment will be described with reference to FIG. 1, FIG. 2A, FIG. 2B, and FIG. 2C.

Figure 1:
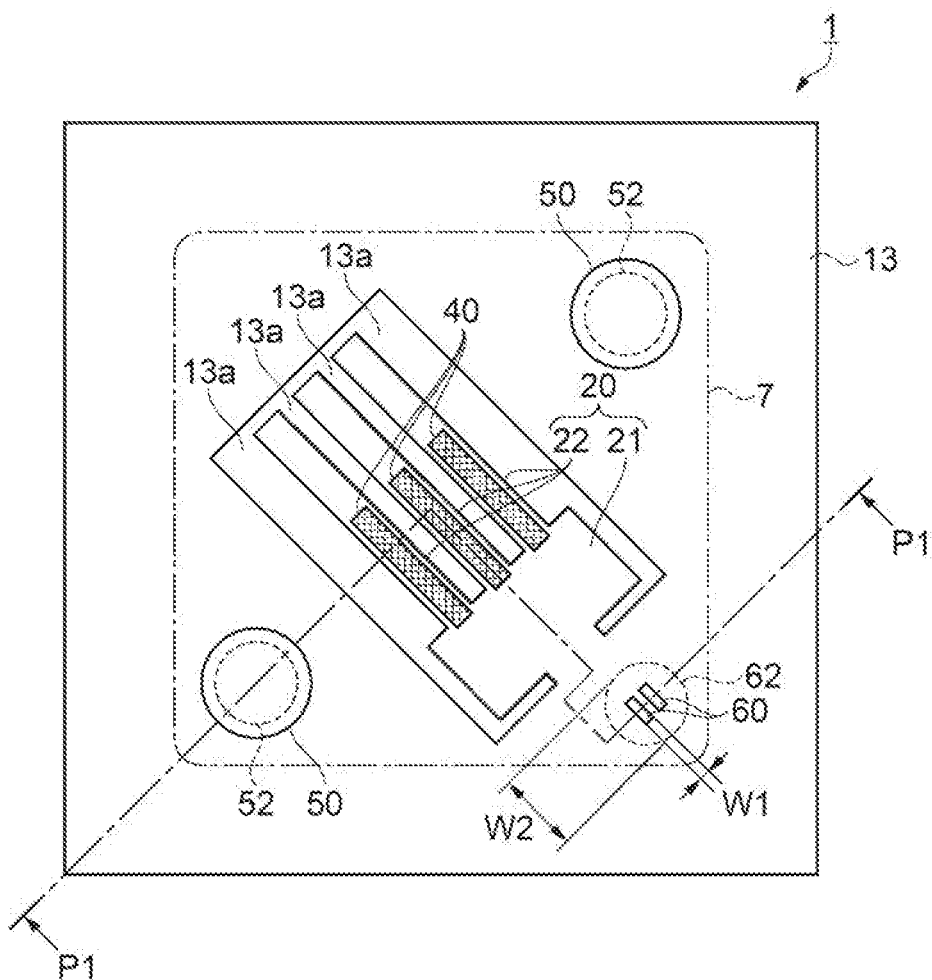
FIG. 1 is a schematic plan view illustrating a configuration of a MEMS element according to a first embodiment.
Figure 2A:
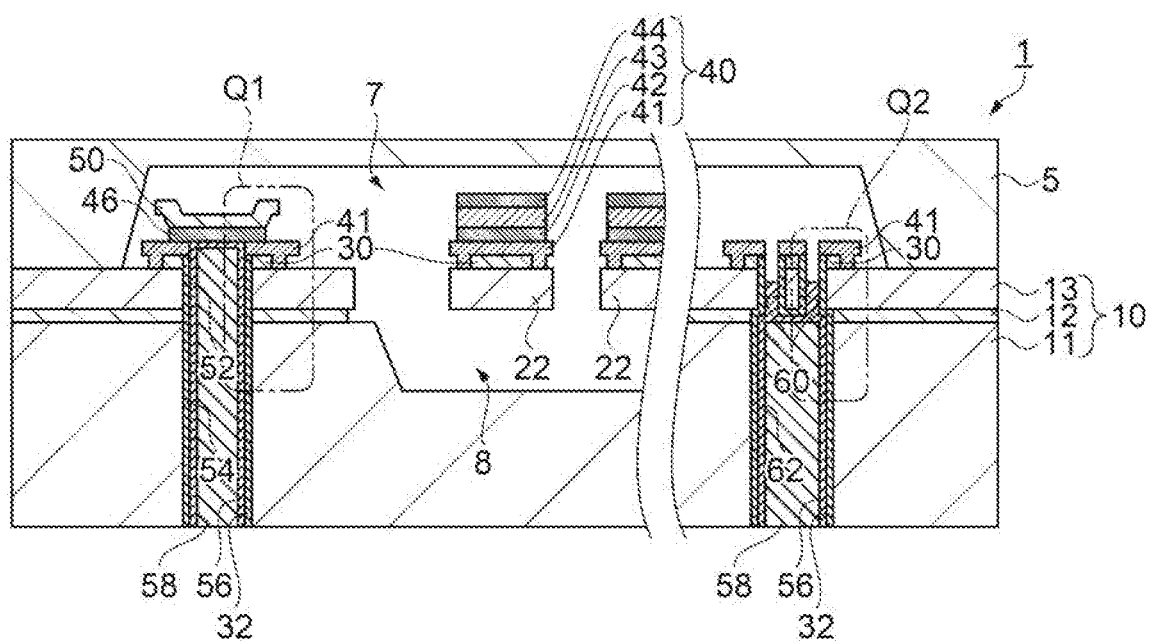
FIG. 2A is a schematic cross-sectional view taken along line P1-P1 in FIG. 1.
Figure 2B:
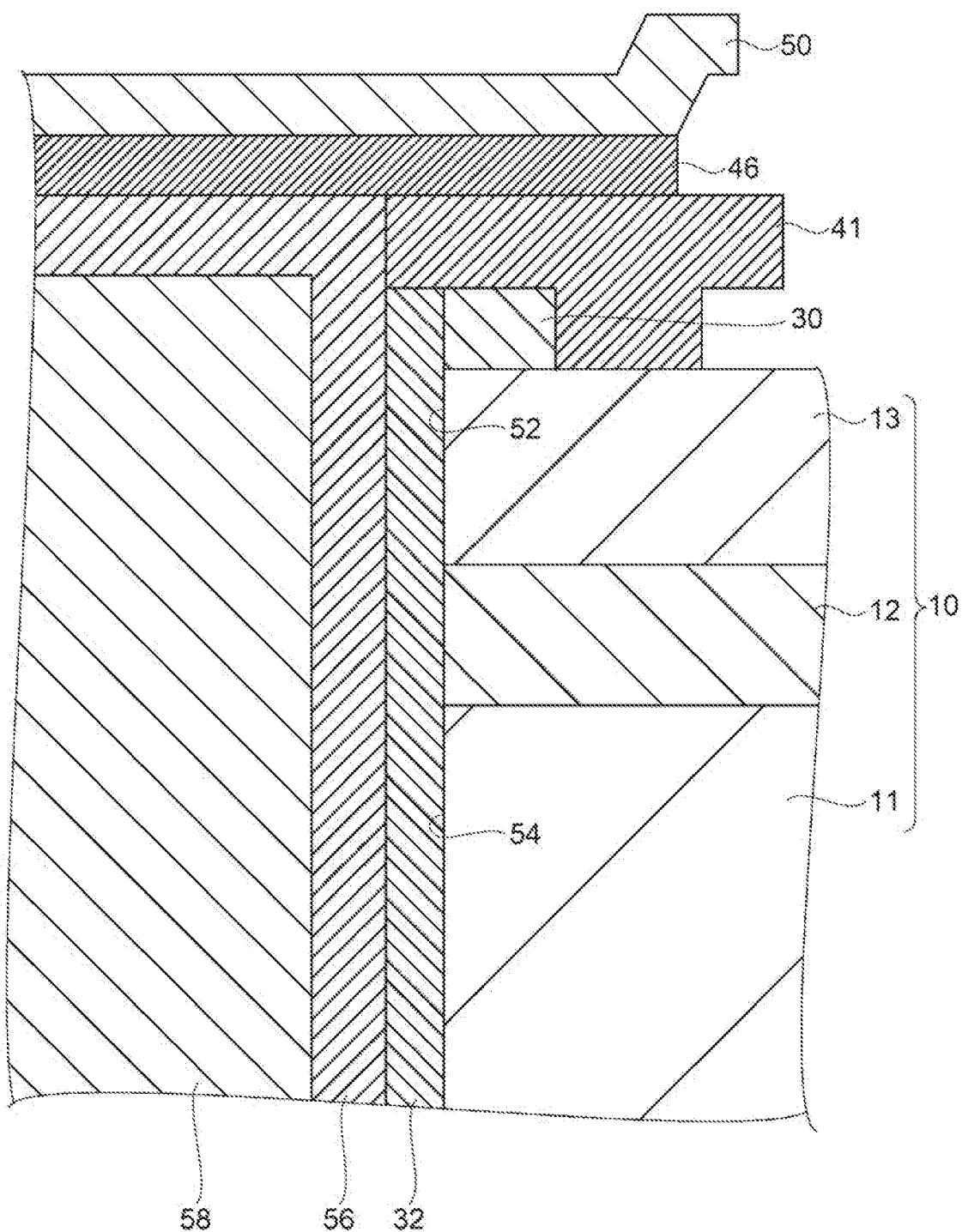
FIG. 2B is an enlarged view illustrating a Q1 portion in FIG. 2A.
Figure 2C:
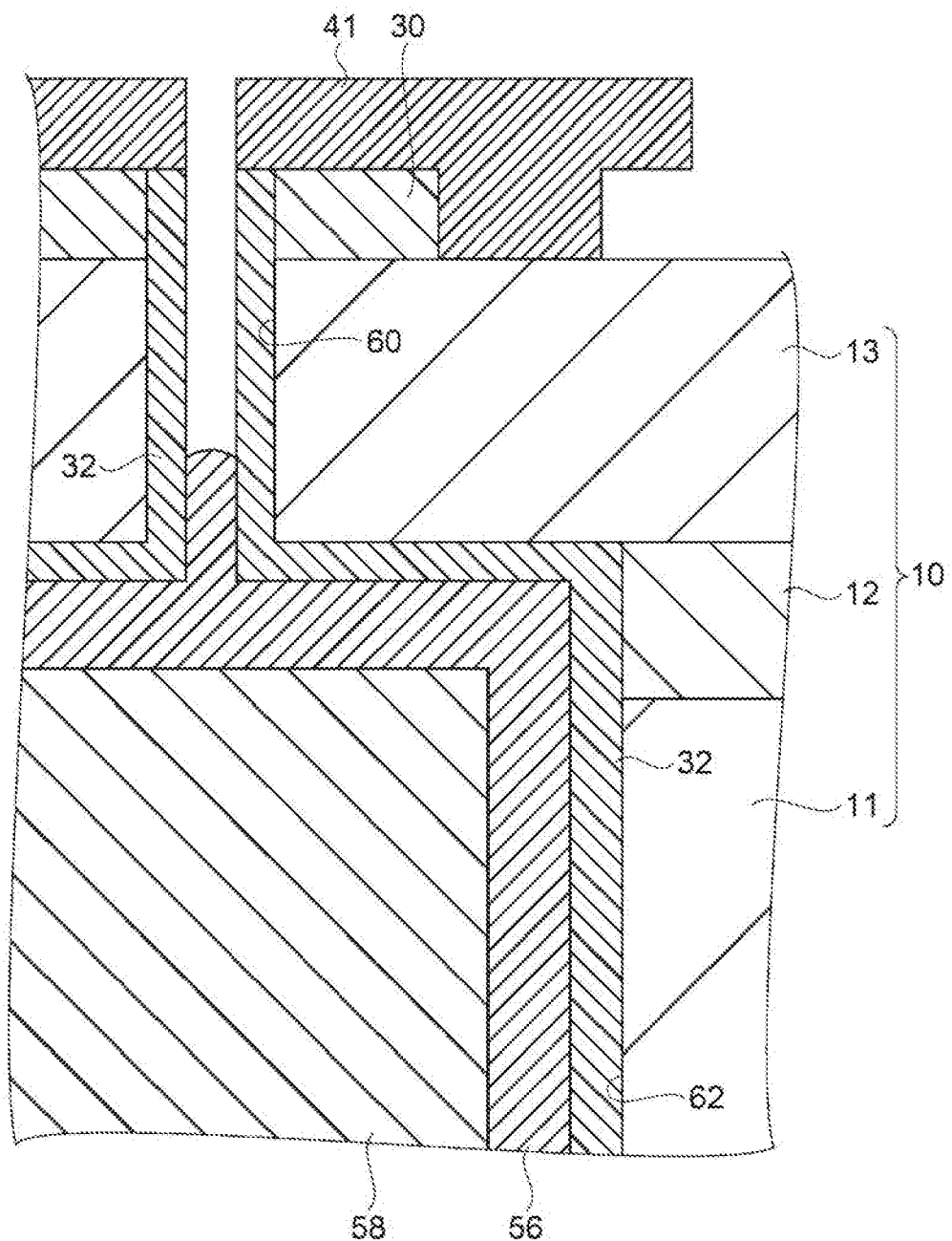
FIG. 2C is an enlarged view illustrating a Q2 portion in FIG. 2A.

FIG. 1 is a schematic plan view illustrating a configuration of the MEMS element 1 according to the first embodiment, FIG. 2A is a schematic sectional view taken along line P1-P1 illustrated in FIG. 1, FIG. 2B is an enlarged view illustrating a Q1 portion in FIG. 2A, and FIG. 2C is an enlarged view illustrating a Q2 portion in FIG. 2A. In FIG. 1, for convenience of explanation of an internal structure of the MEMS element 1, a state in which a lid 5 is removed is illustrated. In FIGS. 2A, 2B and 2C, a line illustrating a background of a cross-section is omitted.

As illustrated in FIGS. 1, 2A, 2B, and 2C, the MEMS element 1 according to the present embodiment is configured to include the lid 5 for airtightly sealing an element 20 and a silicon on insulator (SOI) substrate 10 on which the element 20 is formed. In the present embodiment, the SOI substrate 10 corresponds to a substrate.

The lid 5 is made of monocrystalline silicon or the like and has a cavity 7 opening toward the SOI substrate 10 side. A surface of the lid 5 on the side where the cavity 7 is provided is bonded to the surface of the SOI substrate 10 on the side where the element 20 is formed.

The SOI substrate 10 is a substrate in which a silicon layer 11, a buried oxide (BOX) layer 12, and a surface silicon layer 13 are stacked in this order. For example, the silicon layer 11 and the surface silicon layer 13 are made of monocrystalline silicon, and the BOX layer 12 is constituted with a silicon oxide layer ($SiO_2$ or the like). In the present embodiment, the silicon layer 11 and the BOX layer 12 correspond to a support substrate, and the surface silicon layer 13 corresponds to an element substrate.

On the SOI substrate 10, the element 20 made of silicon of the surface silicon layer 13, an electrode pad 50 formed on the surface silicon layer 13, a plurality of wirings (see FIG. 2A, not illustrated in FIG. 1) each of which connects an element electrode for driving the element 20 and the electrode pad 50, wiring electrodes 56 and 58 which are connected to the electrode pad 50 and lead out electrodes onto the surface of a side opposite to the side where the element 20 is formed, a first wiring through-hole 52 and a second wiring through-hole 54 for forming the wiring electrodes 56 and 58, and a first sealing hole 60 and a second sealing hole 62 for airtightly sealing internal space constituted with the cavity 7 of the lid 5 and a cavity 8 formed in the SOI substrate 10 are disposed.

The element 20 includes a base portion 21 supported by the BOX layer 12 and a vibration portion 22 separated from surrounding silicon other than the base portion 21 by a groove 13a on a region from which the BOX layer 12 is removed. The element 20 exemplified in the present embodiment has three vibration portions 22. The cavity 8 constituting the internal space is disposed in the silicon layer 11 and the BOX layer 12 at a position facing the vibration portion 22. Accordingly, the element 20 having the vibration portion 22 and the base portion 21 is provided in the cavities 7 and 8 constituted with the SOI substrate 10 and the lid 5.

On the surface of the element 20 at the lid 5 side, an element adjustment layer 30 which is a silicon oxide film disposed in a predetermined region of the element 20 and a piezoelectric driver 40 which covers at least a portion of the element adjustment layer 30 are provided.

The element adjustment layer 30 is provided to correct temperature characteristics of a resonance frequency of the vibration portion 22. Silicon has a resonance frequency that decreases as the temperature rises, while a silicon oxide film has a resonance frequency that increases as the temperature rises. Accordingly, the temperature characteristics of the resonance frequency of a composite body constituted with the vibration portion 22 of the element 20 and the element adjustment layer 30 can be brought close to flat by disposing the element adjustment layer 30 which is a silicon oxide film on the silicon element 20.

The piezoelectric driver 40 includes a polysilicon film 41, a first electrode 42, a piezoelectric layer 43, and a second electrode 44. In the present embodiment, the first electrode 42 and the second electrode 44 correspond to element electrodes.

Although the polysilicon film 41 is made of polysilicon not doped with impurities, it may be made of, for example, amorphous silicon. In the present embodiment, the polysilicon film 41 is provided so as to cover the element adjustment layer 30 disposed on the element 20. As such, since the element adjustment layer 30 is provided between the polysilicon film 41 and the element 20, the polysilicon film 41 is able to protect the element adjustment layer 30 from etching of the silicon oxide film around the piezoelectric driver 40.

The first electrode 42 and the second electrode 44 are disposed so as to sandwich a piezoelectric layer 43 therebetween. In the example illustrated in the present embodiment, three pairs of the first electrodes 42, the piezoelectric layers 43, and the second electrodes 44 are disposed corresponding to three vibration portions 22.

The plurality of wirings 46 are electrically connected to the first electrode 42 and the second electrode 44 so as to vibrate adjacent vibration portions 22 in opposite phases. The plurality of wirings 46 are electrically connected to the electrode pads 50, and a voltage is applied between two electrode pads 50 from the outside via the wiring electrodes 56 and 58 so as to make it possible to vibrate the adjacent vibration portions 22 in opposite phases.

When a voltage is applied between the first electrode 42 and the second electrode 44 via two electrode pads 50, the piezoelectric layer 43 expands and contracts and vibrates the vibration portion 22. The vibration direction of the vibration portion 22 is a direction intersecting that of the vibration portion 22 in plan view, and in the three vibration portions 22, when the central vibration portion 22 is displaced in the direction of the lid 5, the vibration portions 22 at both ends are displaced in the direction of the silicon layer 11, and conversely, when the central vibration portion 22 is displaced toward the silicon layer 11, the vibration portions 22 at both ends are displaced in the direction of the lid 5. Accordingly, the element 20 exemplified in the present embodiment is a vibrator in which adjacent vibration portions 22 vibrate in opposite phase. The vibration is largely excited at the natural resonance frequency, and impedance is minimized. As a result, the MEMS element 1 is connected to an oscillation circuit such that the MEMS element 1 oscillates mainly at an oscillation frequency determined by the resonance frequency of the vibration portion 22.

As a material constituting these components, for example, the piezoelectric layer 43 is made of aluminum nitride (AlN) or the like, and the first electrode 42 and the second electrode 44 are made of titanium nitride (TiN) or the like, and the wiring 46 and the electrode pad 50 are made of aluminum (Al) or copper (Cu) or the like.

As illustrated in FIG. 1, one first wiring through-holes 52 is disposed on each of both sides of the element 20 and is disposed at a position overlapping with the electrode pad 50 of the surface silicon layer 13 in the region of the cavity 7 of the lid 5 in plan view. The second wiring through-hole 54 communicates with the first wiring through-hole 52 and is disposed in the silicon layer 11 and the BOX layer 12.

In plan view, the electrode pad 50 is disposed so as to be electrically connected to the wiring electrodes 56 and 58 disposed in the first wiring through-hole 52 and the second wiring through-hole 54 via the wiring 46 at a position overlapping with the first wiring through-hole 52 and is disposed on the surface silicon layer 13 via the element adjustment layer 30, the polysilicon film 41, and the wiring at a position not overlapping with the first wiring through-hole 52. For that reason, the electrode pad 50 and the wiring electrodes 56 and 58 are electrically connected and the first electrode 42 and the second electrode 44 are can be led out onto the surface of the SOI substrate 10 at a side opposite to the side on which the element 20 is formed.

As the material of the components, the wiring electrodes 56 and 58 are made of titanium (Ti), tungsten (W), copper (Cu) or the like, and the wiring electrode 56 is a sputtered layer formed by a sputtering method, the wiring electrode 58 is a plating layer formed by plating, and the plating layer (wiring electrode 58) is stacked on the sputtered layer (wiring electrode 56).

The first sealing hole 60 and the second sealing hole 62 are disposed at a side facing the side where the vibration portion 22 is provided with respect to the base portion 21 in a region of the cavity 7 of the lid 5 in plan view. The first sealing hole 60 is disposed at a position overlapping with the second sealing hole 62 of the surface silicon layer 13 in plan view. The second sealing hole 62 communicates with the first sealing hole 60 and is disposed in the silicon layer 11 and the BOX layer 12.

An opening width W1 of the first sealing hole 60 is smaller than an opening width W2 of the second sealing hole 62 and the plurality of first sealing holes 60 are disposed at positions overlapping with the second sealing hole 62. The same metal layer as the wiring electrode 56 composed of a sputtered layer, that is, the wiring electrode 56 is disposed in the first sealing hole 60, and the internal space constituted by the cavity 7 of the lid 5 and the cavity 8 formed in the SOI substrate 10 is airtightly sealed. The wiring electrode 56 that closes the first sealing hole 60 is disposed at the same time when arranging the wiring electrode 56 disposed in the first wiring through-hole 52 and the second wiring through-hole 54 and thus, a new sealing step is not required and cost reduction can be achieved.

In the second sealing hole 62, the wiring electrode 56 composed of a sputtered layer is disposed and the wiring electrode 58 composed of a plating layer stacked on the wiring electrode 56 is disposed. In the present embodiment, the two first sealing holes 60 are provided, but is not limited thereto, and one or more first sealing holes 60 may be used.

As described above, according to the MEMS element of the present embodiment, since the first wiring through-hole 52 is disposed at the position overlapping with the electrode pad 50 and the wiring electrodes 56 and 58 electrically connected to the electrode pad 50 are disposed at the first wiring through-hole 52, it can easily be electrically connected to the first electrode 42 and the second electrode 44 as element electrodes on the surface of the surface silicon layer 13 as the element substrate at a side opposite to the side on which the element 20 is formed. For that reason, it is possible to obtain the MEMS element 1 having excellent reliability without requiring a high-level processing method.

The first sealing hole 60 for sealing the internal space constituted by the surface silicon layer 13 as the element substrate, the silicon layer 11 and the BOX layer 12 as the support substrate, and the lid 5 is disposed on the surface silicon layer 13 and thus, it is possible to seal the internal space by closing the first sealing hole 60 after the surface silicon layer 13 and the lid 5 are bonded. For that reason, it becomes easy to manufacture without requiring an expensive apparatus and thus, it is possible to suppress the manufacturing cost and it is possible to obtain the MEMS element 1 having excellent reliability at low cost.

Since the second wiring through-hole 54 communicating with the first wiring through-hole 52 is disposed in the silicon layer 11 and the BOX layer 12 as the support substrate, the wiring electrodes 56 and 58 which are electrically connected to the first electrode 42 and the second electrode 44 can be easily disposed on the surface of the surface silicon layer 13 at a side opposite to the side on which the element 20 is formed. Since the surface silicon layer 13 is supported by the silicon layer 11 and the BOX layer 12, mechanical strength of the surface silicon layer 13 is increased and the MEMS element 1 having excellent reliability can be obtained.

Since the second sealing hole 62 communicating with the first sealing hole 60 is disposed in the silicon layer 11 and the BOX layer 12, the surface silicon layer 13 is bonded to the silicon layer 11 and the BOX layer 12 so as to make it possible to close the first sealing hole 60 and seal the internal space in a state where the mechanical strength of the surface silicon layer 13 having the element 20 formed thereon is increased.

Since the wiring electrode 56 is a sputtered layer, it becomes easy to form a film on the inner surfaces of the first wiring through-hole 52 and the second wiring through-hole 54. Since the plating layer (wiring electrode 58) stacked on the sputtered layer is provided, reliability of electrical connection with the electrode pad 50 can be improved.

The element adjustment layer 30 for adjusting temperature characteristics of the element 20 disposed between the element 20 and the first electrode 42 and the second electrode 44 is disposed between the electrode pad 50 and the surface silicon layer 13 and thus, when the electrode pad 50 and the wiring 46 connecting the first electrode 42 and the second electrode 44 to the electrode pad 50 are formed, the surface of the surface silicon layer 13 becomes substantially flat and disconnection and the like due to step difference can be prevented.

The wiring electrode 56 is constituted with one layer, and is made of titanium (Ti), tungsten (W), copper (Cu) or the like as a material. For that reason, the first sealing hole 60 can be easily closed and the internal space where the element 20 is disposed can be set in a vacuum atmosphere (reduced pressure atmosphere).

The same metal layer as the wiring electrode 56 seals the first sealing hole 60 and thus, when the wiring electrode 56 is disposed in the first wiring through-hole 52 and the second wiring through-hole 54, at the same time, the first sealing hole 60 can be closed by the wiring electrode 56 and the internal space can be sealed in a vacuum atmosphere (reduced pressure atmosphere). Accordingly, a new sealing step is not required, and cost reduction of the MEMS element 1 can be achieved.

Since the opening width W2 of the second sealing hole 62 is larger than the opening width W1 of the first sealing hole 60, the wiring electrode 56 serving as a sealing film for closing the first sealing hole 60 from the second sealing hole 62 side easily reaches the first sealing hole 60 and sealing becomes easier.

Manufacturing Method

Next, manufacturing steps of the MEMS element 1 according to the present embodiment will be described with reference to FIGS. 3A to 3Q.

Figure 3A:
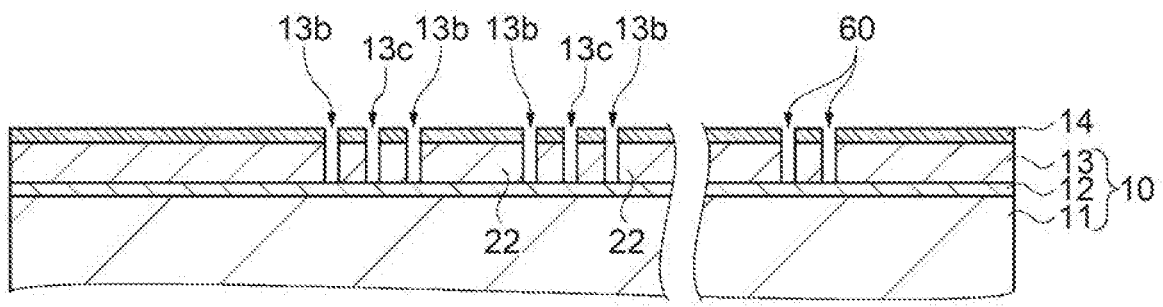
FIG. 3A is a schematic cross-sectional view corresponding to the position of the line P1-P1 of FIG. 1, which illustrates a manufacturing step of the MEMS element according to the first embodiment.
Figure 3B:
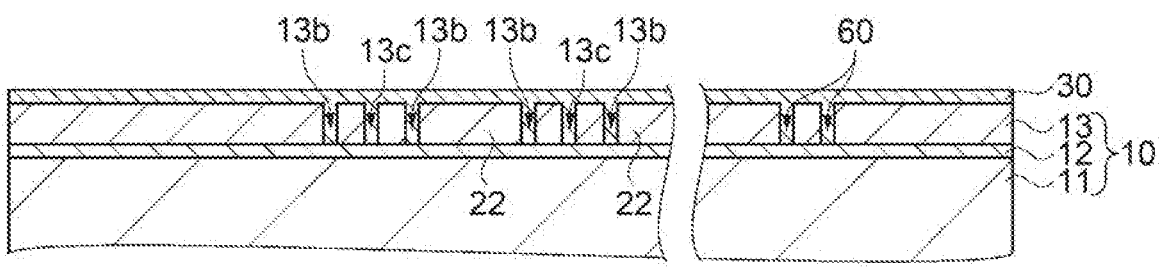
FIG. 3B is a schematic cross-sectional view corresponding to the position of the line P1-P1 of FIG. 1, which illustrates the manufacturing process of the MEMS element according to the first embodiment.
Figure 3C:
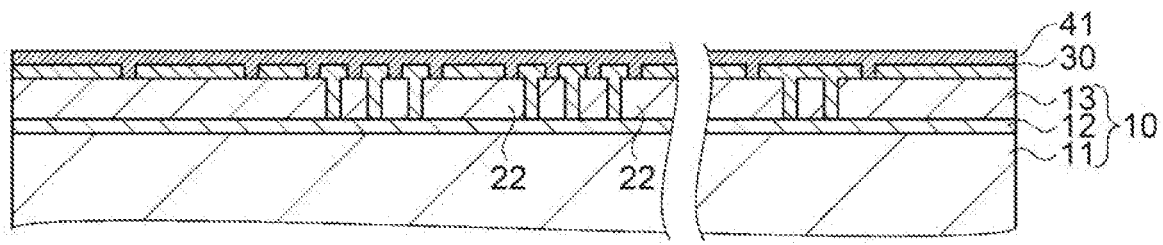
FIG. 3C is a schematic cross-sectional view corresponding to the position of the line P1-P1 of FIG. 1, which illustrates the manufacturing step of the MEMS element according to the first embodiment.
Figure 3D:
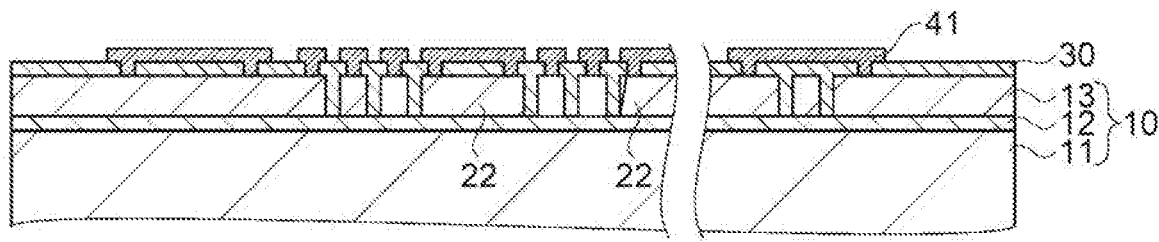
FIG. 3D is a schematic cross-sectional view corresponding to the position of the line P1-P1 of FIG. 1, which illustrates the manufacturing step of the MEMS element according to the first embodiment.
Figure 3E:
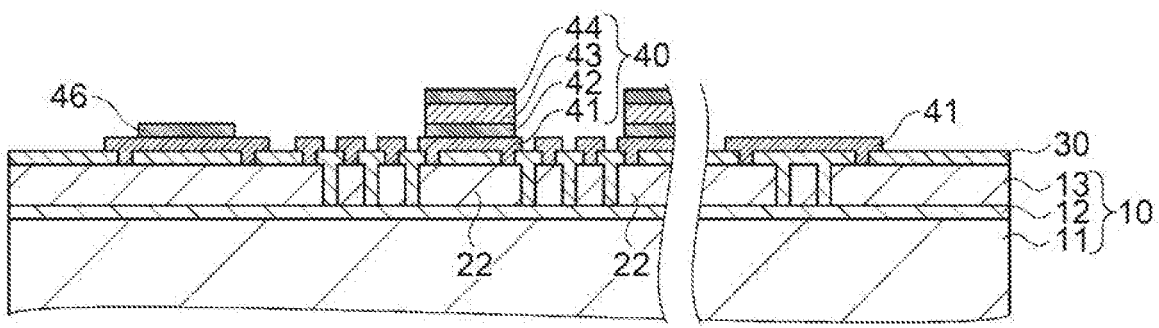
FIG. 3E is a schematic cross-sectional view corresponding to the position of the line P1-P1 of FIG. 1, which illustrates the manufacturing step of the MEMS element according to the first embodiment.
Figure 3F:
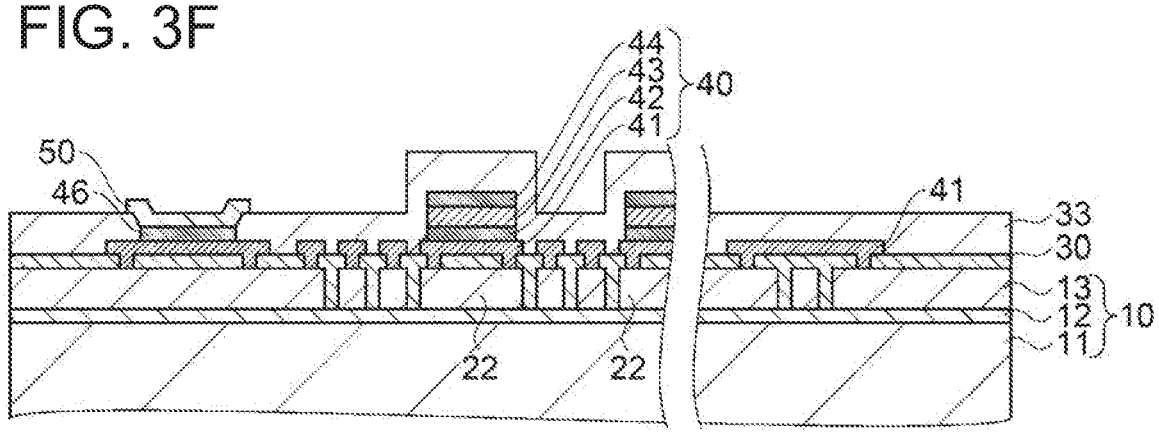
FIG. 3F is a schematic cross-sectional view corresponding to the position of the line P1-P1 of FIG. 1, which illustrates the manufacturing step of the MEMS element according to the first embodiment.
Figure 3G:
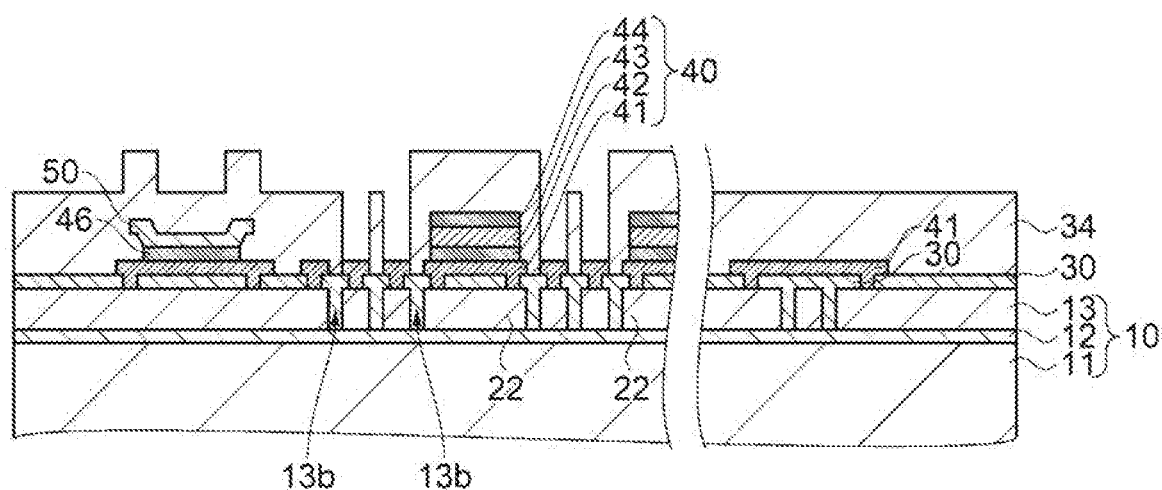
FIG. 3G is a schematic cross-sectional view corresponding to the position of the line P1-P1 of FIG. 1, which illustrates the manufacturing step of the MEMS element according to the first embodiment.
Figure 3H:
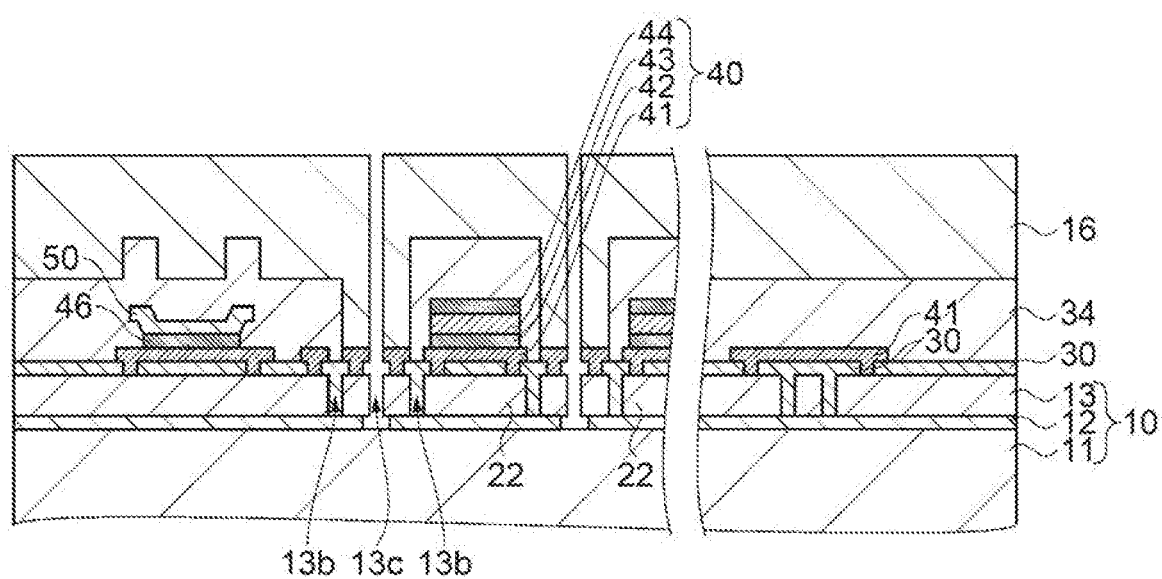
FIG. 3H is a schematic cross-sectional view corresponding to the position of the line P1-P1 of FIG. 1, which illustrates the manufacturing step of the MEMS element according to the first embodiment.
Figure 3I:
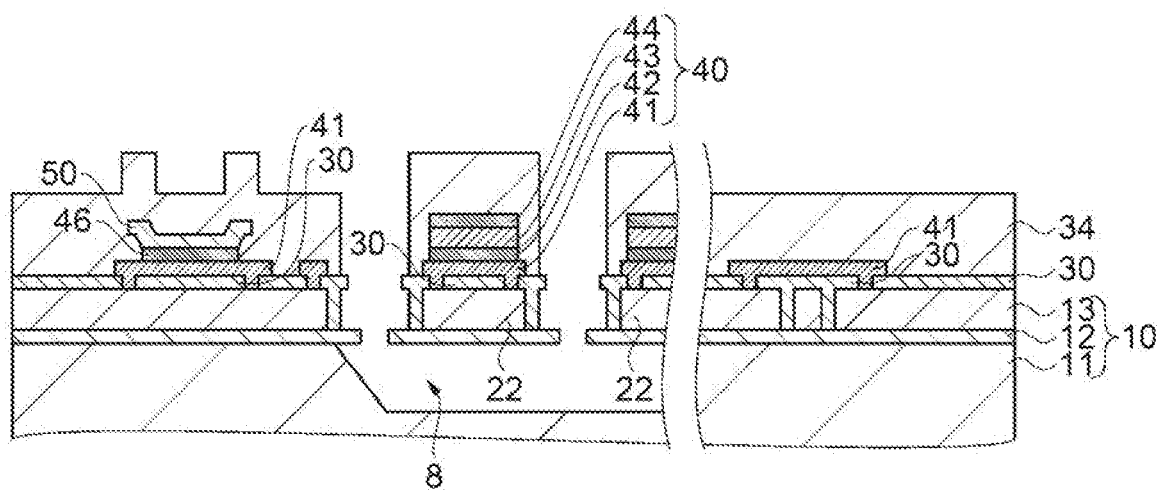
FIG. 3I is a schematic cross-sectional view corresponding to the position of the line P1-P1 of FIG. 1, which illustrates the manufacturing step of the MEMS element according to the first embodiment.
Figure 3J:
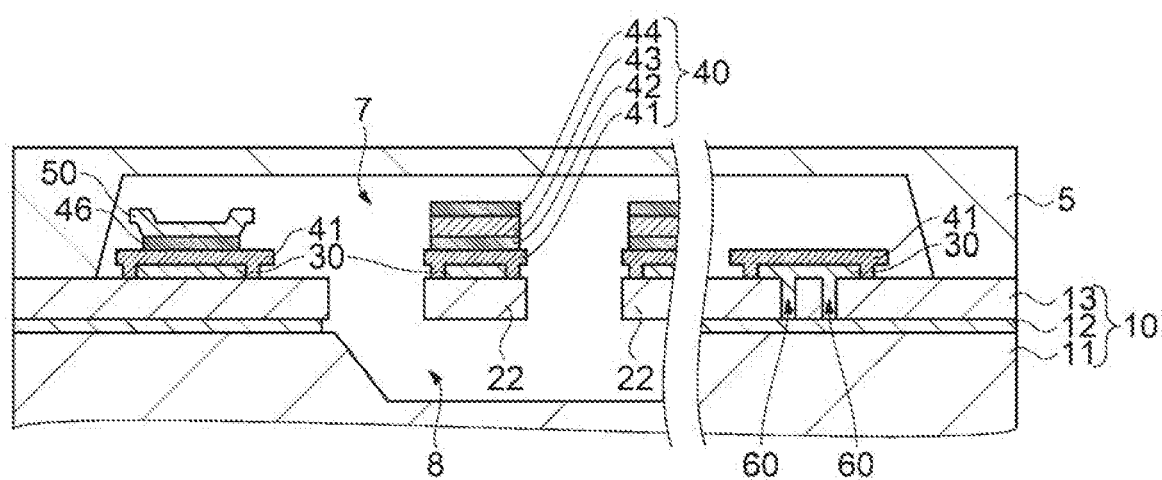
FIG. 3J is a schematic cross-sectional view corresponding to the position of the line P1-P1 of FIG. 1, which illustrates the manufacturing step of the MEMS element according to the first embodiment.
Figure 3K:
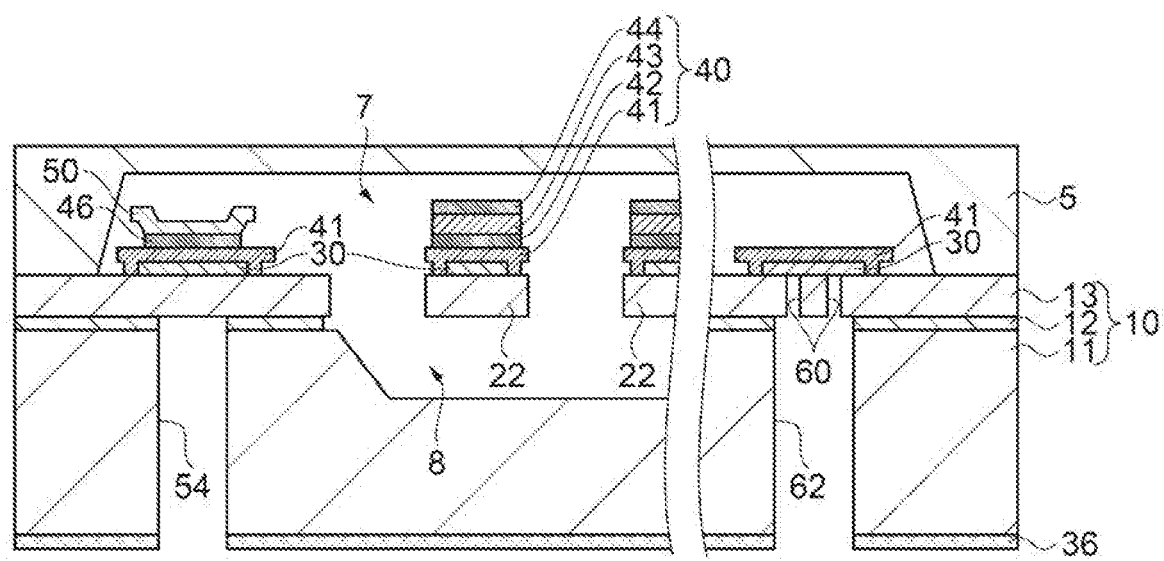
FIG. 3K is a schematic cross-sectional view corresponding to the position of the line P1-P1 of FIG. 1, which illustrates the manufacturing step of the MEMS element according to the first embodiment.
Figure 3L:
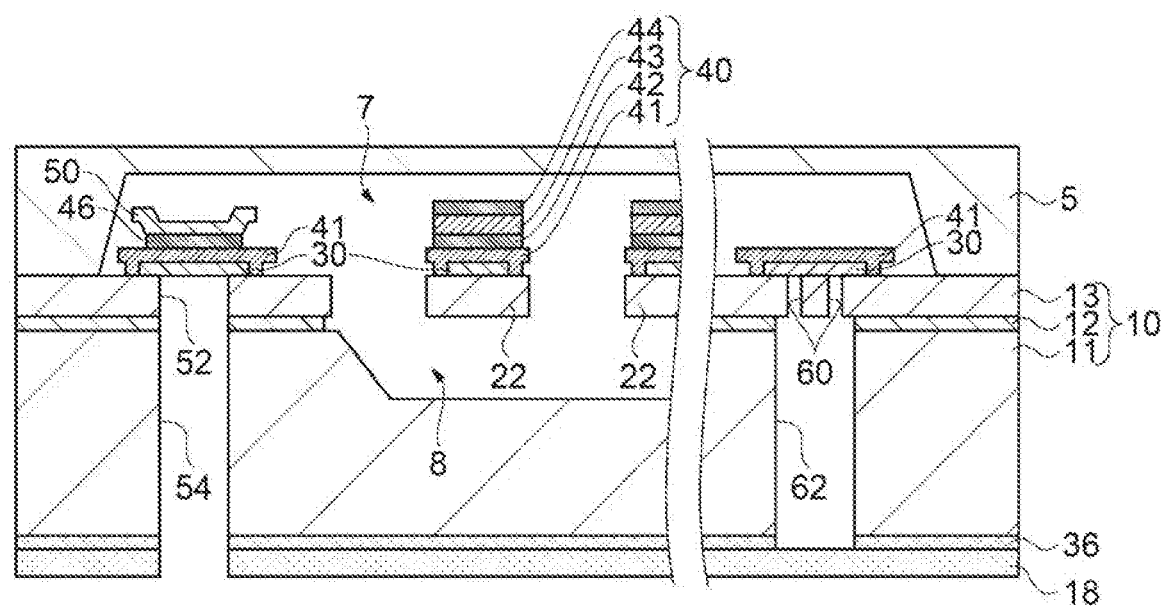
FIG. 3L is a schematic cross-sectional view corresponding to the position of the line P1-P1 of FIG. 1, which illustrates the manufacturing step of the MEMS element according to the first embodiment.
Figure 3M:
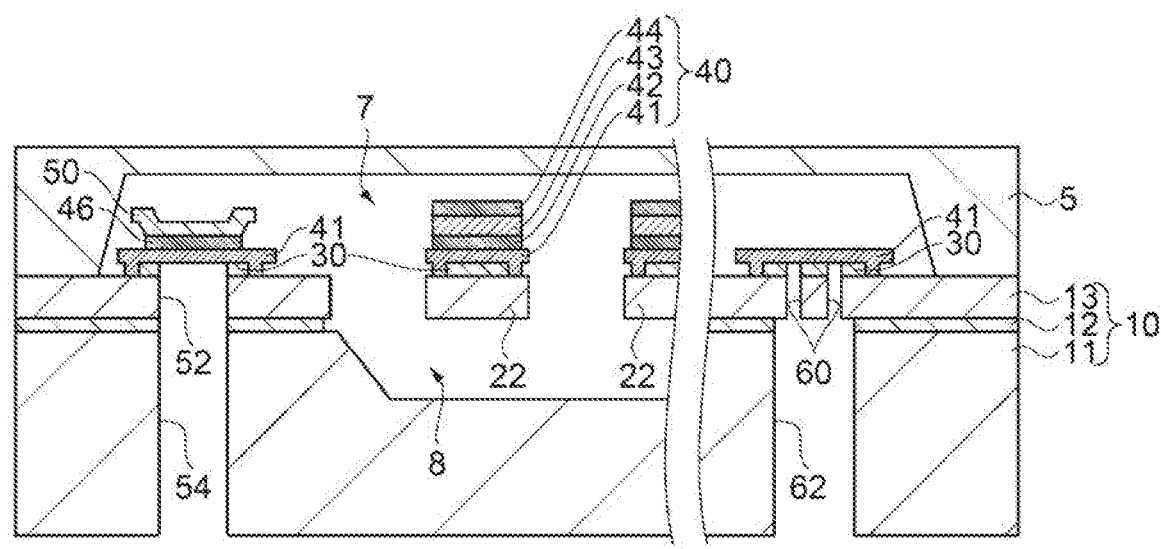
FIG. 3M is a schematic cross-sectional view corresponding to the position of the line P1-P1 of FIG. 1, which illustrates the manufacturing step of the MEMS element according to the first embodiment.
Figure 3N:
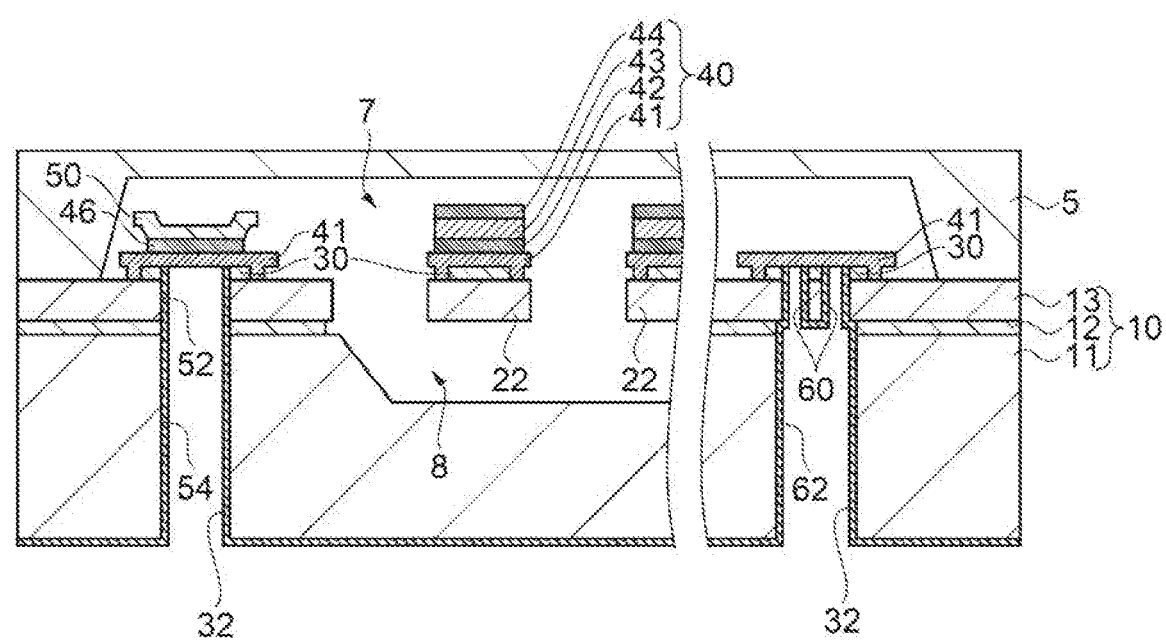
FIG. 3N is a schematic cross-sectional view corresponding to the position of the line P1-P1 of FIG. 1, which illustrates the manufacturing step of the MEMS element according to the first embodiment.
Figure 3O:
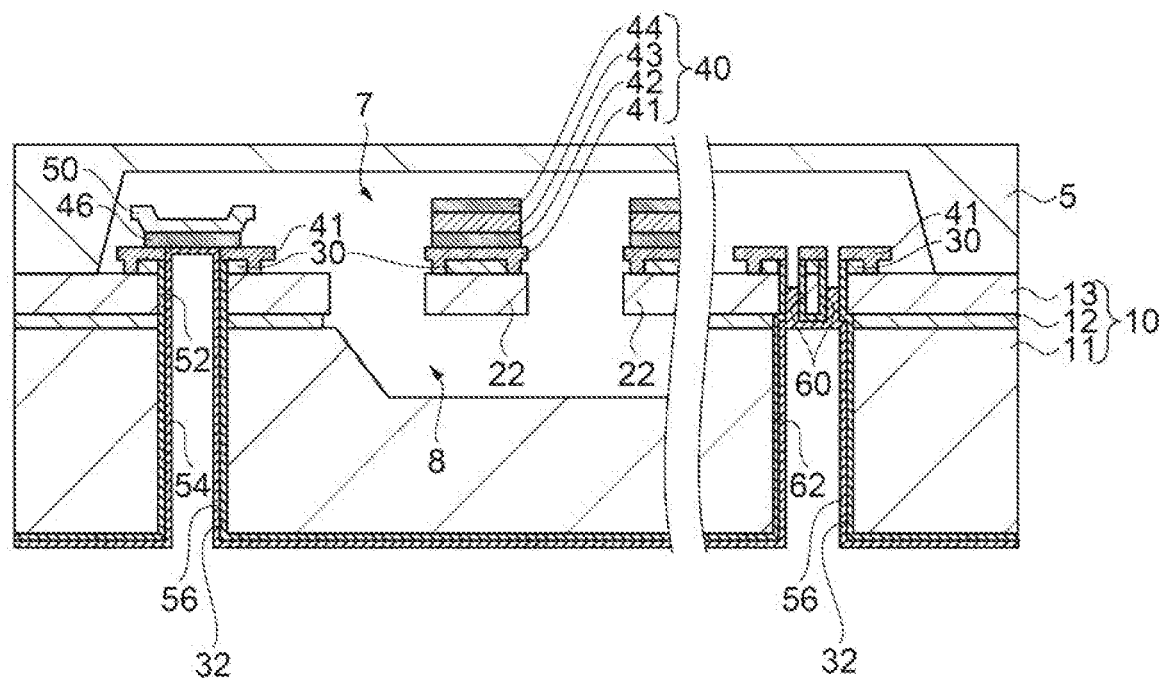
FIG. 3O is a schematic cross-sectional view corresponding to the position of the line P1-P1 of FIG. 1, which illustrates the manufacturing step of the MEMS element according to the first embodiment.
Figure 3P:
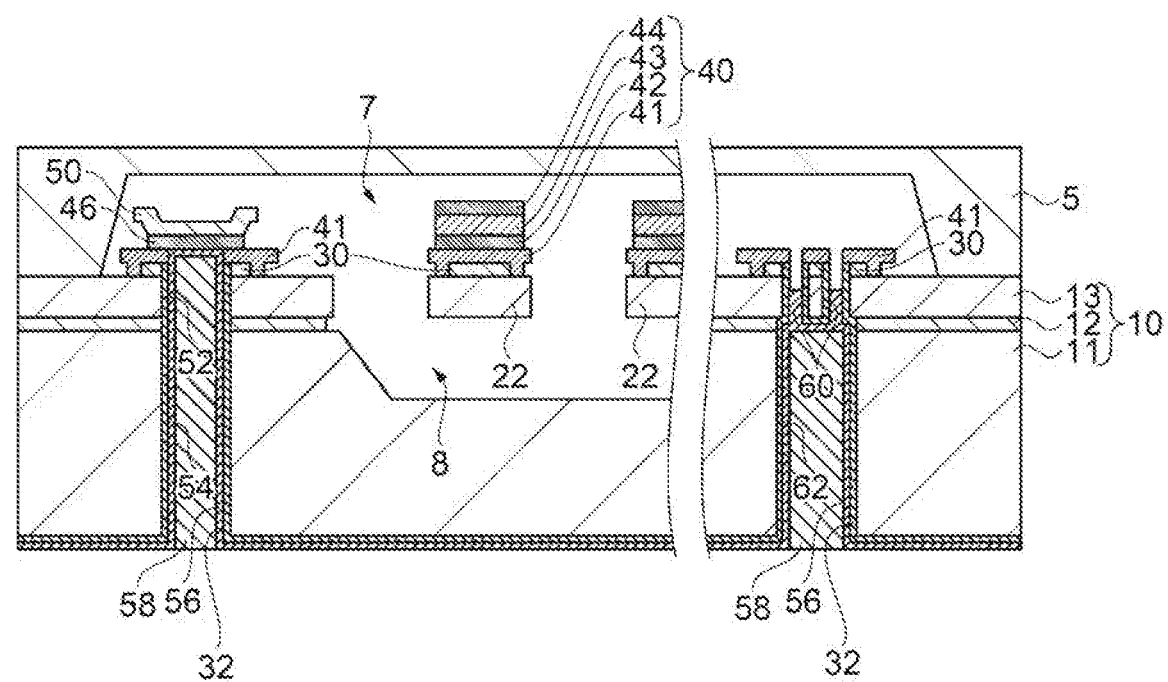
FIG. 3P is a schematic cross-sectional view corresponding to the position of the line P1-P1 of FIG. 1, which illustrates the manufacturing step of the MEMS element according to the first embodiment.
Figure 3Q:
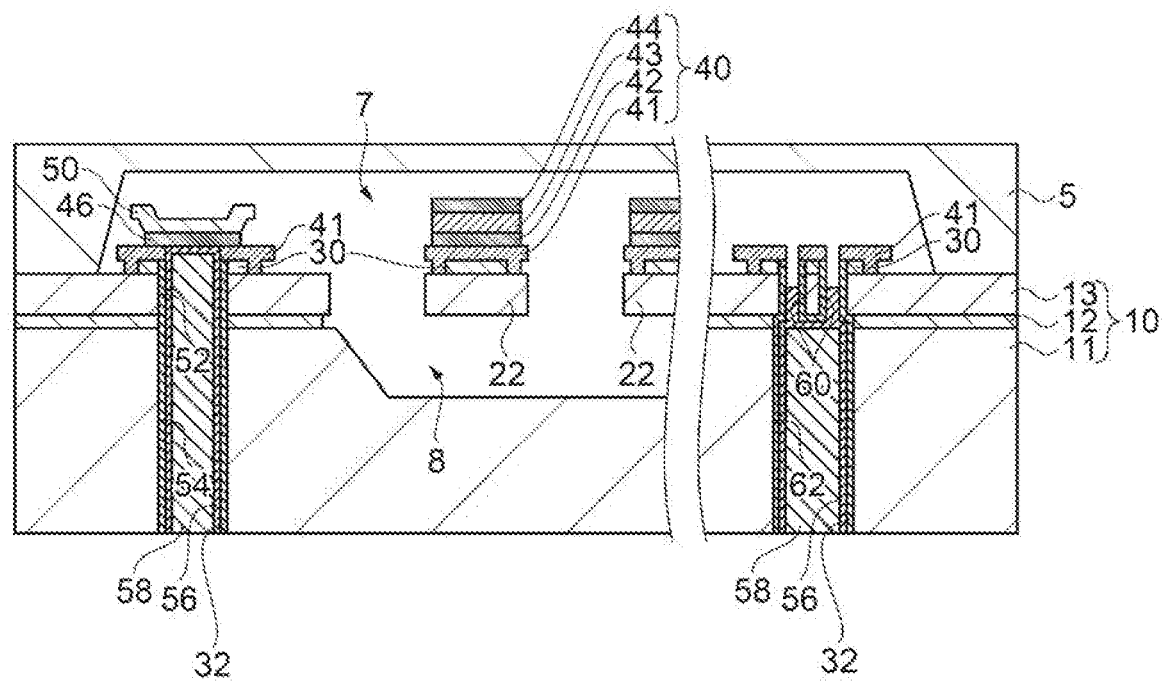
FIG. 3Q is a schematic cross-sectional view corresponding to the position of the line P1-P1 of FIG. 1, which illustrates the manufacturing step of the MEMS element according to the first embodiment.

FIGS. 3A to 3Q are schematic cross-sectional views corresponding to the position of the line P1-P1 of FIG. 1 illustrating a manufacturing steps of the MEMS element according to the first embodiment. The line illustrating the background of the cross-section is omitted.

First, as a preparation step, a SOI substrate 10 on which the silicon layer 11, the BOX layer 12, and the surface silicon layer 13 are stacked in this order and a lid 5 which includes a cavity 7 are prepared (see FIG. 2A). The SOI substrate 10 may be fabricated by forming the BOX layer 12 on the silicon layer 11 and forming the surface silicon layer 13 on the BOX layer 12.

In a first step, as illustrated in FIG. 3A, in the surface silicon layer 13 of the SOI substrate 10, the trench 13b separating a region which becomes the vibration portion 22 of the element 20 from surrounding silicon other than a region which becomes the base portion 21 of the element 20 and the first sealing hole 60 are formed. In this case, a slit 13c may be formed in the region separated from the vibration portion 22 of the element 20 by the trench 13b of the surface silicon layer 13 of the SOI substrate 10. With this, in the region where a width of a groove 13a (see FIG. 1) is wide, it is possible to facilitate release etching to be performed later of silicon around the vibration portion 22.

Forming of the trench 13b, the slit 13c, and the first sealing hole 60 is carried out on the surface silicon layer 1, as illustrated in FIG. 3A, in such a way that a resist 14 is applied to the surface silicon layer 13, a mask pattern is formed by a photolithography method, and the surface silicon layer 13 is etched by using the resist 14 as a mask to form the trench 13b separating the region which becomes the vibration portion 22 of the element 20 from surrounding silicon except for the region which becomes the base portion 21 of the element 20, the slit 13c, and the first sealing hole 60. The surface of the surface silicon layer 13 of the SOI substrate 10 may be thermally oxidized to form a silicon oxide film, a mask of a silicon oxide film may be formed by a photolithography method, and the surface silicon layer 13 may be etched to form the trench 13b, the slit 13c, and the first sealing hole 60.

In a second step, as illustrated in FIG. 3B, on the upper surface of the surface silicon layer 13, the side wall in the trench 13b, the side wall in the slit 13c, and the side wall in the first sealing hole 60, the element adjustment layer 30 which is a silicon oxide film is formed. For example, an oxide film (silicon oxide film) is formed on the upper surface of the surface silicon layer 13, the side wall in the trench 13b, the side wall in the slit 13c, and the side wall in the first sealing hole 60 by thermally oxidizing the surface silicon layer 13 of the SOI substrate 10. The thickness of thermal oxide film is, for example, approximately 0.3 μm to 1.2 μm, and the thickness may be adjusted according to desired temperature characteristics. This thermal oxide film serves as a protective wall for protecting the vibration portion 22 and the piezoelectric driver 40 from release etching of silicon around the vibration portion 22 to be performed later.

Next, a silicon oxide film filling the trenches 13b, the slits 13c, and the first sealing holes 60 of the surface silicon layer 13 is formed by a Chemical vapor deposition (CVD) method. In this case, even if "corrosion" occurs in the silicon oxide film within the trench 13b, the slit 13c, and the first sealing hole 60, there is no problem because thermal oxide film is strong. Since the trenches 13b, the slits 13c, and the first sealing holes 60 of the surface silicon layer 13 formed by processing are filled with the silicon oxide film and the surface becomes almost flat, it is possible to eliminate adverse influence due to step difference to the subsequent photolithography step.

Accordingly, a thermal oxide film formed by thermally oxidizing the surface silicon layer 13 and a silicon oxide film formed by the CVD method become the element adjustment layer 30 illustrated in FIG. 2A. In the second step, the element adjustment layer 30 may be formed only of a thermal oxide film depending on the degree of flatness. Alternately, a silicon oxide film may be formed by a thermal CVD method without forming a thermal oxide film and otherwise, a silicon oxide film may be formed by a two-step CVD method such as a thermal CVD method and a plasma CVD method.

In a third step, a resist is applied on the element adjustment layer 30, a mask pattern for protecting a predetermined region such as the element 20 including the first sealing hole 60 and the vibration portion 22 is formed by a photolithography method, and the element adjustment layer 30 is etched using the resist as a mask to form a trench reaching the surface silicon layer 13. Thereafter, as illustrated in FIG. 3C, a polysilicon film 41 covering the upper surface of the element adjustment layer 30 and sidewalls of the trench is formed by the CVD method.

In a fourth step, a resist is applied on the polysilicon film 41, a mask pattern is formed by a photolithography method, and the polysilicon film 41 is etched using the resist as a mask. With this, as illustrated in FIG. 3D, the polysilicon film 41 is formed in a region including side surfaces of the element adjustment layer 30 formed in a predetermined region of the element 20 including the vibration portion 22.

The polysilicon film 41 covers the element adjustment layer 30 with the element 20, and the thickness of the polysilicon film 41 is, for example, approximately 0.2 Since an embedding property of the polysilicon film 41 by the CVD method is good, the wall of the strong polysilicon film 41 which protects the element adjustment layer 30 from release etching, which is to be performed later, of the silicon oxide film around the vibration portion 22 and the piezoelectric driver 40 can be formed with a small thickness.

In a fifth step, as illustrated in FIG. 3E, the first electrode 42, the piezoelectric layer 43, and the second electrode 44 are formed in this order on the polysilicon film 41, which is formed in a predetermined region of the element 20, by a photolithography method. The polysilicon film 41 to the second electrode 44 constitute the piezoelectric driver 40.

When the first electrode 42 and the second electrode 44 are formed, the wiring 46 for connecting the first electrode 42 and the electrode pad 50 and the wiring 46 for connecting the second electrode 44 and the electrode pad 50 are formed at the same time.

In a sixth step, a silicon oxide film 33 is formed on the SOI substrate 10, on which the piezoelectric driver 40 is formed, by the CVD method. Thereafter, as illustrated in FIG. 3F, a mask pattern in which a position where the electrode pad 50 is to be formed is open is formed by a photolithography method and aluminum (Al), copper (Cu) or the like is deposited to form a film on a position where the electrode pad 50 is formed by a sputtering method by using the silicon oxide film 33 as a mask to form the electrode pad 50.

In a seventh step, as illustrated in FIG. 3G, a silicon oxide film is formed on the SOI substrate 10 on which the electrode pad 50 and the silicon oxide film 33 are formed by the CVD method so as to form a silicon oxide film 34 including the silicon oxide film 33. Thereafter, a resist is applied to the silicon oxide film 34, a mask pattern is formed by a photolithography method, and the silicon oxide film 34 is etched by using the resist as a mask. With this, as illustrated in FIG. 3G, the silicon oxide film 34 having an opening reaching the surface silicon layer 13 is formed in a predetermined region corresponding to the trench 13b.

In an eighth step, as illustrated in FIG. 3H, a resist 16 is applied to the silicon oxide film 34, a mask pattern is formed by a photolithography method, and the silicon oxide film 34, the element adjustment layer 30, and the BOX layer 12 corresponding to the slit 13c are etched in this order by using the resist 16 as a mask. With this, an opening having a depth that reaches the silicon layer 11 in a shape surrounding the periphery of the vibration portion 22 is formed while leaving the silicon oxide film 34 for protecting the vibration portion 22, the piezoelectric driver 40 and the electrode pad 50, and the element adjustment layer 30.

In a ninth step, as illustrated in FIG. 3I, after the resist 16 is peeled off, silicon around the vibration portion 22 is etched (release etching) through the opening of the silicon oxide film 34, the element adjustment layer 30, the surface silicon layer 13, and the BOX layer 12. In this case, a portion of silicon in the silicon layer 11 is etched to form a cavity 8 in the silicon layer 11 below the vibration portion 22. In the ninth step, wet etching is performed and tetramethylammonium hydroxide (TMAH), for example, is used as etching solution.

In a tenth step, as illustrated in FIG. 3J, the silicon oxide film 34 formed around each of the vibration portion 22, the piezoelectric driver 40, the electrode pad 50, and the first sealing hole 60, the element adjustment layer 30 and the BOX layer 12 are etched (release etching). With this, the element adjustment layer 30 is left on the vibration portion 22. In the tenth step, wet etching is performed and buffered hydrofluoric acid (BHF), for example, is used as the etching solution. Thereafter, the surface having the cavity 7 of the lid 5 is disposed on the surface (upper surface of the surface silicon layer 13), on which the element 20 of the SOI substrate 10 is formed, and bonded. As a bonding method, direct bonding performed by activating a bonding surface, a method using a bonding member such as low-melting point glass, anodic bonding, or the like may be used.

In an eleventh step, as illustrated in FIG. 3K, the second wiring through-hole 54 and the second sealing hole 62 are formed in the silicon layer 11 and the BOX layer 12 of the SOI substrate 10. In forming the second wiring through-hole 54 and the second sealing hole 62, a silicon oxide film 36 is formed by thermally oxidizing the surface of the silicon layer 11 of the SOI substrate 10 and a mask of the silicon oxide film 36 by a photolithography method. Thereafter, the silicon layer 11 and the BOX layer 12 of the SOI substrate 10 is etched by the photolithography method to form the second wiring through-hole 54 and the second sealing hole 62. A mask for etching is not limited thereto and the mask may be formed using a resist film.

In a twelfth step, as illustrated in FIG. 3L, a film resist 18 is adhered to the silicon oxide film 36 so as to cover the second wiring through-hole 54 and the second sealing hole 62, and a pattern that opens the second wiring through-hole 54 is formed by a photolithography method, and the surface silicon layer 13 is etched, thereby forming the first wiring through-hole 52.

In a thirteenth step, as illustrated in FIG. 3M, after the film resist 18 and the silicon oxide film 36 are removed, the element adjustment layer 30 exposed to the first wiring through-hole 52 and the first sealing hole 60 is etched.

As described above, when a mask is formed using a resist film instead of the silicon oxide film 36, the film resist 18 is adhered to the resist film mask in the twelfth step and the film resist 18 and the resist film mask are removed in the thirteenth step.

In a fourteenth step, as illustrated in FIG. 3N, a silicon oxide film 32 is formed on the surface of the silicon layer 11 and the side walls in the first wiring through-hole 52, the second wiring through-hole 54, the first sealing hole 60, and the second sealing hole 62 by the CVD method. Thereafter, the silicon oxide film 32 formed on the polysilicon film 41 of the first wiring through-hole 52 and the first sealing hole 60 is removed by anisotropic dry etching such as reactive ion etching (RIE).

In a fifteenth step, as illustrated in FIG. 3O, in a vacuum (reduced pressure) atmosphere in a pre-processing chamber of a sputtering apparatus or the like, the polysilicon film 41 exposed to the first wiring through-hole 52 and the first sealing hole 60 is etched to create through-holes in the polysilicon film 41 on the first wiring through-hole 52 and the first sealing hole 60. Thereafter, pressure in the internal space constituted with the cavities 7 and 8 is set to the same pressure as that of the pre-processing chamber and a metal layer of titanium (Ti), tungsten (W), copper (Cu) or the like which becomes the wiring electrode 56 is sputtered by continuous processing.

By the fifteenth step, the wiring electrode 56 connected to the first electrode 42 and the second electrode 44 can be formed on the surface of the SOI substrate 10 at a side opposite to the side where the element 20 is formed. Also, in the fifteenth step, since the wiring electrode 56 closes the first sealing hole 60, the internal space constituted with the cavities 7 and 8 in which the element 20 is formed can be sealed in a vacuum atmosphere (reduced-pressure atmosphere). Accordingly, the step of forming the wiring electrode 56 in the first wiring through-hole 52 and the second wiring through-hole 54, the step of closing the first sealing hole 60 with the wiring electrode 56 and airtightly sealing the internal space can be performed at the same time. With this, cost reduction can be achieved.

In a sixteenth step, as illustrated in FIG. 3P, a metal layer equivalent to the metal layer used for the wiring electrode 56 is stacked on the surface of the wiring electrode 56 by a plating method or the like to create the wiring electrode 58. Conductivity and mechanical strength are improved and reliability is improved by completely covering the first wiring through-hole 52, the second wiring through-hole 54 and the second sealing hole 62. It can be said that the wiring electrode 56 is a sputtered layer and the wiring electrode 58 is a plating layer.

In a seventeenth process, as illustrated in FIG. 3Q, the MEMS element 1 having excellent reliability is completed by performing planarization processing on the surface of the SOI substrate 10 at a side opposite to the surface to which the lid 5 is bonded by a polishing apparatus or the like.

Second Embodiment

MEMS Element

Next, a MEMS element 1a according to a second embodiment will be described with reference to FIG. 4.

Figure 4:
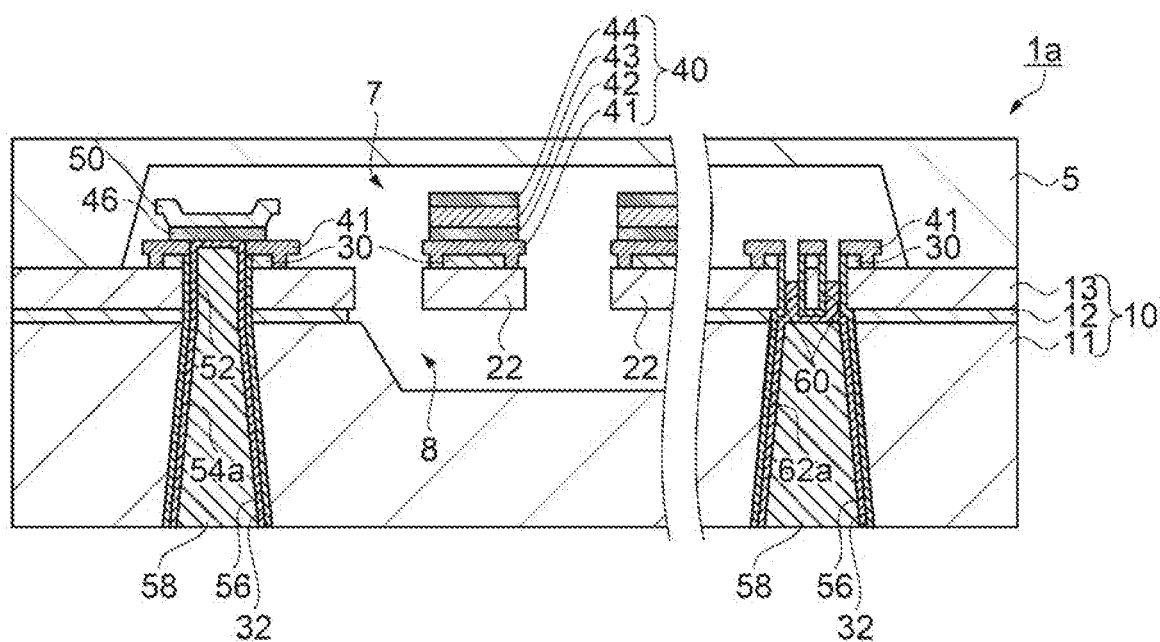
FIG. 4 is a schematic cross-sectional view corresponding to a position of the line P1-P1 in FIG. 1, which illustrates a configuration of a MEMS element according to a second embodiment.

FIG. 4 is a schematic cross-sectional view corresponding to a position of the line P1-P1 of FIG. 1 illustrating a configuration of a MEMS element 1a according to the second embodiment. Description will be mainly made on differences from the embodiment described above, and the same reference numerals are given to similar configurations, and description of similar matters will be omitted.

The MEMS element 1a according to the second embodiment differs from the MEMS element 1 according to the first embodiment in structures of a second wiring through-hole 54a and a second sealing hole 62a.

As illustrated in FIG. 4, in the MEMS element 1a of the present embodiment, the second wiring through-hole 54a and the second sealing hole 62a disposed in the silicon layer 11 and the BOX layer 12 have a tapered portion that expands toward a surface of the support substrate that faces another surface on which the surface silicon layer 13 of the silicon layer 11 and the BOX layer 12 are supported. In the present embodiment, the tapered portion is provided in the silicon layer 11 and the BOX layer 12, but may be provided only in the silicon layer 11. The tapered portion may be provided from the middle of the silicon layer 11.

As described above, according to the MEMS element 1a of the present embodiment, since the second wiring through-hole 54a has the tapered portion that expands toward the surface facing the surface silicon layer 13, the opening of the second wiring through-hole 54a is expanded and the wiring electrode 56 can be easily disposed on the wiring 46 connected to the first wiring through-hole 52 and the electrode pad 50. Since the second sealing hole 62a has a similar tapered portion, the opening of the second sealing hole 62a expands, it becomes easier for the wiring electrode 56 which becomes the sealing film to reach the first sealing hole 60, and it is possible to easily seal the internal space.

Third Embodiment

MEMS Element

Next, a MEMS element 1b according to a third embodiment will be described with reference to FIG. 5.

Figure 5:
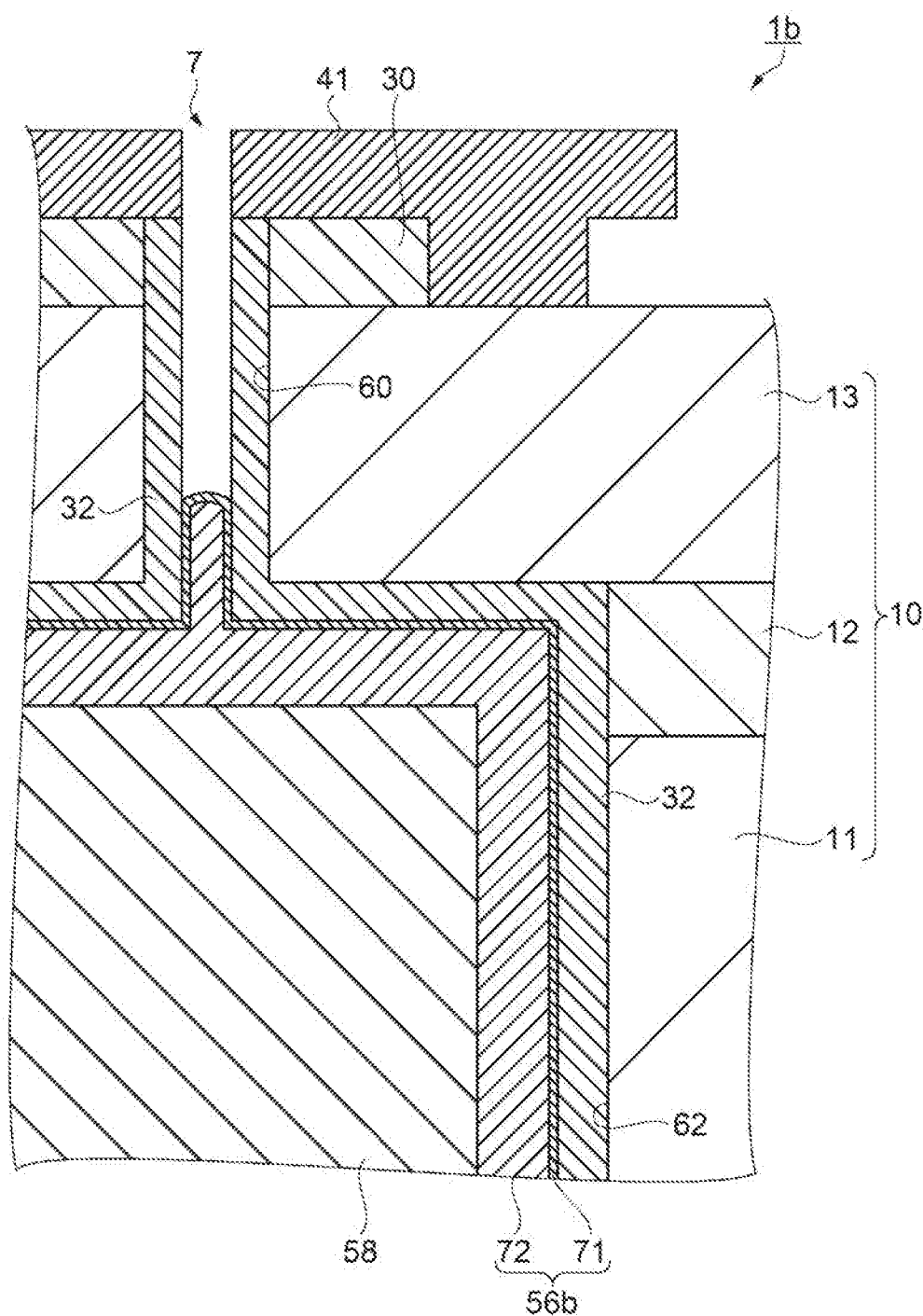
FIG. 5 is an enlarged view of a schematic cross-section corresponding to a position of the Q2 portion in FIG. 2A, which illustrates a configuration of a MEMS element according to a third embodiment.

FIG. 5 is an enlarged view of a schematic cross-section corresponding to a position of the Q2 portion in FIG. 2A illustrating a configuration of the MEMS element 1b according to the third embodiment. Description will be mainly made on differences from the embodiments described above, and the same reference numerals are given to similar configurations, and description of similar matters will be omitted.

The MEMS element 1b according to the third embodiment is different from the MEMS element 1 according to the first embodiment in a structure of a wiring electrode 56b which becomes the sealing film of the first sealing hole 60.

As illustrated in FIG. 5, in the MEMS element 1b of the present embodiment, the wiring electrode 56b is composed of two layers of a first layer 71 and a second layer 72, and the first layer 71 is disposed closer to the inner space side, which is constituted by the cavity 7, than the second layer 72. The first layer 71 is made of any one of Ti, TiW, Cr, and NiCr and the second layer 72 is made of any one of Cu, Au, Ag, and Al. The first layer 71 improves adhesion between the silicon oxide film 32 formed on the inner walls of the first sealing hole 60 and the second sealing hole 62 and the second layer 72 and also is responsible for action of a barrier layer to prevent metal constituting the second layer 72 from passing through the silicon oxide film 32 and diffusing into the silicon layer 11 and the surface silicon layer 13.

As described above, according to the MEMS element 1b of the present embodiment, the wiring electrode 56b is composed of two layers, the first layer 71 is constituted with any one of Ti, TiW, Cr, and NiCr and thus, 71 adhesion of the second layer 72 is improved and the first layer becomes the barrier layer of the second layer 72. For that reason, it is possible to reliably close the first sealing hole 60 and it is possible to set the internal space in which the element 20 is disposed to a vacuum atmosphere (reduced pressure atmosphere).

Fourth Embodiment

MEMS Element

Next, a MEMS element 1c according to a fourth embodiment will be described with reference to FIG. 6.

Figure 6:
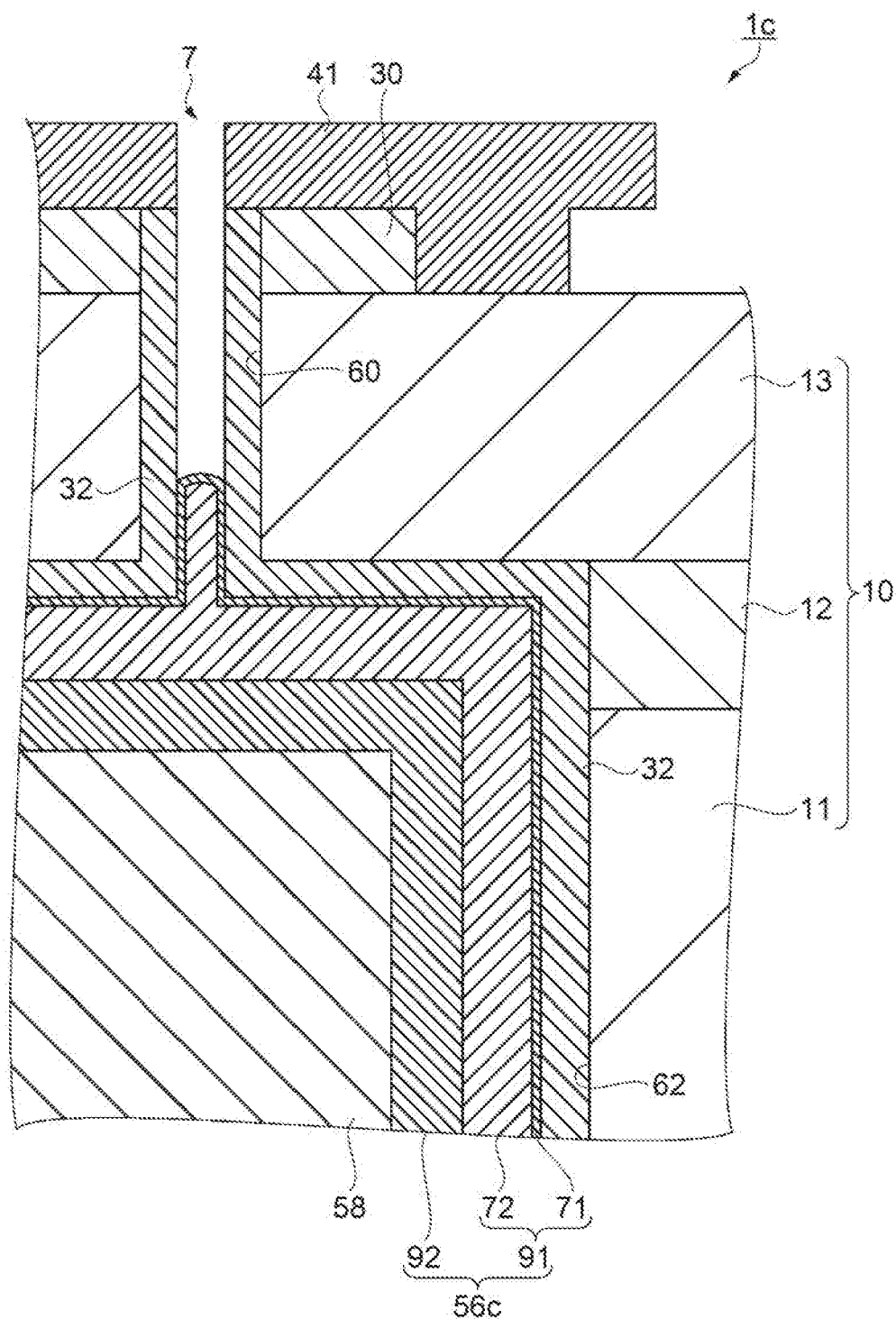
FIG. 6 is an enlarged view of a schematic cross-section corresponding to a position of the Q2 portion in FIG. 2A, which illustrates a configuration of a MEMS element according to a fourth embodiment.

FIG. 6 is an enlarged view of a schematic cross-section corresponding to the position of the Q2 portion in FIG. 2A illustrating a configuration of the MEMS element 1c according to the fourth embodiment. Description will be mainly made on differences from the embodiments described above, and the same reference numerals are given to similar configurations, and description of similar matters will be omitted.

The MEMS element 1c according to the fourth embodiment is different from the MEMS element 1 according to the first embodiment in a structure of a wiring electrode 56c which becomes the sealing film of the first sealing hole 60, similarly to the MEMS element 1b according to the third embodiment.

In the MEMS element 1c of the present embodiment, as illustrated in FIG. 6, the wiring electrode 56c is constituted with a first layer portion 91 and a second layer portion 92, and the first layer portion 91 is disposed closer to the inner space side, which is constituted by the cavity 7, than the second layer portion 92. The first layer portion 91 is composed of two layers of the first layer 71 and the second layer 72, and the first layer 71 is disposed closer to the inner space side than the second layer 72. The first layer 71 of the inner space side is made of any one of Ti, TiW, Cr, and NiCr and the second layer 72 of the second layer portion 92 side is made of any one of Cu, Au, Ag, and Al. The second layer portion 92 is one layer and is made of any one of Cu, Au, Ag, and Al.

Since the first layer portion 91 has the same structure as the wiring electrode 56b of the MEMS element 1b according to the third embodiment described above, the same effect can be obtained. After the first layer portion 91 is formed, the second layer portion 92 is in contact with the internal space constituted by the inside of the first sealing hole 60, that is, the so-called cavity 7, and is able to close the cracks and set the internal space to a vacuum atmosphere (reduced pressure atmosphere) when cracks (leak path) occur due to residual stress of the first layer 71 and the second layer 72 and disturbance of crystal grain boundaries of the first layer 71 and the second layer 72 in a region without the silicon oxide film 32.

As described above, according to the MEMS element 1c of the present embodiment, since the wiring electrode 56c has a three-layer structure constituted with the first layer portion 91 of two layers and the second layer portion 92 of one layer, even if cracks (leak path) occur due to residual stress and disturbance of crystal grain boundaries after the first layer portion 91 is formed, the crack can be closed by the second layer portion 92. Accordingly, it is possible to set the internal space where the element 20 is disposed to a vacuum atmosphere (reduced pressure atmosphere) and it is possible to obtain the MEMS element 1c having excellent reliability.

Fifth Embodiment

MEMS Element

Next, a MEMS element 1d according to a fifth embodiment will be described with reference to FIG. 7.

Figure 7:
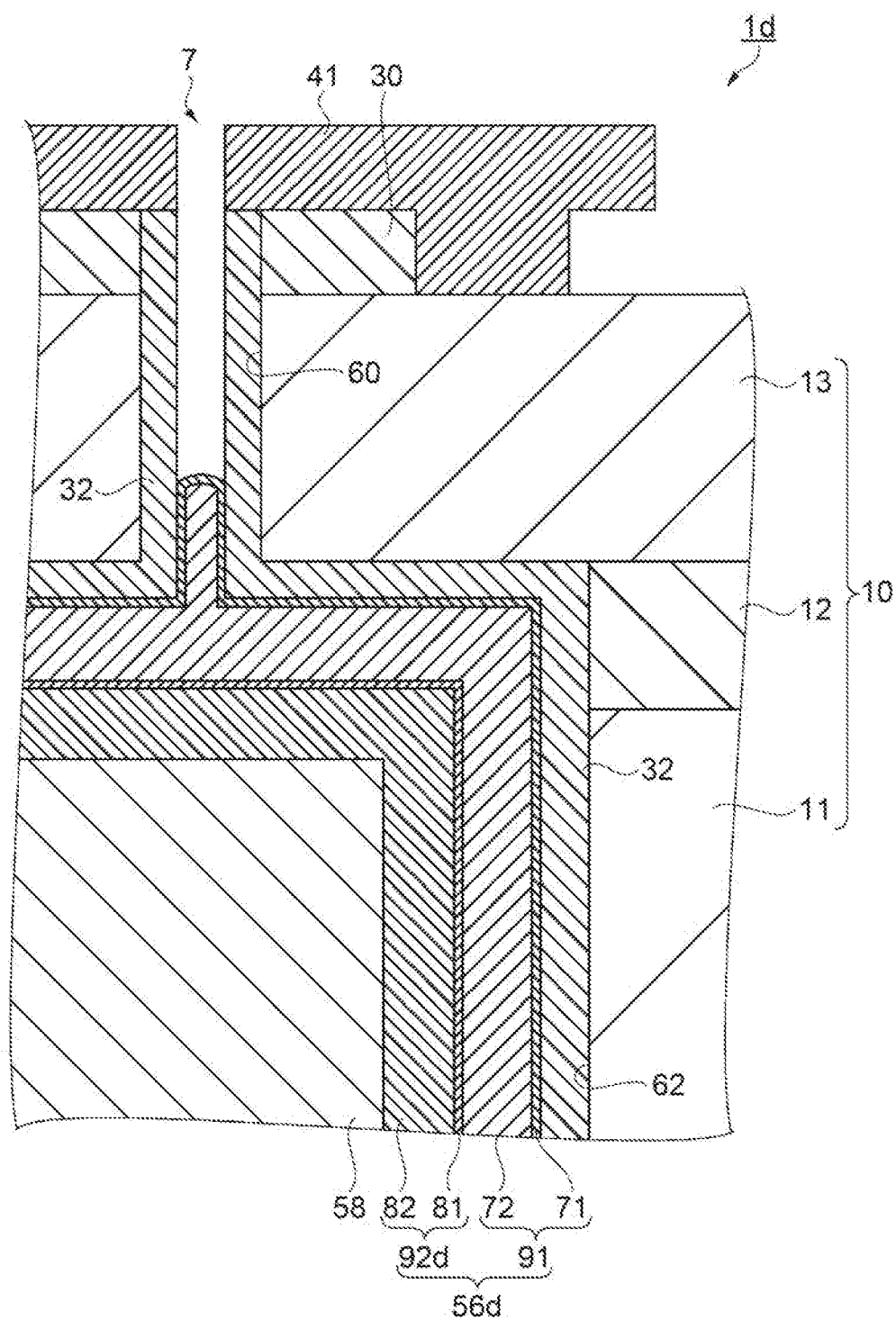
FIG. 7 is an enlarged view of a schematic cross-section corresponding to a position of the Q2 portion in FIG. 2A, which illustrates a configuration of a MEMS element according to a fifth embodiment.

FIG. 7 is an enlarged view of a schematic cross-section corresponding to a position of the Q2 portion in FIG. 2A illustrating a configuration of the MEMS element 1d according to the fifth embodiment. Description will be mainly made on differences from the embodiments described above, and the same reference numerals are given to similar configurations, and description of similar matters will be omitted.

The MEMS element 1d according to the fifth embodiment is different from the MEMS element 1 according to the first embodiment in a structure of a wiring electrode 56d which becomes the sealing film of the first sealing hole 60, similarly to the MEMS elements 1b and 1c according to the third and four embodiments.

In the MEMS element 1d of the present embodiment, as illustrated in FIG. 7, the wiring electrode 56d is constituted with the first layer portion 91 and the second layer portion 92d, and the first layer portion 91 is disposed closer to the inner space side, which is constituted by the cavity 7, than the second layer portion 92d. The first layer portion 91 is composed of two layers of the first layer 71 and the second layer 72, and the first layer 71 is disposed closer to the inner space side than the second layer 72. The first layer 71 of the inner space side is made of any one of Ti, TiW, Cr, and NiCr and the second layer 72 of the second layer portion 92d side is made of any one of Cu, Au, Ag, and Al. The second layer portion 92d is composed of two layers of a third layer 81 and a fourth layer 82, and the third layer 81 is disposed closer to the inner space side than the fourth layer 82. The third layer 81 of the inner space side is made of any one of Ti, TiW, Cr, and NiCr and the fourth layer 82 of the wiring electrode 58 side is made of any one of Cu, Au, Ag, and Al.

Since the first layer portion 91 has the same structure as the wiring electrode 56b of the MEMS element 1b according to the third embodiment described above, the same effect can be obtained. The second layer portion 92d can obtain the same effect as the second layer portion 92 of the wiring electrode 56c of the MEMS element 1c according to the fourth embodiment described above. In particular, in the configuration of the wiring electrode, in a case where adjacent two layers are formed of the same metal, there is a concern that cracks caused by residual stress and disturbance of crystal grain boundaries in one layer are also continuously generated in the other layer. For that reason, in the present embodiment, a third layer of a metal different from the second layer 72 and the fourth layer 82 between the second layer 72 and the fourth layer 82 to make it possible to close the cracks occurred in the first layer portion gland suppress occurrence of cracks in the fourth layer 82.

As described above, according to the MEMS element 1d of the present embodiment, the wiring electrode 56d has a four-layer structure including the first layer portion 91 of two layers and the second layer portion 92d of two layers and thus, even if cracks are generated due to residual stress or disturbance of crystal grain boundaries after the first layer portion 91 is formed, the crack can be closed by the second layer portion 92d. In particular, in a case where metal of the second layer 72 of the first layer portion 91 and metal of the fourth layer 82 of the second layer portion 92d are the same, the third layer 81 is formed between the second layer 72 and the fourth layer 82 so as to make it possible to prevent cracks occurring in the second layer 72 from being continuously generated in the fourth layer 82. Accordingly, the internal space in which the element 20 is disposed can be set to a vacuum atmosphere (reduced pressure atmosphere), and the MEMS element 1d having excellent reliability can be obtained.

Sixth Embodiment

MEMS Element

First, the MEMS element 1e according to the sixth embodiment will be described with reference to FIGS. 8, 9A, and 9B.

Figure 8:
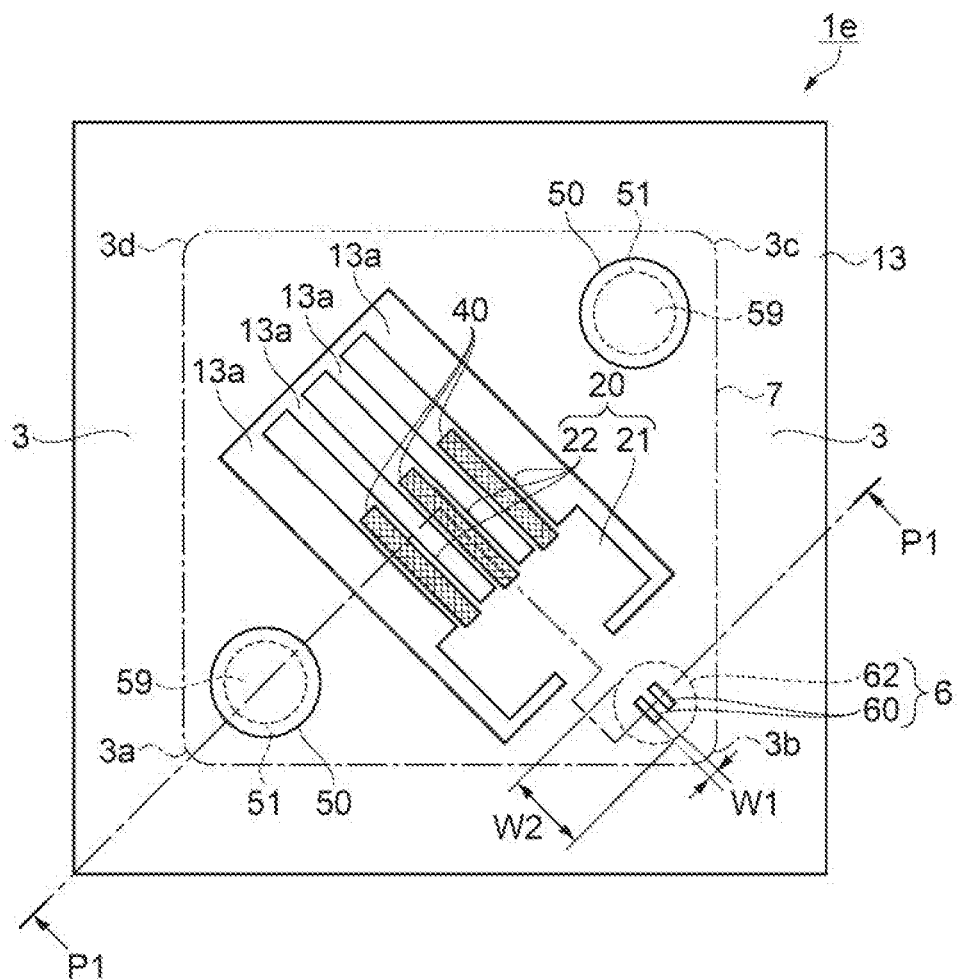
FIG. 8 is a schematic plan view illustrating a configuration of a MEMS element according to a sixth embodiment.
Figure 9A:
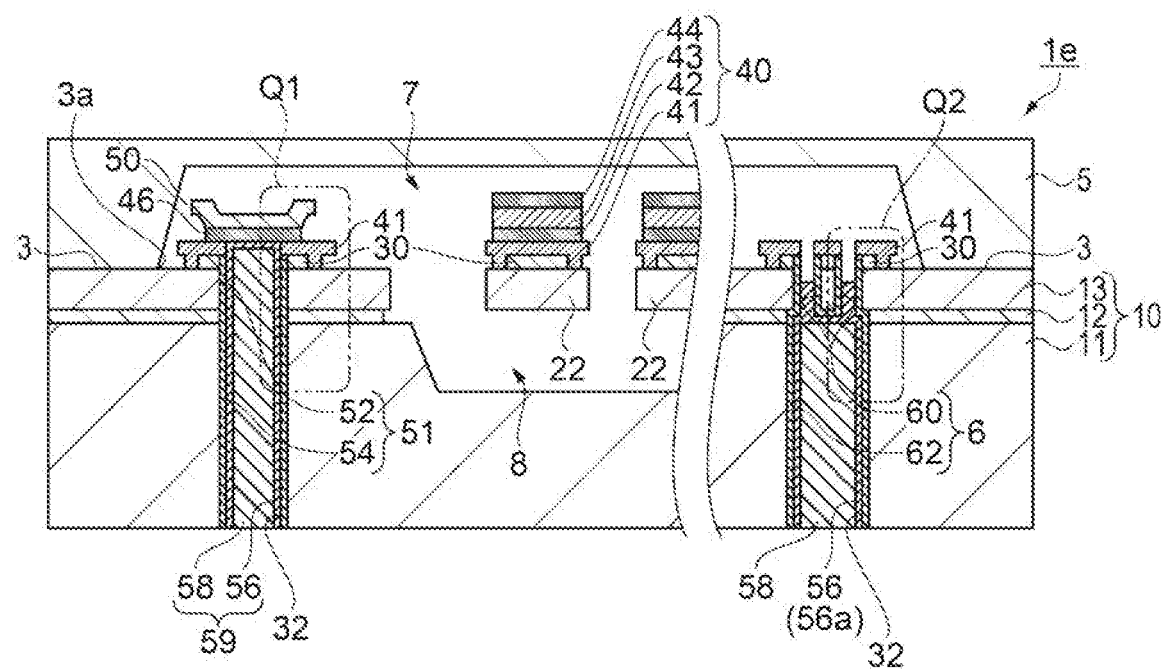
FIG. 9A is a schematic cross-sectional view taken along line P1-P1 of FIG. 8.
Figure 9B:
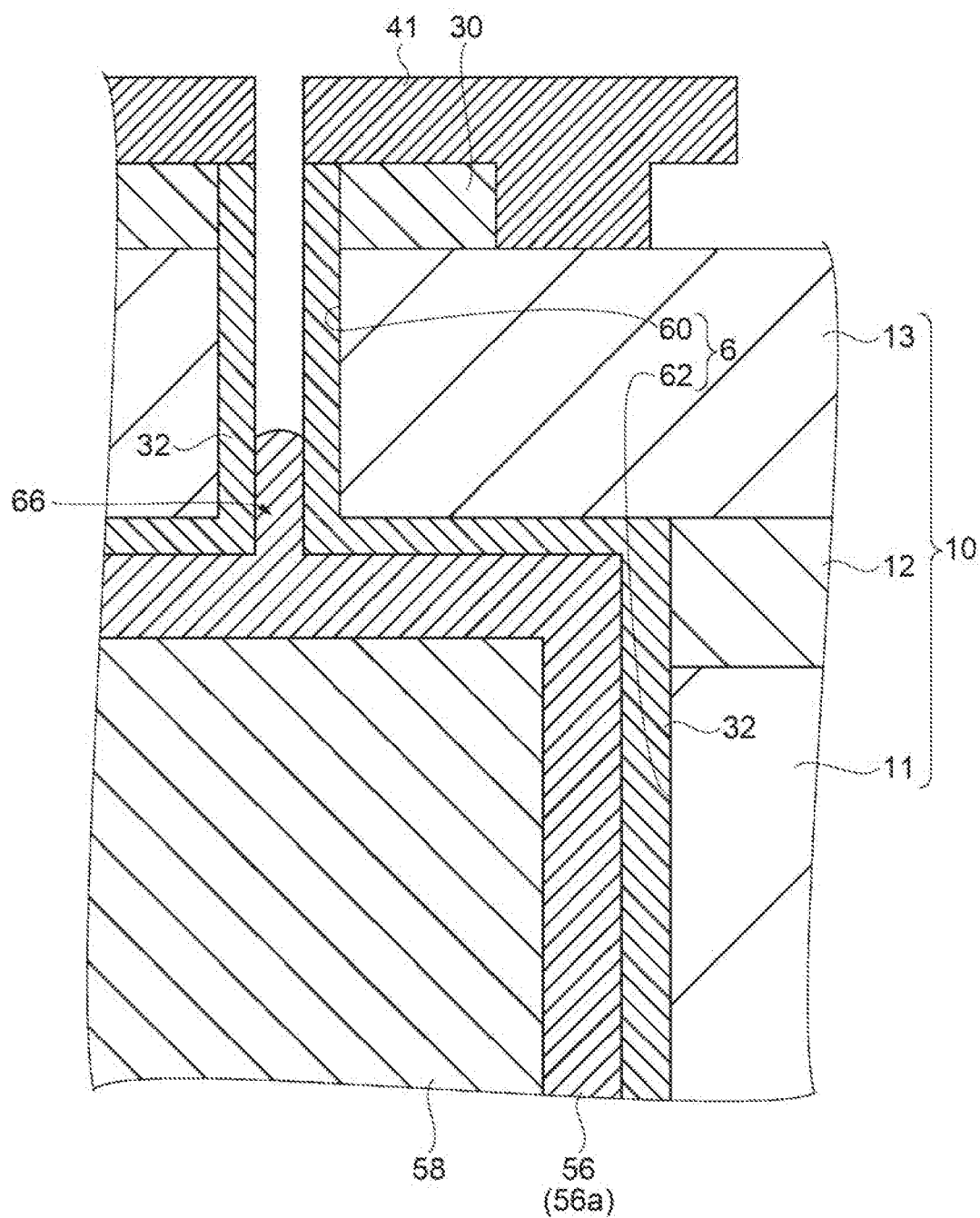
FIG. 9B is an enlarged view illustrating a portion Q2 in FIG. 9A.

FIG. 8 is a schematic plan view illustrating a configuration of a MEMS element 1e according to a sixth embodiment, FIG. 9A is a schematic cross-sectional view taken along line P1-P1 of FIG. 8, and FIG. 9B is an enlarged view illustrating a portion Q2 in FIG. 9A. In FIG. 8, for convenience of explanation of the internal structure of the MEMS element 1e, a state in which the lid 5 is removed is illustrated. In FIGS. 9A and 9B, the line illustrating the background of the cross-section is omitted. In the present embodiment, description will be mainly made on differences from the embodiment described above, and the same reference numerals are given to similar configurations, and description of similar matters will be omitted.

The MEMS element 1e according to the sixth embodiment is different from the MEMS element 1 according to the first embodiment in an arrangement region of the sealing hole 6 constituted with the first sealing hole 60 and the second sealing hole 62. In the MEMS element 1, the first sealing hole 60 and the second sealing hole 62 are disposed in the side where the vibration portion 22 of the base portion 21 is provided and the side which faces the vibration portion 22 via the base portion 21 in the region of the cavity 7 of the lid 5, in plan view, but in the MEMS element 1e, the first sealing hole 60 and the second sealing hole 62 are disposed in a portion of the region in contact with a corner portion 3b other than two corner portions 3a and 3c where two through electrodes 59 are disposed. In the present embodiment, the vibration portion 22 corresponds to a movable portion.

As illustrated in FIGS. 8, 9A and 9B, the MEMS element 1e according to the present embodiment is configured to include the lid 5 for airtightly sealing the element 20, the silicon on insulator (SOI) substrate 10 on which the element 20 is formed.

The lid 5 is made of monocrystalline silicon or the like and has the cavity 7 opening toward the SOI substrate 10 side. The surface of the lid 5 on the side where the cavity 7 is provided is bonded to the surface of the SOI substrate 10 on the side where the element 20 is formed. Four corner portions 3a, 3b, 3c and 3d are provided on a bonding surface 3 between the lid 5 and the SOI substrate 10 (surface silicon layer 13).

On the SOI substrate 10, the element 20 made of silicon of the surface silicon layer 13, the electrode pad 50 formed on the surface silicon layer 13, the wiring 46 (see FIG. 9A, not illustrated in FIG. 8) that connects the element electrode for driving the element 20 to the electrode pad 50, a through-electrode 59 which is connected to the electrode pad 50 and leads out the electrode to the side opposite to the side where the element 20 is formed, a wiring through-hole 51 formed by the second wiring through hole 54 and the first wiring through hole 52 for forming the through electrode 59, the sealing hole 6 constituted with the first sealing hole 60 and the second sealing hole 62 for airtightly sealing the internal space formed by the cavity 7 of the lid 5 and the cavity 8 formed on the SOI substrate 10, and a sealing film 56a which closes the first sealing hole 60 and airtightly seals the cavities 7 and 8 are disposed.

Since the element 20, the element adjustment layer 30, the piezoelectric driver 40, the wiring 46, and the electrode pad 50 are the same as those in the embodiments described above, description thereof is omitted.

The through electrode 59 is disposed in the wiring through-hole 51 and is configured such that the wiring electrode 56 and the wiring electrode 58 are stacked. As illustrated in FIG. 8, in plan view, in the region of the cavity 7 of the lid 5, two through-electrodes 59 are disposed in portions of the regions in contact with two opposing corner portions 3a and 3c sandwiching the element 20 therebetween, respectively, that is, one through electrode 59 is disposed in a region closer to the corner portion 3a than the element 20, and the other through electrode 59 is disposed in a region closer to the corner portion 3c than the element 20.

The wiring through-hole 51 in which the through electrode 59 is disposed is constituted with the second wiring through-hole 54 disposed in the silicon layer 11 and the BOX layer 12 that correspond to the support substrate and the first wiring through-hole 52 disposed in the surface silicon layer 13 corresponding to the element substrate, and the second wiring through-hole 54 and the first wiring through-hole 52 communicate with each other.

The electrode pad 50 is disposed at a position overlapping with the through electrode 59 in plan view, and is disposed so as to be electrically connected to the through electrode 59 disposed in the wiring through-hole 51 via the wiring 46 at a position overlapping with the through electrode 59 and is disposed on the surface silicon layer 13 via the element adjustment layer 30, the polysilicon film 41, and the wiring 46, at a position not overlapping with the through electrode 59. For that reason, the electrode pad 50 and the through-electrode 59 are electrically connected and the first electrode 42 and the second electrode 44 which are element electrodes can be lead out to the surface of the SOI substrate 10 opposite to the side on which the element 20 is formed.

As the material of the components, the through-electrode 59 is made of titanium (Ti), tungsten (W), copper (Cu) or the like, and the wiring electrode 56 is a sputtered layer formed by a sputtering method, the wiring electrode 58 is a plating layer formed by plating, and the sputtered layer (wiring electrode 56) is stacked on the plating layer (wiring electrode 58).

As illustrated in FIG. 8, in plan view, in the region of the cavity 7 of the lid 5, the sealing hole 6 is disposed in a portion of the region in contact with the corner portion 3b other than two corner portions 3a and 3c where two through-electrodes 59 are disposed. That is, the sealing hole 6 is disposed in a region closer to the corner portion 3b than the element 20 on the side facing the side where the vibration portion 22 of the base portion 21 is provided. The sealing hole 6 is constituted with the second sealing hole 62 disposed in the silicon layer 11 and the BOX layer 12 that correspond to the support substrate and the first sealing layer 62 disposed on the surface silicon layer 13 that corresponds to the element substrate, and the second sealing hole 60 and the first sealing hole 60 communicate with each other.

An opening width W1 of the first sealing hole 60 is narrower than an opening width W2 of the second sealing hole 62, and the plurality of first sealing holes 60 are disposed at positions overlapping with the second sealing hole 62. In the present embodiment, since a shape of the first sealing hole 60 is a rectangle, a length of a side having a shorter length of the opening width is set as the opening width W1. The sealing film 56a, that is, the same metal layer as the wiring electrode 56 constituting a portion of the through electrode 59 is disposed in the communication portion 66 (see FIG. 9B) between the second sealing hole 62 and the first sealing hole 60 and the internal space constituted with the cavity 7 of the lid 5 and the cavity 8 formed in the SOI substrate 10 is airtightly sealed.

In the second sealing hole 62, a wiring electrode 56 (sealing film 56a) composed of a sputtered layer is disposed, and the wiring electrode 58 composed of a plating layer stacked on the wiring electrode 56 is disposed. In the present embodiment, two first sealing holes 60 are disposed, but is not limited thereto, and only one or more first sealing holes 60 may be used.

As described above, according to the MEMS element 1e of the present embodiment, it is possible to airtightly seal the inside of the cavities 7 and 8 containing the element 20 easily by sealing the sealing hole 6 which communicates with the cavities 7 and 8 constituted with the SOI substrate 10 and the lid 5 with the sealing film 56a. For that reason, it is possible to obtain the MEMS element 1e having high reliability without requiring a high-level processing method. Since the sealing hole 6 for sealing is disposed on the side facing the vibration portion 22 with respect to the base portion 21 of the element 20, it is possible to reduce that the sealing film 56a enters the cavities 7 and 8 and adheres to the vibration portion 22 of the element 20 when the sealing hole 6 is sealed, and to obtain the MEMS element 1e having stable characteristics. Furthermore, since the sealing hole 6 is disposed in the vicinity of the base portion 21, vibration of the vibration portion 22 is alleviated by the sealing hole 6, and it is possible to reduce leakage of vibration of the vibration portion 22 to the entire SOI substrate 10 and to obtain the MEMS element 1e having a high Q value.

Since the sealing hole 6 is disposed close to the corner portion 3b other than two corner portions 3a and 3c where two through-electrodes 59 are close to each other, that is, since the sealing hole 6 is disposed at a position away from two through electrodes 59, it is possible to reduce fluctuations in an insulation resistance value caused by adhesion of the sealing film 56a at the time of sealing the sealing hole 6 to the wiring 46 connected to the through electrode 59 disposed in the cavities 7 and 8 and the electrode pad 50. Accordingly, it is possible to obtain the MEMS element 1e having stable characteristics.

Since the opening width W1 of the first sealing hole 60 is narrower than the opening width W2 of the second sealing hole 62, the communication portion 66 between the second sealing hole 62 and the first sealing hole 60 is closed by the sealing film 56a disposed on the second sealing hole 62 side, and the inside of the cavities 7 and 8 containing the element 20 can be airtightly sealed easily.

Since the element 20 is a vibrator, the influence of disturbance can be reduced by airtightly sealing the inside of the cavities 7 and 8 containing the vibrator and thus, a vibrator having stable characteristics can be obtained.

Manufacturing Method

Since manufacturing steps of the MEMS element 1e according to the present embodiment are the same as those of the first embodiment described above, description thereof is omitted. In a fifteenth step of the MEMS element 1e according to the present embodiment, since the wiring electrode 56 acts as the sealing film 56a and closes the first sealing hole 60, the internal space constituted with the cavities 7 and 8 in which the element 20 is formed can be sealed in a vacuum atmosphere (reduced pressure atmosphere).

The second embodiment (see FIG. 4) described above can also be applied to the MEMS element 1e according to the present embodiment. According to this, since the second wiring through-hole 54a has a tapered portion that expands toward the surface facing the surface silicon layer 13, the wiring electrode 56 can be easily disposed on the wiring 46 connected to the electrode pad 50. Since the second sealing hole 62a has a similar tapered portion, the wiring electrode 56 serving as the sealing film 56a for closing the first sealing hole 60 is made to reach the second sealing hole 62a and becomes easy to seal the second sealing hole 62a.

Seventh Embodiment

MEMS Element

Figure 10:
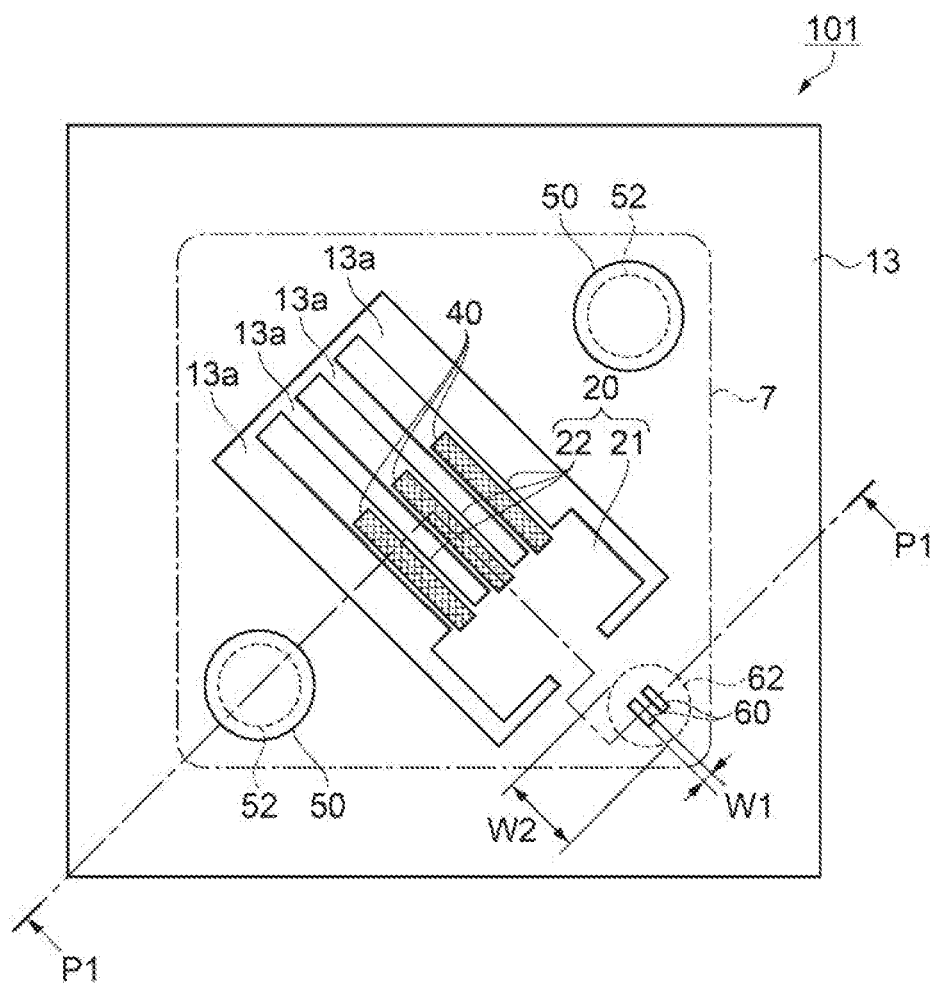
FIG. 10 is a schematic plan view illustrating a configuration of a MEMS element according to a seventh embodiment.
Figure 11A:
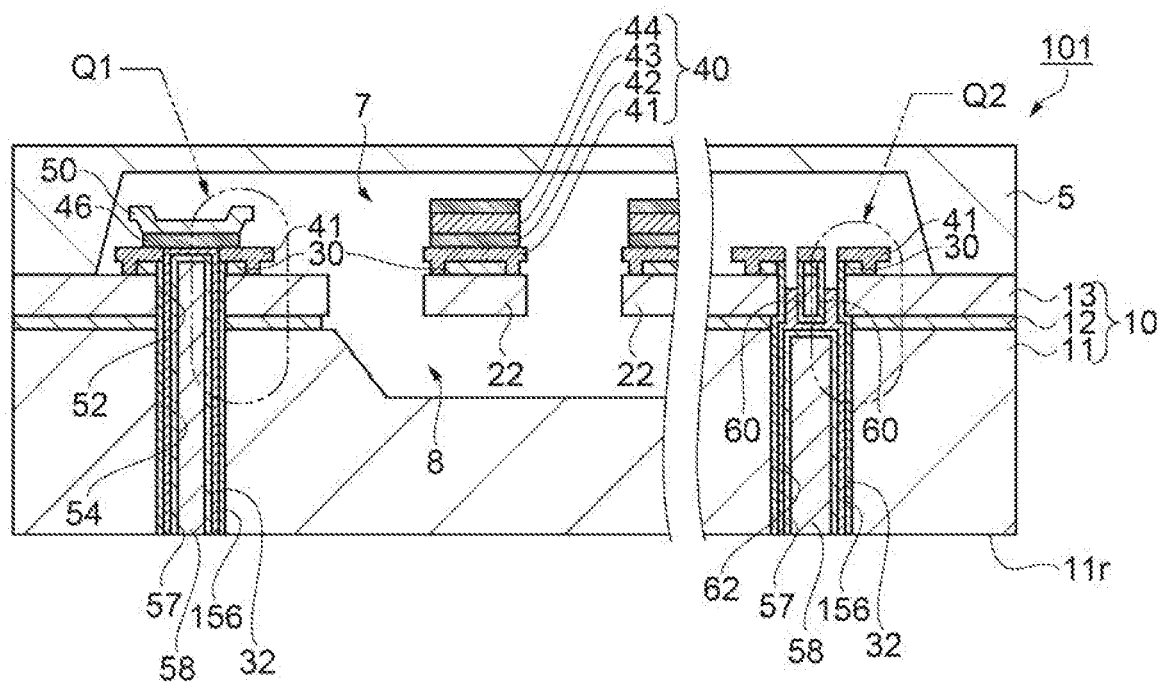
FIG. 11A is a schematic cross-sectional view taken along line P1-P1 in FIG. 10.
Figure 11B:
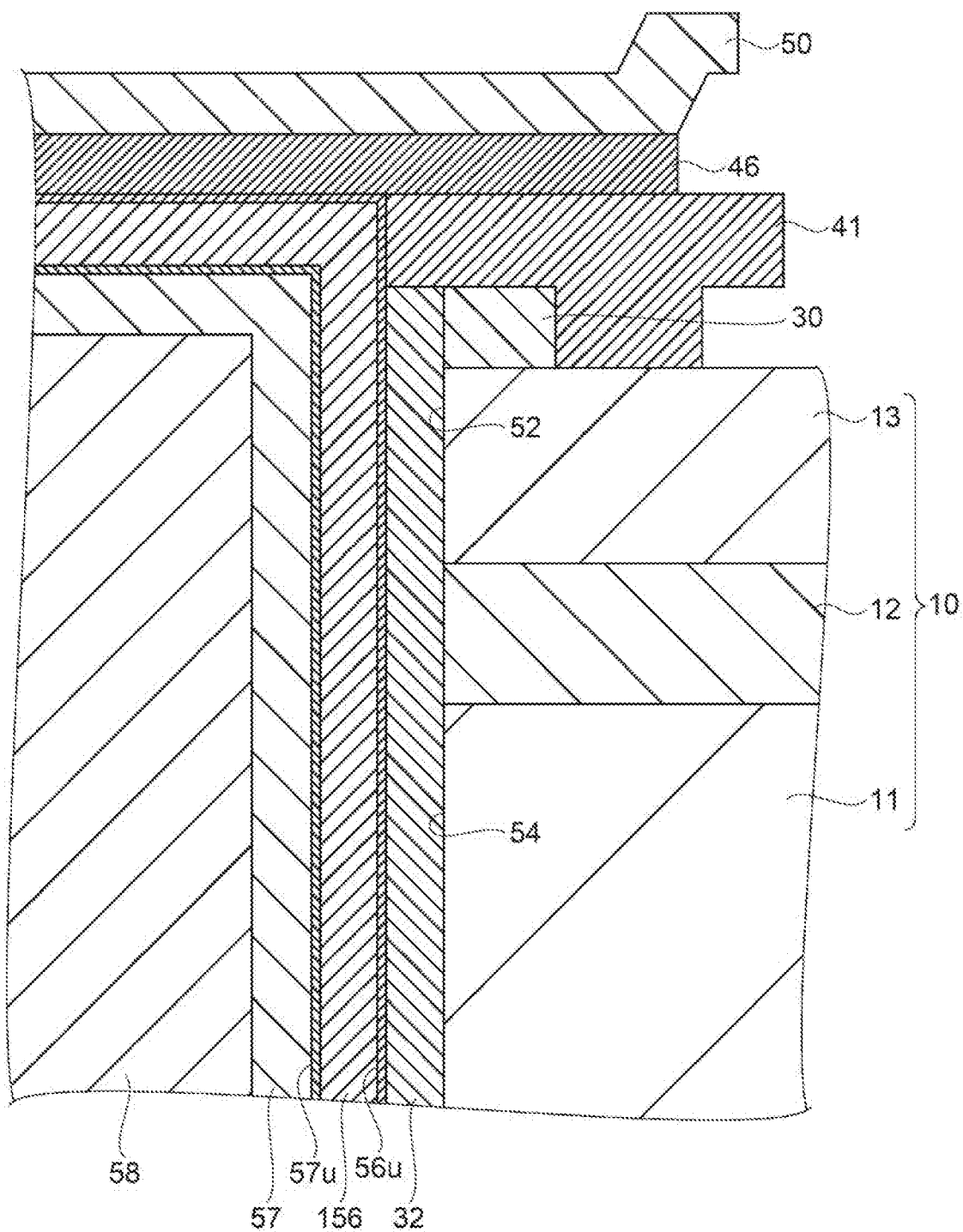
FIG. 11B is an enlarged view illustrating a Q1 portion in FIG. 11A.
Figure 11C:
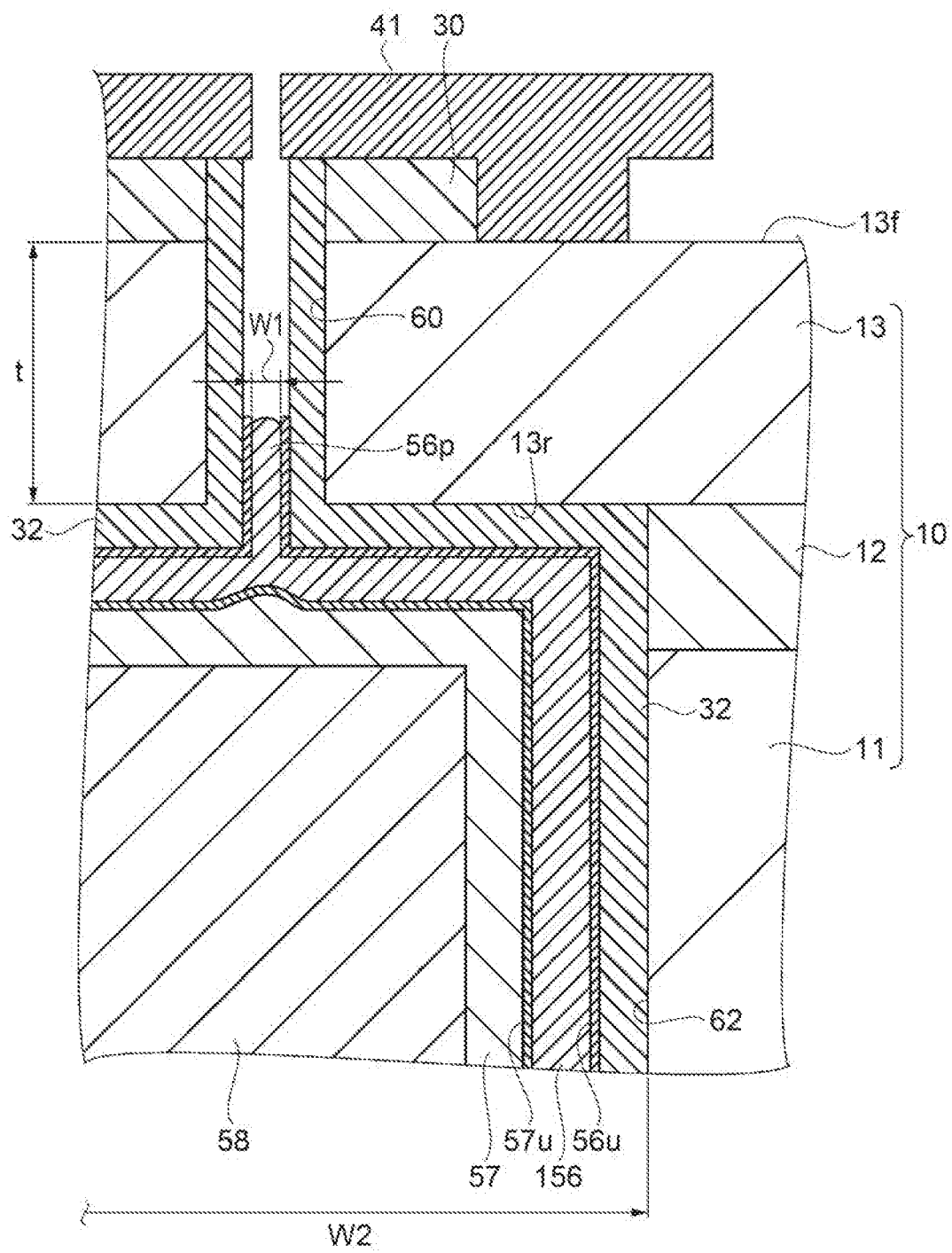
FIG. 11C is an enlarged view illustrating a Q2 portion in FIG. 11A.
Figure 11D:
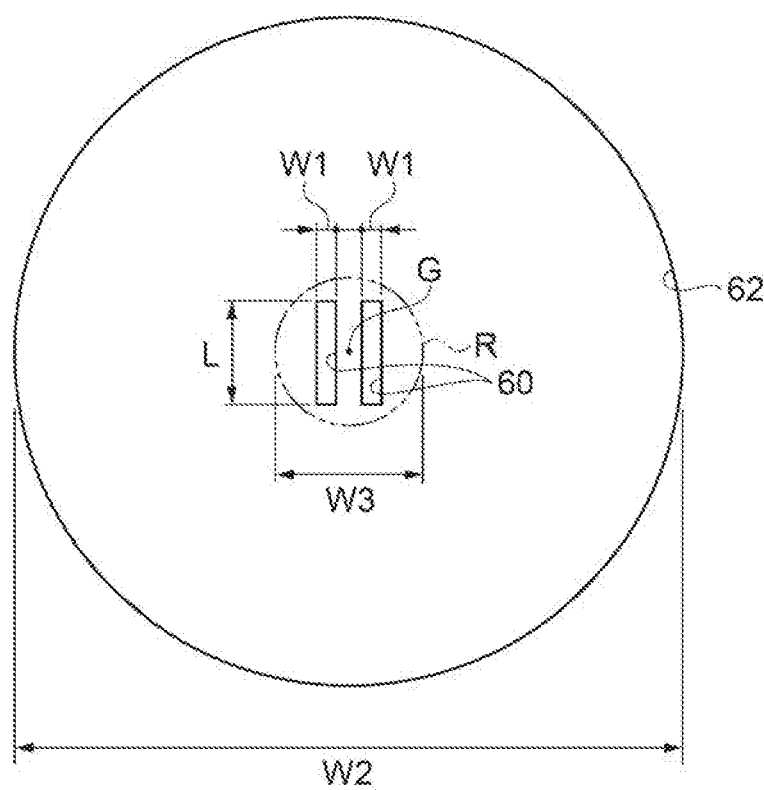
FIG. 11D is an enlarged view illustrating an example of planar disposition of a first sealing hole and a second sealing hole constituting a sealing hole.

First, a MEMS element 101 according to a seventh embodiment will be described with reference to FIGS. 10, 11A, 11B, 11C, and 11D. FIG. 10 is a schematic plan view illustrating a configuration of the MEMS element 101 according to the seventh embodiment and FIG. 11A is a schematic cross-sectional view taken along line P1-P1 in FIG. 10. FIG. 11B is an enlarged view illustrating a Q1 portion in FIG. 11A. FIG. 11C is an enlarged view illustrating a Q2 portion in FIG. 11A. FIG. 11D is an enlarged view illustrating an example of a planar disposition of a first sealing hole and a second sealing hole constituting a sealing hole. In FIG. 10, for the convenience of explaining an internal configuration of the MEMS element 101, a state in which the lid 5 is removed is illustrated. In FIGS. 11A, 11B and 11C, the line illustrating the background of the cross-section is omitted.

As illustrated in FIGS. 10, 11A, 11B, and 11C, the MEMS element 101 as an example of an electronic device according to the present embodiment is configured to include the lid 5 which airtightly seals the element 20 and serves as an inner-sealable lid and the silicon on insulator (SOI) substrate 10 on which the element 20 is formed.

The lid 5 as a lid is made of monocrystalline silicon or the like and has a cavity 7 opening toward the SOI substrate 10 side. The lid 5 is bonded to the SOI substrate 10 by bringing the surface on the side where the cavity 7 is provided into contact with the surface of the SOI substrate 10 on which the element 20 is formed.

The SOI substrate 10 as a substrate in which the silicon layer 11, the buried oxide (BOX) layer 12, and the surface silicon layer 13 are stacked in this order. For example, the silicon layer 11 and the surface silicon layer 13 are made of monocrystalline silicon, and the BOX layer 12 is constituted with a silicon oxide layer ($SiO_2$ or the like). In the present embodiment, the silicon layer 11 correspond to a support substrate, and the BOX layer 12 correspond to an oxide film, and the surface silicon layer 13 corresponds to an element substrate.

On the SOI substrate 10, the element 20 made of silicon of the surface silicon layer 13, the electrode pad 50 formed on the surface silicon layer 13, the plurality of wirings 46 (see FIG. 11A, not illustrated in FIG. 10) each of which connects an element electrode for driving the element 20 and the electrode pad 50, the first wiring electrode 156, the second wiring electrode 57, and the wiring electrode 58 which are connected to the electrode pad 50 and lead out electrodes onto the surface of an outer surface 11r on a side opposite to the side where the element 20 is formed, the first wiring through-hole 52 and the second wiring through-hole 54 for forming the first wiring electrode 156, the second wiring electrode 57, and the wiring electrode 58, and the sealing holes for airtightly sealing the internal space constituted with the cavity 7 of the lid 5 and the cavity 8 formed in the SOI substrate 10 are disposed.

In the present embodiment, the configuration which includes at least the SOI substrate 10, the lid 5, and the second sealing hole 62 and the first sealing hole 60 communication with the second sealing hole 62 that constitute the sealing hole for airtightly sealing the internal space constituted with the cavity 7 of the lid 5 and the cavity 8 formed on the SOI substrate 10, and the first wiring electrode 156 as a first layer of a sealing film which is disposed on the second sealing hole 62 side and closes the communication portion between the first sealing hole 60 and the second sealing hole 62 corresponds to an example of the sealing structure.

The element 20 includes the base portion 21 supported by the BOX layer 12 and the vibration portion 22 separated from surrounding silicon other than the base portion 21 by the groove 13a on a region from which the BOX layer 12 is removed. The element 20 exemplified in the present embodiment has three vibration portions 22. The cavity 8 constituting the internal space is disposed in the silicon layer 11 and the BOX layer 12 at the position facing the vibration portion 22. The element 20 exemplified in the present embodiment has three vibration portions 22. The cavity 8 constituting the internal space is disposed in the silicon layer 11 and the BOX layer 12 at the position facing the vibration portion 22. On an upper surface 13f of the surface silicon layer 13 which is the surface of the element 20 on the side of the lid 5, the element adjustment layer 30 which is a silicon oxide film disposed in an outer peripheral region of the sealing hole for airtightly sealing a predetermined region of the element 20 and the internal space and the piezoelectric driver 40 that covers at least a portion of the element adjustment layer 30 are provided.

The element adjustment layer 30 is provided to correct temperature characteristics of a resonance frequency of the vibration portion 22. Silicon has a resonance frequency that decreases as the temperature rises, while a silicon oxide film has a resonance frequency that increases as the temperature rises. Accordingly, the temperature characteristics of the resonance frequency of a composite body constituted with the vibration portion 22 of the element 20 and the element adjustment layer 30 can be brought close to flat by disposing the element adjustment layer 30 which is a silicon oxide film on the silicon element 20.

The piezoelectric driver 40 includes the polysilicon film 41 which is an example of the first protective film, the first electrode 42, the piezoelectric layer 43, and the second electrode 44. In the present embodiment, the first electrode and the second electrode 44 correspond to element electrodes.

Although the polysilicon film 41 which is the first protective film is made of polysilicon not doped with impurities, the first protective film may be made of, for example, amorphous silicon. Alternatively, it may be a stacked film of polysilicon and amorphous silicon. In the present embodiment, the polysilicon film 41 is provided so as to cover the element adjustment layer 30 disposed on the element 20. As such, since the element adjustment layer 30 is provided between the polysilicon film 41 and the element 20, the polysilicon film 41 is able to protect the element adjustment layer 30 from etching of the silicon oxide film around the piezoelectric driver 40.

The first electrode 42 and the second electrode 44 are disposed so as to sandwich the piezoelectric layer 43 therebetween. In the example illustrated in the present embodiment, three pairs of the first electrodes 42, the piezoelectric layers 43, and the second electrodes 44 are disposed corresponding to three vibration portions 22.

The plurality of wirings 46 are electrically connected to the first electrode 42 and the second electrode 44 so as to vibrate adjacent vibration portions 22 in opposite phases. The plurality of wirings 46 are electrically connected to the electrode pads 50, and a voltage is applied between two electrode pads 50 from the outside via the first wiring electrode 156 and wiring electrode 58 so as to make it possible to vibrate the adjacent vibration portions 22 in opposite phases.

As a material constituting these components, for example, the piezoelectric layer 43 is made of aluminum nitride (AlN) or the like, and the first electrode 42 and the second electrode 44 are made of titanium nitride (TiN) or the like, and the plurality of wirings 46 and the electrode pad 50 are made of aluminum (Al) or copper (Cu) or the like.

When a voltage is applied between the first electrode 42 and the second electrode 44 via the two electrode pads 50, the piezoelectric layer 43 expands and contracts and the vibration portion 22 vibrates due to application of the voltage. The vibration is largely excited at the natural resonance frequency, and impedance is minimized. As a result, the MEMS element 101 is connected to an oscillation circuit such that the MEMS element 101 oscillates mainly at an oscillation frequency determined by the resonance frequency of the vibration portion 22.

As illustrated in FIG. 10, one first wiring through-holes 52 is disposed on each of both sides of the element 20 and is disposed at a position overlapping with the electrode pad 50 of the surface silicon layer 13 in the region of the cavity 7 of the lid 5 in plan view. The second wiring through-hole 54 communicates with the first wiring through-hole 52 and is disposed in the silicon layer 11 and the BOX layer 12.

In plan view, the electrode pad 50 is disposed so as to be electrically connected to the first wiring electrode 156 (second wiring electrode 57) and the wiring electrode 58 disposed in the first wiring through-hole 52 and the second wiring through-hole 54 via the wiring 46, at a position overlapping with the first wiring through-hole 52. The electrode pad 50 is disposed on the surface silicon layer 13 via the element adjustment layer 30, the polysilicon film 41, and the wiring 46, at a position not overlapping with the first wiring through-hole 52. With such a configuration, the electrode pad 50, the first wiring electrode 156 (second wiring electrode 57), and the wiring electrode 58 are electrically connected and the first electrode 42 and the second electrode 44 can be led out onto the outer surface 11r of the silicon layer 11 on the side opposite to the side on which the element 20 is formed. As the material of the components, the first wiring electrode 156 (second wiring electrode 57) and the wiring electrode 58 are made of titanium (Ti), tungsten (W), copper (Cu) or the like, and the first wiring electrode 156 and second wiring electrode 57 are sputtered layers film-formed by a sputtering method, the wiring electrode 58 is a plating layer formed by plating, and the plating layer (wiring electrode 58) is stacked on the sputtered layer (second wiring electrode 57).

The sealing hole functioning as a sealing hole for airtightly sealing the internal space constituted with the cavity 7 of the lid 5 and the cavity 8 of the SOI substrate is configured to include the second sealing hole 62 penetrating the silicon layer 11 as the support substrate and the BOX layer 12 as the oxide film and the first sealing hole 60 penetrating the surface silicon layer 13 as the element substrate and communicating with the second sealing hole 62. Hereinafter, while referring also to FIGS. 11C and 11D, details of the sealing hole and the sealing structure of the sealing hole will be described.

The sealing hole is disposed at the side opposite to the side where the vibration portion 22 is provided with respect to the base portion 21 in the region of the cavity 7 of the lid 5, in plan view. The second sealing hole 62 constituting the sealing hole is disposed at a position overlapping with the first sealing hole 60 provided in the surface silicon layer 13 in plan view. The first sealing hole 60 constituting the sealing hole is provided in the silicon layer 11 and the BOX layer 12 so as to communicate with the second sealing hole 62.

The second sealing hole 62 penetrates the silicon layer 11 and the BOX layer 12 from the outer surface 11r of the silicon layer 11. A back surface portion 13r of the surface silicon layer 13 included in the communication portion between the first sealing hole 60 and the second sealing hole 62 faces the opening portion which is open to the side opposite to the outer surface 11r side by the second sealing hole 62. In plan view, the first sealing hole 60 has a substantially rectangular slit-like opening shape having a first opening width W1 in the lateral direction and an opening length L in the longitudinal direction, and penetrates the surface silicon layer 13 and penetrates so that the inner space side (the cavity 7 side) of the surface silicon layer 13 and the second sealing hole 62 communicate with each other.

As such, since the communication portion between the second sealing hole 62 penetrating the silicon layer 11 as the support substrate and the BOX layer 12 as the oxide film and the first sealing hole 60 penetrating the surface silicon layer 13 as an element substrate includes the back surface portion 13r which is the surface of the surface silicon layer 13 on the side of the silicon layer 11, it is possible to increase a surface area on which the first wiring electrode 156, which will be described later, which is a sealing film for closing the first sealing hole 60 is disposed. With this, bonding strength of the sealing film (first wiring electrode 156) can be increased and thus, sealing reliability can be improved.

As illustrated in FIG. 11D, the first sealing hole 60 has a first opening width W1 smaller than a second opening width (inner diameter) W2 of the second sealing hole 62 and is disposed at a position overlapping with the second sealing hole 62 in plan view. In the present embodiment, two slit-shaped first sealing holes 60 are provided in parallel such that two slit-shaped first sealing holes 60 face each other in the longitudinal direction. In the present embodiment, two first sealing holes 60 are provided, but is not limited thereto, and the number of the first sealing holes 60 may be one or more (one or more first sealing holes 60 may be used).

As illustrated in FIG. 11D, it is preferable that the first sealing hole 60 is positioned at the central portion of the second sealing hole 62 and is disposed in a disposition region R which has a width (inner diameter) W3 of 1/10 of the second opening width W2, in plan view. Here, the disposition region R positioned at the central portion of the second sealing hole 62 includes the center G of the second sealing hole 62, and is a region that is substantially concentric with the second sealing hole 62 around the center G. As in the second sealing hole 62, a thickness of a film formation layer (in the present embodiment, which corresponds to a sealing film, for example, first wiring electrode 156) formed on a hole bottom of the sealing hole having a large aspect ratio of a hole diameter and a hole width, for example, is said to be approximately ½ to 1/10 of the thickness of the film formation layer formed on the surface around the opening of the sealing hole.

Figure 12:
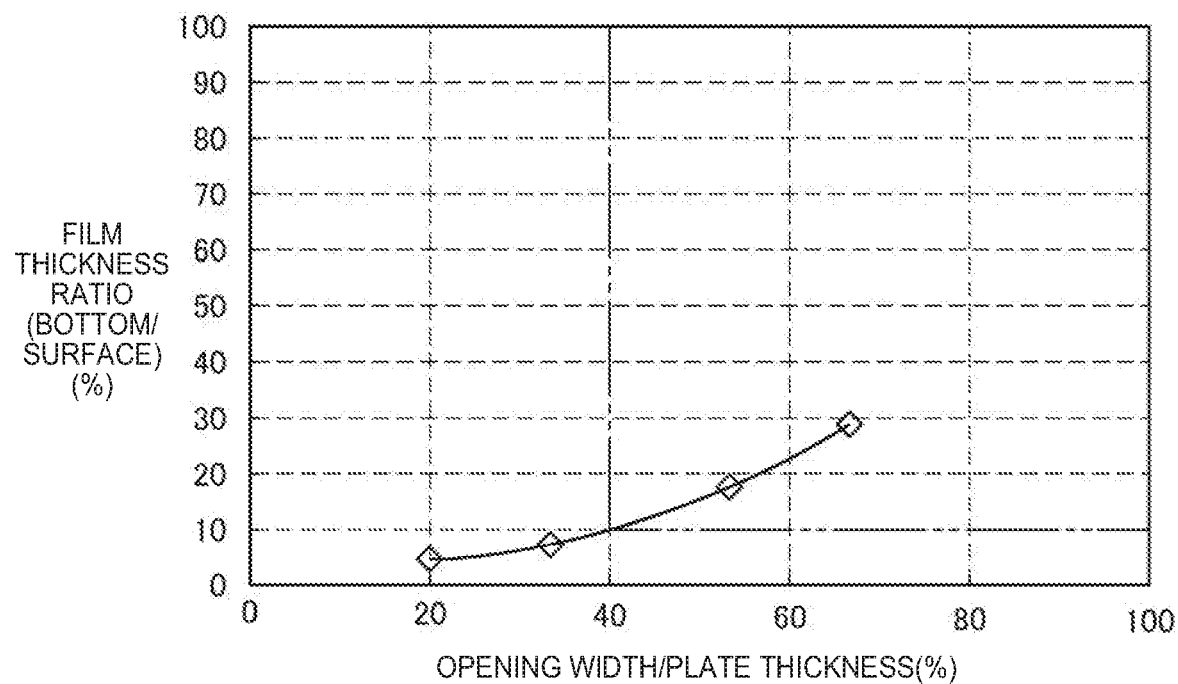
FIG. 12 is a graph illustrating correlation between a "thickness of a film formation layer" formed at the bottom of the second sealing hole and a "second opening width/depth of second sealing hole".

FIG. 12 is a graph illustrating correlation between the "thickness of film formation layer" formed on the bottom portion (back surface portion 13r as the communication portion) of the second sealing hole 62 and the "second opening width W2/depth of second sealing hole". As illustrated in FIG. 12, for example, when the ratio between a plate thickness and an opening width of the silicon layer 11 where the second sealing hole 62 is formed is 40%, it is understood that the ratio between the thickness of the film formation layer formed at the hole bottom and the thickness of the film formation layer to be formed on the surface around the opening of the sealing hole is approximately 1/10 (10%). The second sealing hole 62 is formed to penetrate through the silicon layer 11 and the BOX layer 12. Accordingly, the depth of the second sealing hole 62 is the sum of the thickness of the film formation layer formed at the bottom of the hole and the thickness of the film formation layer formed on the surface around the opening of the sealing hole, but since the thickness of the silicon layer 11 is larger than the thickness of the BOX layer 12 (100 times or more in the present example), only the thickness (plate thickness) of the silicon layer 11 was used for calculation of the ratio with the opening width.

In a case where a sealing film (first wiring electrode 156 or second wiring electrode 57) described later is formed inside the second sealing hole 62 by a sputtering method or the like, the particles of the metal material flying toward the inside of the second sealing hole 62 are easy to adhere to the central portion of the second sealing hole 62 and hard to adhere to a portion close to a wall surface due to the influence of the wall surface of the second sealing hole 62. With this, the central portion of the second sealing hole of the sealing film becomes thick. Accordingly, by disposing the first sealing hole 60 within the disposition region R, which is positioned in the central region of the second sealing hole 62 in plan view and having a width (inner diameter) W3 of 1/10 of the second opening width W2, the thickness of the sealing film that closes the first sealing hole 60 is made thicker than that of a peripheral portion such that the sealing film can be made firm, and thus it is possible to stably configure a sealing film with improved sealing properties. The peripheral portion is a portion outside the disposition R in the present example. In the drawings referred to in description of the present embodiment, in order to avoid complication of the drawing, description of the difference between the film thickness of the central portion and the film thickness of the peripheral portion is omitted.

As illustrated in FIG. 11C, the first sealing hole 60 is preferably configured to have an aspect ratio of a depth t, which is the thickness dimension of the surface silicon layer 13 to be penetrated, and the first opening width W1 to be fallen within a range of 1 or more to 100 or less.

The dimension of the depth t of the first sealing hole 60 is preferably 2 μm to 10 μm from the viewpoint of a desired thickness of the sealing structure and maintenance of performance of a functional element. In forming the first sealing hole 60, it is preferable that the dimension of the first opening width W1 of the first sealing hole 60 is 0.02 μm or more. However, when the dimension of the first opening width W1 exceeds 2 μm, there is a concern that the size of the hole is too large, stability of formation (film formation) of the sealing film constituting the sealing portion is deteriorated, and sealing reliability decreases. In other words, the sealing film (first wiring electrode 156 and second wiring electrode 57) that closes the first sealing hole 60 can be stably disposed by forming the first sealing hole 60 with the dimension of the first opening width W1 of 0.02 μm or more and 2 μm or less. From these, as described above, it is possible to obtain a sealing structure in which a desired thickness is secured and reliability of sealing is not impaired, by setting the aspect ratio of the depth t and the first opening width W1 to 1 or more and 100 or less.

It is more preferable that the first sealing hole 60 is configured to have an aspect ratio of the depth t, which is the thickness dimension of the surface silicon layer 13 to be penetrated, and the first opening width W1 to be fallen within a range of 2.5 or more to 100 or less.

As such, reliability of sealing can be secured and rigidity of the sealing structure can be further enhanced by setting the thickness of the surface silicon layer 13 which can obtain higher rigidity without changing the first opening width W1, that is, the depth t of the first sealing hole 60 to 5 μm to 10 μm and setting the aspect ratio of the depth t and the first opening width W1 to 2.5 or more and 100 or less.

Although the first opening width W1 of the first sealing hole 60 described above indicates the width (width dimension) in the lateral direction of the slit-like first sealing hole 60, in a case where the long sides facing each other are not parallel, in a case where the long sides are not straight lines, and the like, the first opening width W1 indicates the width dimension at a position where the distance between the long sides facing each other is the smallest. The opening width in a case where the first sealing hole 60 is not a slit shape, for example, a circle shape, may indicate the dimension of the diameter of the circle and alternatively, the opening width in the case of not being a perfect circle may indicate the dimension at a position where the distance between the inner peripheral edges is the smallest.

As illustrated in FIGS. 11A and 11C, the silicon oxide film 32 as a hole width adjustment layer is provided on the inner surface of the first sealing hole 60, the inner surface of the second sealing hole 62, and the back surface portion 13r of the surface silicon layer 13. A first underlying layer 56u is disposed on the inner surface (front surface) of the silicon oxide film 32. It is necessary for the first sealing hole 60 to narrow the first opening width W1 in order to facilitate film formation in the case where the sealing film (first wiring electrode 156 and second wiring electrode 57) is formed by a sputtering method or the like, but it is difficult to form a sealing hole having a narrow opening width. However, the silicon oxide film 32 as the hole width adjustment layer is provided to thereby narrow the opening width by arranging the silicon oxide film 32 after forming the first sealing hole 60 with a relatively wide opening width, such that the opening width can be a desired opening width (first opening width W1). As such, the silicon oxide film 32 is disposed such that the first opening width W1 of the first sealing hole 60 can easily be an opening width of a desired narrow width.

On the surface of a first underlying layer 56u disposed on the surface of the back surface portion 13r of the surface silicon layer 13, the inside of the first sealing hole 60, and the inside the second sealing hole 62, a first wiring electrode 156 composed of a sputtered layer is disposed as a first layer, and furthermore, on the first wiring electrode 156, a sealing film in which a second wiring electrode 57 composed of a sputtered layer is stacked as a second layer with a second underlying layer 57u described later interposed therebetween is disposed. The internal space constituted with the cavity 7 of the lid 5 and the cavity 8 formed in the SOI substrate 10 is airtightly sealed by the first wiring electrode 156 and the second wiring electrode 57 stacked on the second underlying layer 57u. That is, the sealing film includes the first wiring electrode 156 as a first layer and the second wiring electrode 57 as a second layer. In the second sealing hole 62, the wiring electrode 58 composed of a plating layer stacked in the second wiring electrode 57 is disposed.

The first wiring electrode 156 which is provided as a sealing film on the surface of the back surface portion 13r of the surface silicon layer 13 and the inner side of the first sealing hole 60 is film-formed so as to close the first sealing hole 60 of which one side opens to the back surface portion 13r of the surface silicon layer 13. Here, since the first opening width W1 of the first sealing hole 60 is configured to be narrower than the second opening width W2 of the second sealing hole 62, the opening of the first sealing hole 60 can be easily closed (sealed) by the first wiring electrode 156. In film formation of the first wiring electrode 156, since the first opening width W1 of the first sealing hole 60 is narrow, infiltration of metal, which is deposited to form the film, into the first sealing hole 60 is hindered and the first wiring electrode 156 is provided with an embedded portion 56p disposed to the middle of the first sealing hole 60. As such, since the embedded portion 56p filled with the first wiring electrode 156 is provided in a portion of the first sealing hole 60, a desired sealing effect can be easily obtained. Furthermore, since there is a portion of the first sealing hole 60 that is not filled with the first wiring electrode 156, release of stress caused by a difference in a linear expansion coefficient between the surface silicon layer 13 and the first wiring electrode 156 can be easily performed and deterioration in sealing reliability can be suppressed.

Figure 13:
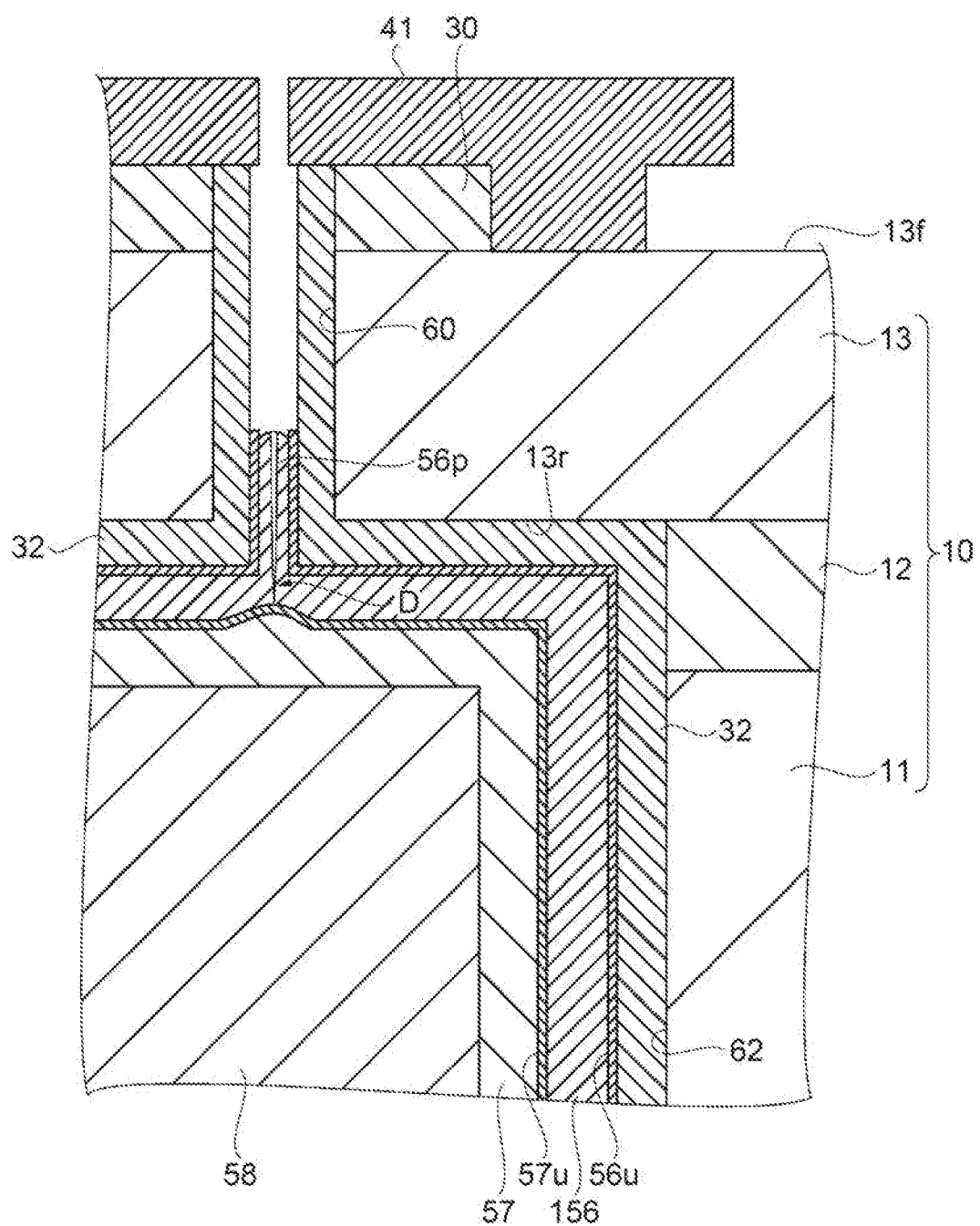
FIG. 13 is a view for explaining film defects that may occur in a sealing film and is an enlarged view corresponding to FIG. 11B.

In the present embodiment, the second wiring electrode 57 as the second layer of the sealing film is stacked on the inner side of the first wiring electrode 156 as the first layer of the sealing film. As such, two layers of the first wiring electrode 156 and the second wiring electrode 57 are provided so as to make it possible to further enhance reliability of sealing. Hereinafter, matters regarding this will be described in detail with reference to FIG. 13. FIG. 13 is a view for explaining film defects that may occur in the sealing film (first wiring electrode 156) due to the presence of the first sealing hole 60, and is an enlarged view corresponding to FIG. 11C.

As illustrated in FIG. 13, in forming the first wiring electrode 156 as the sealing film described above, the first wiring electrode 156 is film-formed so as to close the first sealing hole 60 of which one side is open to the back surface portion 13r of the surface silicon layer 13. However, in film formation of the first wiring electrode 156, usually, it is possible to form a film so as to close the first sealing hole 60 easily, but there is a concern that a defect portion D as an incomplete portion of the sealing film is generated in the first wiring electrode 156 at a position overlapping with the first sealing hole 60, due to the presence of the first sealing hole 60, depending on a specific film formation condition or the like. There is a concern that the defect portion D communicates from the internal space side of the first wiring electrode 156 to the internal space side of the second sealing hole 62. In this case, there is a concern that an air leak phenomenon occurs between the defect portion D and the internal space constituted with the cavity 7 and the cavity 8 so that desired airtight sealing cannot be performed.

In order to prevent such a defect portion D from communicating from the first sealing hole 60 to the internal space of the second sealing hole 62, it is preferable to stack the second wiring electrode 57 on the internal space side of the second sealing hole 62 of the first wiring electrode 156, which will be described in detail below. The second wiring electrode 57 provided on the inner side of the first wiring electrode 156 can be film-formed under the film formation condition different from the film formation condition of the first wiring electrode 156. That is, the film formation condition of the first wiring electrode 156 and the film formation condition of the second wiring electrode 57 can be changed.

In other words, in the case of forming the first wiring electrode 156 and the second wiring electrode 57 as the film formation layers by, for example, a vacuum evaporation method, a sputtering method, or the like, growth of crystal grain boundaries of respective the film formation layers and the like are different depending on the difference in temperature conditions and deposition environment (degree of vacuum and the like). Accordingly, in a case where layer of the first wiring electrode 156 is disposed on the first sealing hole 60 side by providing the film formation layer including the first wiring electrode 156 and the second wiring electrode 57, the defect portion D as an incomplete portion of the film formation, which may be generated in the first wiring electrode 156 by the influence of the first sealing hole 60, is canceled and is not generated by the growth difference of the crystal grain boundary of the deposition layer and the like at the second wiring electrode 57. With this, the sealing film is made to have a stacked structure of at least two layers of, for example, the first wiring electrode 156 and the second wiring electrode 57, such that it is possible to easily suppress appearance of defects of the sealing film and to further enhance sealing reliability.

The first underlying layer 56u is disposed between the first sealing hole 60 and the inner surface of the second sealing hole 62 and the first wiring electrode 156, in the present embodiment, between the silicon oxide film 32 provided on the inner surfaces of the first sealing hole 60 and the second sealing hole 62 and the first wiring electrode 156. As such, by the first underlying layer 56u is disposed so as to make it possible to enhance adhesion between the silicon oxide film 32 disposed on the first sealing hole 60, the inner surface of the second sealing hole 62, and the first wiring electrode 156 can be enhanced. That is, it is possible to enhance adhesion between the first sealing hole 60, the inner surface of the second sealing hole 62, and the first wiring electrode 156 as the first layer and improve reliability of sealing.

By providing the first underlying layer 56u having a film formation condition different from that of the first wiring electrode 156, it is possible to suppress appearance of defects in the sealing film (metal layer) which may be generated in the first wiring electrode 156, which is influenced by the first sealing hole 60 and it is possible to obtain desired sealing effect also in a configuration in which the first wiring electrode 156 having a single layer is provided as the sealing film.

The second underlying layer 57u is provided between the first wiring electrode 156 and the second wiring electrode 57. As such, it is possible to enhance adhesion between the first wiring electrode 156 and the second wiring electrode 57 by arranging the second underlying layer 57u. Along with matters described above, even in a case where defect of the sealing film (metal layer) that may occur in the first wiring electrode 156 due to the influence of the first sealing hole 60 appears, the influence on the second wiring electrode 57 can be prevented.

As the material constituting the first underlying layer 56u and the second underlying layer 57u, the first underlying layer 56u and the second underlying layer 57u are made of a metal such as titanium (Ti), tungsten (W), nickel (Ni), chromium (Cr), or an alloy such as titanium-tungsten (TiW). The first underlying layer 56u and the second underlying layer 57u can be formed by a sputtering method, an evaporation method, or the like.

As described above, according to the MEMS element 101 having the sealing structure according to the present embodiment, in the communication portion between the second sealing hole 62 and the first sealing hole 60 having the first opening width W1 narrower than the second opening width W2 of the second sealing hole 62, the opening of the first sealing hole 60 is sealed by the first wiring electrode 156, which is a sealing film disposed on the second sealing hole 62 side, or the first wiring electrode 156 and the second wiring electrode 57. As such, the opening of the first sealing hole 60 having the narrow first opening width W1 can be easily closed (sealed) by the sealing film disposed on the second sealing hole 62 side. In forming the first wiring electrode 156 as the sealing film, since the first opening width W1 is narrow, infiltration of the formed metal into the first sealing hole 60 is hindered. With this, the first wiring electrode 156 is disposed to the middle of the first sealing hole 60 (embedded portion 56p illustrated in FIG. 11C) and a portion of the first sealing hole 60 is filled with the first wiring electrode 156 and thus, a desired sealing effect can be easily obtained. Furthermore, since a portion that is not filled with the first wiring electrode 156 is present in the first sealing hole 60, it is possible to easily perform release of stress caused by a difference in the linear expansion coefficient between the surface silicon layer 13 and the first wiring electrode 156 and to reduce the influence of the stress relating to sealing, so that it is possible to suppress deterioration in sealing reliability. As such, it is possible to provide the MEMS element 101 having the sealing structure that can easily realize hermetic sealing of the internal space.

Since the second sealing hole 62 communicating with the first sealing hole 60 is provided in the silicon layer 11 and the BOX layer 12, the internal space can be sealed in a state where mechanical strength of the surface silicon layer 13 on which the element 20 is formed is increased. The internal space can be airtightly sealed after the surface silicon layer 13 and the lid 5 are bonded, and an expensive device is not required and manufacturing becomes easy.

Since the first sealing hole 60 is sealed by the same metal layer as the first wiring electrode 156, when the first wiring electrode 156 is disposed on the first wiring through-hole 52 and the second wiring through-hole 54, it is possible to close the first sealing hole 60 at the same time and seal the internal space in an airtight space, for example, a vacuum atmosphere (reduced pressure atmosphere).

In the embodiment of the present specification, although description has been made using a configuration with metal layers of two layers, as the sealing film of the first sealing hole 60, in which the first wiring electrode 156 as a first layer and the second wiring electrode 57 as a second layer are stacked, but is not limited thereto. As the sealing structure of the first sealing hole 60, a configuration in which the first sealing hole 60 is airtightly sealed only by the first wiring electrode 156 (including first underlying layer 56u) as the first layer without providing the second wiring electrode 57 as the sealing film of the first sealing hole 60 may be adopted.

Both the first underlying layer 56u and the second underlying layer 57u may not be provided, and at least one of the first underlying layer 56u and the second underlying layer 57u may be provided.

Manufacturing Method

Figure 14A:
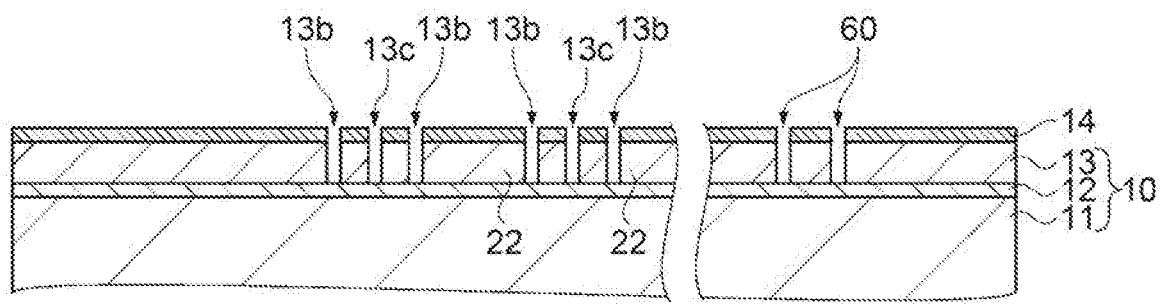
FIG. 14A is a schematic cross-sectional view corresponding to a position of the line P1-P1 in FIG. 10, which illustrates a manufacturing step of the MEMS element according to the seventh embodiment.

Next, manufacturing steps of the MEMS element 101 including the sealing structure according to the present embodiment will be described with reference to FIGS. 14A to 14R. FIGS. 14A to 14R are schematic cross-sectional views corresponding to the positions of the line P1-P1 in FIG. 10 illustrating the manufacturing steps of the MEMS element 101 according to the present embodiment. The line illustrating the background of the cross-section is omitted.

First, as a preparation step, the SOI substrate 10 on which the silicon layer 11, the BOX layer 12, and the surface silicon layer 13 are stacked in this order and a lid 5 which includes a cavity 7 are prepared (see FIG. 11A). The SOI substrate 10 may be fabricated by forming the BOX layer 12 on the silicon layer 11 and forming the surface silicon layer 13 on the BOX layer 12.

In a first step, as illustrated in FIG. 14A, in the surface silicon layer 13 of the SOI substrate 10, the trench 13b separating a region which becomes the vibration portion 22 of the element 20 from surrounding silicon other than a region which becomes the base portion 21 of the element 20, the slit 13c, and the first sealing hole 60 are formed. In this case, the slit 13c may be formed in the region separated from the vibration portion 22 of the element 20 by the trench 13b of the surface silicon layer 13 of the SOI substrate 10. By providing such a slit 13c, it is possible to facilitate release etching to be performed later of silicon around the vibration portion 22 in the region where a width of a groove 13a (see FIG. 10) is wide.

Forming of the trench 13b, the slit 13c, and the first sealing hole 60 is carried out on the surface silicon layer 13, as illustrated in FIG. 14A, in such a way that a resist 14 is applied to the surface silicon layer 13, a mask pattern is formed by a photolithography method, and the surface silicon layer 13 is etched by using the resist 14 as a mask to form the trench 13b separating the region which becomes the vibration portion 22 of the element 20 from surrounding silicon except for the region which becomes the base portion 21 of the element 20 and the first sealing hole 60. The surface of the surface silicon layer 13 of the SOI substrate 10 may be thermally oxidized to form a silicon oxide film, a mask of a silicon oxide film may be formed by a photolithography method, and the surface silicon layer 13 may be etched to form the trench 13b and the first sealing hole 60.

Figure 14B:
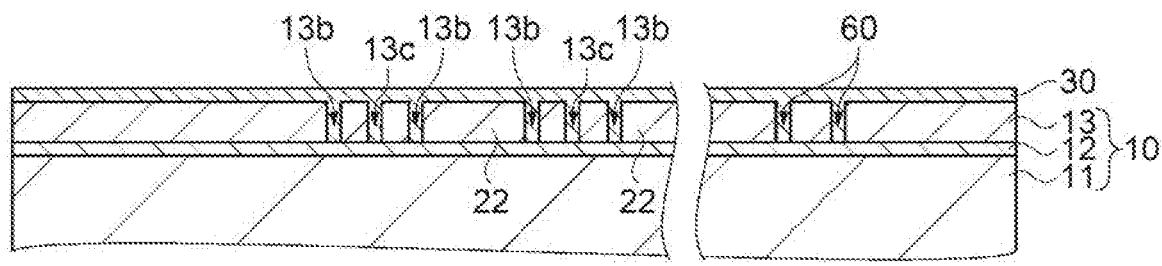
FIG. 14B is a schematic cross-sectional view corresponding to the position of the line P1-P1 in FIG. 10, which illustrates the manufacturing step of the MEMS element according to the seventh embodiment.

In a second step, as illustrated in FIG. 14B, on the upper surface of the surface silicon layer 13, the side wall in the trench 13b, the side wall in the slit 13c, and the side wall in the first sealing hole 60, the element adjustment layer 30 which is a silicon oxide film is formed. For example, an oxide film (silicon oxide film) is formed on the upper surface of the surface silicon layer 13, the side wall in the trench 13b, the side wall in the slit 13c, and the side wall in the first sealing hole 60 by thermally oxidizing the surface silicon layer 13 of the SOI substrate 10. The thickness of thermal oxide film is, for example, approximately 0.3 μm to 1.2 μm, and the thickness may be adjusted according to desired temperature characteristics. This thermal oxide film serves as a protective wall for protecting the vibration portion 22 and the piezoelectric driver 40 from release etching of silicon around the vibration portion 22 to be performed later.

Next, a silicon oxide film filling the trenches 13b, the slits 13c, and the first sealing holes 60 of the surface silicon layer 13 is formed by a chemical vapor deposition (CVD) method. In this case, even if "corrosion" occurs in the silicon oxide film within the trench 13b, the slit 13c, and the first sealing hole 60, there is no problem because thermal oxide film is strong. Since the trenches 13b, the slits 13c, and the first sealing holes 60 of the surface silicon layer 13 formed by processing are filled with the silicon oxide film and the surface becomes almost flat, it is possible to eliminate adverse influence due to step difference to the subsequent photolithography step.

Accordingly, a thermal oxide film formed by thermally oxidizing the surface silicon layer 13 and a silicon oxide film formed by the CVD method become the element adjustment layer 30 illustrated in FIG. 11A. In the second step, the element adjustment layer 30 may be formed only of a thermal oxide film depending on the degree of flatness. Alternately, a silicon oxide film may be formed by a thermal CVD method without forming a thermal oxide film and otherwise, a silicon oxide film may be formed by a two-step CVD method such as a thermal CVD method and a plasma CVD method.

Figure 14C:
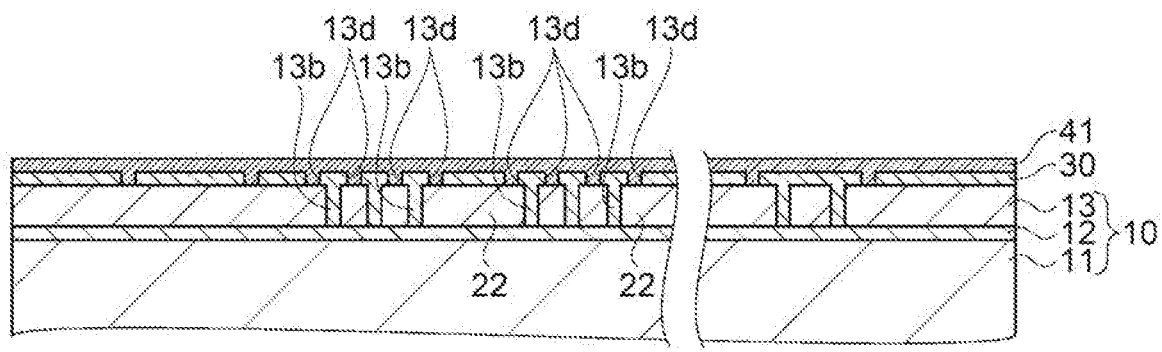
FIG. 14C is a schematic cross-sectional view corresponding to the position of the line P1-P1 in FIG. 10, which illustrates the manufacturing step of the MEMS element according to the seventh embodiment.

In a third step, a resist is applied on the element adjustment layer 30, a mask pattern for protecting a predetermined region such as the element 20 including the first sealing hole 60 and the vibration portion 22 is formed by a photolithography method, and the element adjustment layer 30 is etched using the resist as a mask to form a trench 13d reaching the surface silicon layer 13. Thereafter, as illustrated in FIG. 14C, a polysilicon film 41 covering the upper surface of the element adjustment layer 30 and sidewalls of the trench 13d is formed by the CVD method.

Figure 14D:
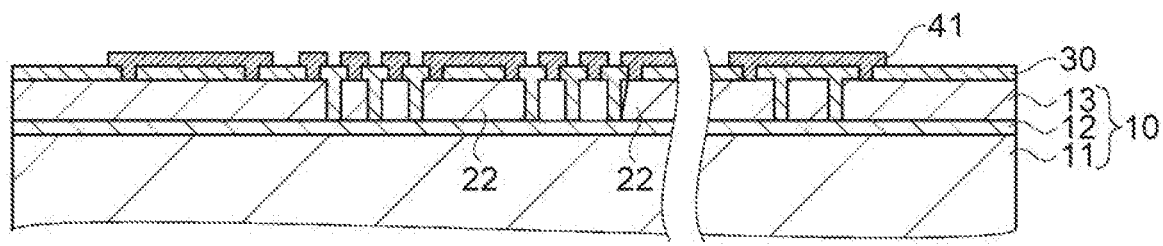
FIG. 14D is a schematic cross-sectional view corresponding to the position of the line P1-P1 in FIG. 10, which illustrates the manufacturing step of the MEMS element according to the seventh embodiment.

In a fourth step, a resist is applied on the polysilicon film 41, a mask pattern is formed by a photolithography method, and the polysilicon film 41 is etched using the resist as a mask. With this, as illustrated in FIG. 14D, the polysilicon film 41 is formed in a region including side surfaces of the element adjustment layer 30 formed in a predetermined region of the element 20 including the vibration portion 22.

The polysilicon film 41 covers the element adjustment layer 30 with the element 20, and the thickness of the polysilicon film 41 is, for example, approximately 0.2 Since an embedding property of the polysilicon film 41 by the CVD method is good, the wall of the strong polysilicon film 41 which protects the element adjustment layer 30 from release etching, which is to be performed later, of the silicon oxide film around the vibration portion 22 and the piezoelectric driver 40 can be formed with a small thickness.

Figure 14E:
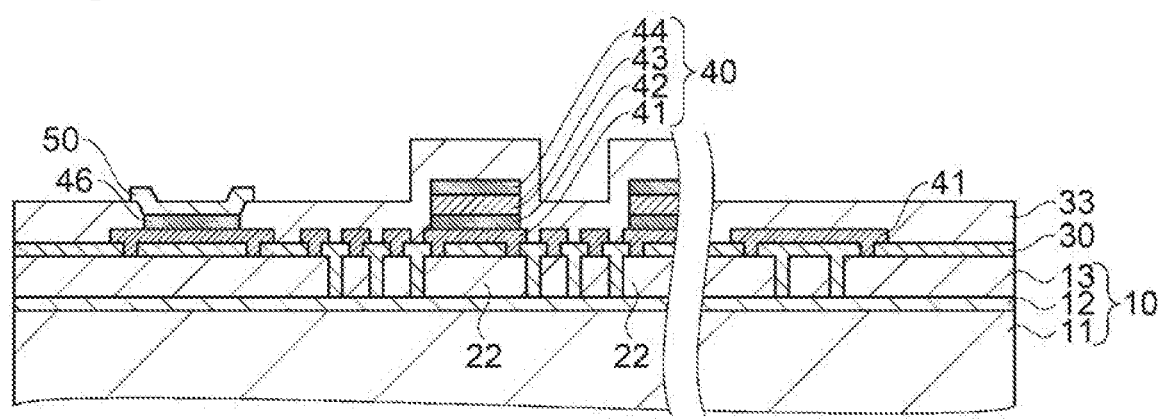
FIG. 14E is a schematic cross-sectional view corresponding to the position of the line P1-P1 in FIG. 10, which illustrates the manufacturing step of the MEMS element according to the seventh embodiment.

In a fifth step, as illustrated in FIG. 14E, the first electrode 42, the piezoelectric layer 43, and the second electrode 44 are formed in this order on the polysilicon film 41, which is formed in a predetermined region of the element 20, by a photolithography method. The polysilicon film 41 to the second electrode 44 constitute the piezoelectric driver 40. When the first electrode 42 and the second electrode 44 are formed, the wiring 46 for connecting the first electrode 42 and the electrode pad 50 and the wiring 46 for connecting the second electrode 44 and the electrode pad 50 are formed at the same time.

Figure 14F:
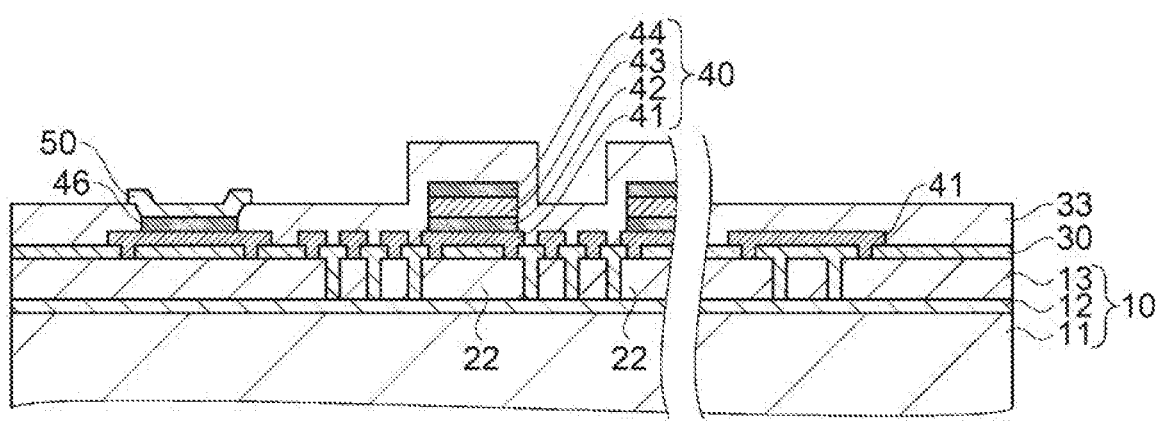
FIG. 14F is a schematic cross-sectional view corresponding to the position of the line P1-P1 in FIG. 10, which illustrates the manufacturing step of the MEMS element according to the seventh embodiment.

In a sixth step, a silicon oxide film 33 is formed on the SOI substrate 10, on which the piezoelectric driver 40 is formed, by the CVD method. Thereafter, as illustrated in FIG. 14F, a mask pattern in which a position where the electrode pad 50 is to be formed is open is formed by a photolithography method and aluminum (Al), copper (Cu) or the like is deposited to form a film on the position where the electrode pad 50 is formed by a sputtering method by using the silicon oxide film 33 as a mask to form the electrode pad 50.

Figure 14G:
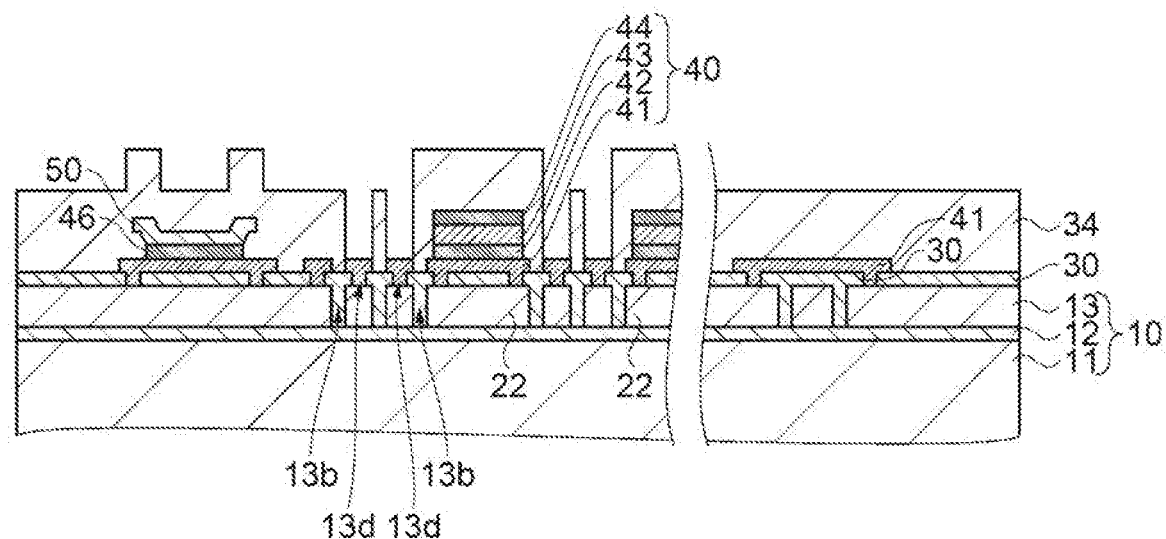
FIG. 14G is a schematic cross-sectional view corresponding to the position of the line P1-P1 in FIG. 10, which illustrates the manufacturing step of the MEMS element according to the seventh embodiment.

In a seventh step, as illustrated in FIG. 14G, a silicon oxide film is formed on the SOI substrate 10 on which the electrode pad 50 and the silicon oxide film 33 are formed by the CVD method so as to forma silicon oxide film 34 including the silicon oxide film 33. Thereafter, a resist is applied to the silicon oxide film 34, a mask pattern is formed by a photolithography method, and the silicon oxide film 34 is etched by using the resist as a mask. With this, the silicon oxide film 34 which reaches the surface silicon layer 13 and of which a predetermined region corresponding to the trench 13d is open is formed.

Figure 14H:
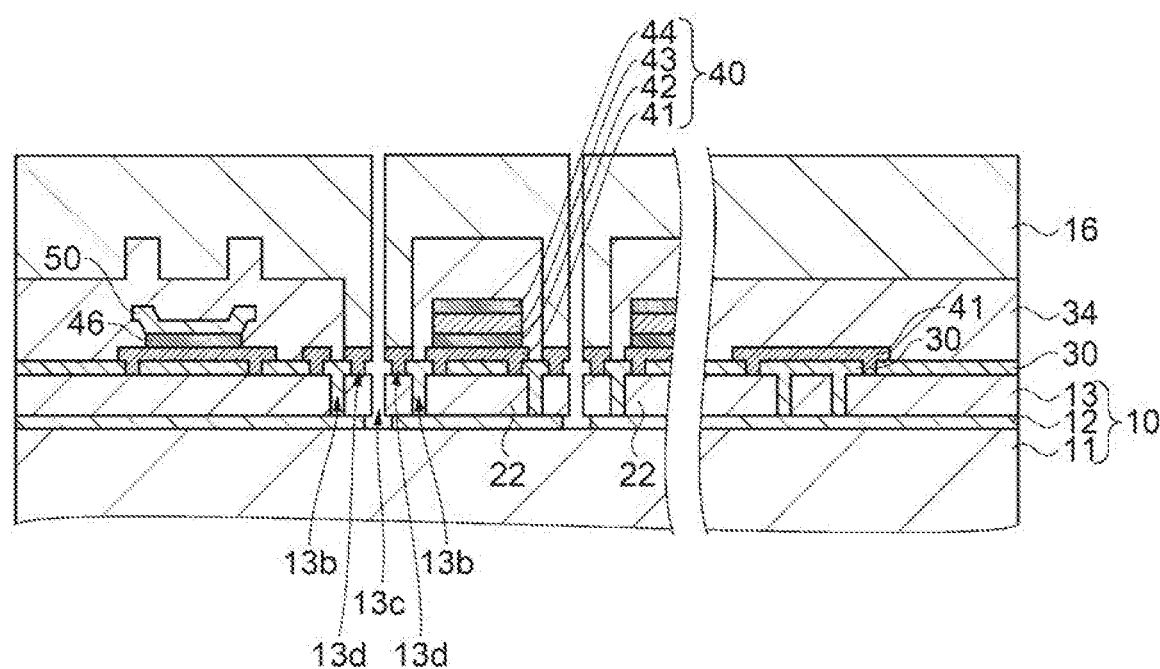
FIG. 14H is a schematic cross-sectional view corresponding to the position of the line P1-P1 in FIG. 10, which illustrates the manufacturing step of the MEMS element according to the seventh embodiment.

In an eighth step, as illustrated in FIG. 14H, a resist 16 is applied to the silicon oxide film 34, a mask pattern is formed by a photolithography method, and the silicon oxide film 34, the element adjustment layer 30, and the BOX layer 12 corresponding to the slit 13c are etched in this order by using the resist 16 as a mask. With this, an opening having a depth that reaches the silicon layer 11 in a shape surrounding the periphery of the vibration portion 22 is formed while leaving the silicon oxide film 34 for protecting the vibration portion 22, the piezoelectric driver 40 and the electrode pad 50, and the element adjustment layer 30. In this case, the trench 13d facing the surface silicon layer 13 and the polysilicon film 41 formed on the trench 13d have a function as a second protective film for protecting the vibration portion 22, the piezoelectric driver 40, and the like from etching using etching solution.

Figure 14I:
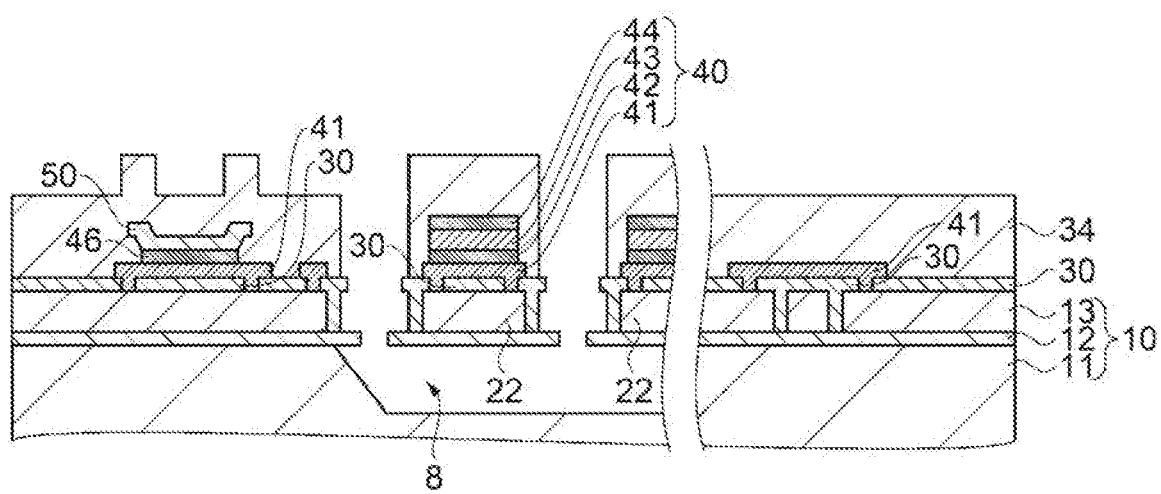
FIG. 14I is a schematic cross-sectional view corresponding to the position of the line P1-P1 in FIG. 10, which illustrates the manufacturing step of the MEMS element according to the seventh embodiment.

In a ninth step, as illustrated in FIG. 14I, after the resist 16 is peeled off, silicon around the vibration portion 22 is etched (release etching) through the opening of the silicon oxide film 34, the element adjustment layer 30, the surface silicon layer 13, and the BOX layer 12. In this case, a portion of silicon in the silicon layer 11 is etched to form a cavity 8 in the silicon layer 11 below the vibration portion 22. In the ninth step, wet etching is performed and tetramethylammonium hydroxide (TMAH), for example, is used as etching solution.

Figure 14J:
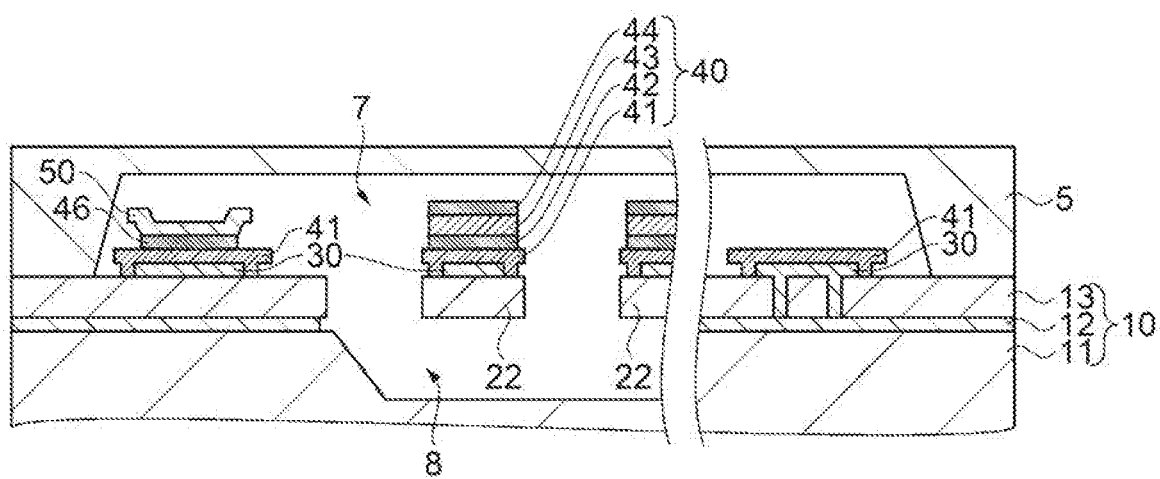
FIG. 14J is a schematic cross-sectional view corresponding to the position of the line P1-P1 in FIG. 10, which illustrates the manufacturing step of the MEMS element according to the seventh embodiment.

In a tenth step, as illustrated in FIG. 14J, the silicon oxide film 34 formed around each of the vibration portion 22, the piezoelectric driver 40, the electrode pad 50, and the first sealing hole 60, the element adjustment layer 30 and the BOX layer 12 are etched (release etching). With this, the element adjustment layer 30 is left on the vibration portion 22. In the tenth step, wet etching is performed and buffered hydrofluoric acid (BHF), for example, is used as the etching liquid. Thereafter, the surface having the cavity 7 of the lid 5 is disposed on the surface (upper surface of the surface silicon layer 13), on which the element 20 of the SOI substrate 10 is formed, and bonded. As a bonding method, direct bonding performed by activating a bonding surface, a method using a bonding member such as low-melting point glass, anodic bonding, or the like may be used.

Figure 14K:
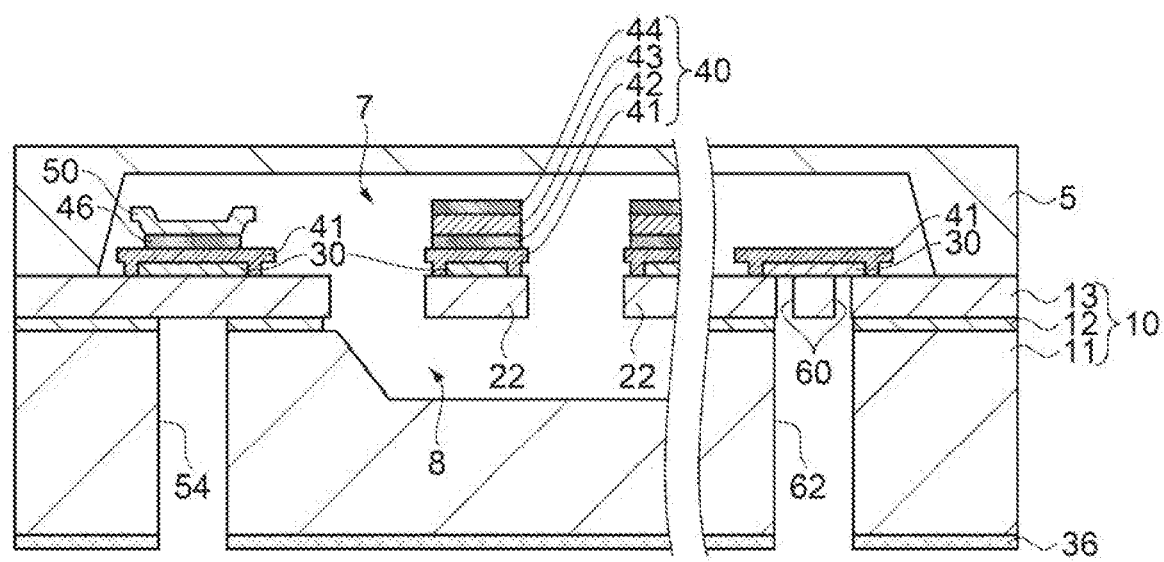
FIG. 14K is a schematic cross-sectional view corresponding to the position of the line P1-P1 in FIG. 10, which illustrates the manufacturing step of the MEMS element according to the seventh embodiment.

In an eleventh step, as illustrated in FIG. 14K, the second wiring through-hole 54 and the second sealing hole 62 are formed in the silicon layer 11 and the BOX layer 12 of the SOI substrate 10. Forming of the second wiring through-hole 54 and the second sealing hole 62 is carried out in such a way that in the SOI substrate 10, the silicon oxide film 36 is formed thermally oxidizing the surface of the silicon layer 11 opposite to the side on which the BOX layer 12 is disposed, a mask of the silicon oxide film 36 is formed by a photolithography method, and the silicon layer 11 and the BOX layer 12 are etched. A mask for etching is not limited thereto and the mask may be formed using a resist film.

Figure 14L:
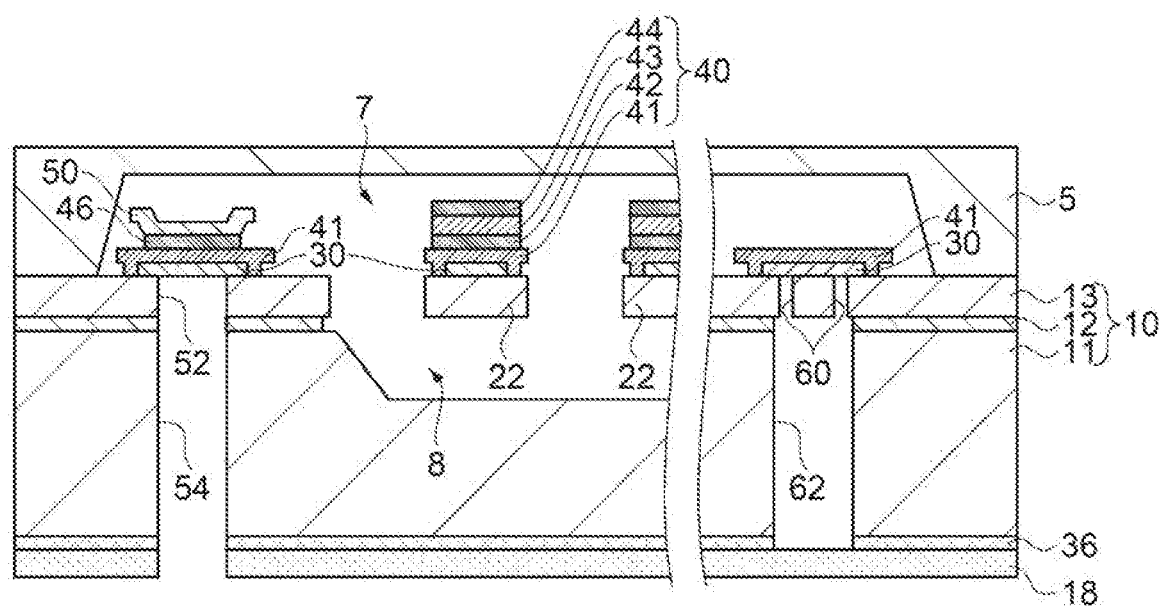
FIG. 14L is a schematic cross-sectional view corresponding to the position of the line P1-P1 in FIG. 10, which illustrates the manufacturing step of the MEMS element according to the seventh embodiment.

In a twelfth step, as illustrated in FIG. 14L, a film resist 18 is adhered to the silicon oxide film 36 so as to cover the second wiring through-hole 54 and the second sealing hole 62, and a pattern that opens the second wiring through-hole 54 is formed by a photolithography method, and the surface silicon layer 13 is etched, thereby forming the first wiring through-hole 52.

Figure 14M:
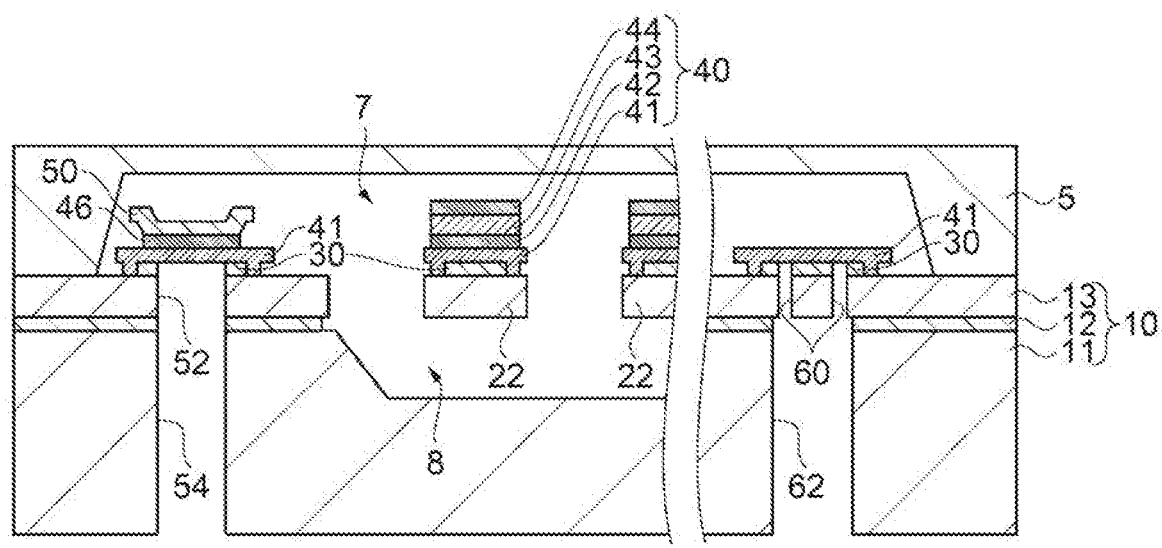
FIG. 14M is a schematic cross-sectional view corresponding to the position of the line P1-P1 in FIG. 10, which illustrates the manufacturing step of the MEMS element according to the seventh embodiment.

In a thirteenth step, as illustrated in FIG. 14M, after the film resist 18 and the silicon oxide film 36 are removed, the element adjustment layer 30 exposed to the first wiring through-hole 52 and the first sealing hole 60 is etched.

As described above, in a case where a mask is formed using a resist film instead of the silicon oxide film 36, the film resist 18 is adhered to the resist film mask in the twelfth step and the film resist 18 and the resist film mask are removed in the thirteenth step.

Figure 14N:
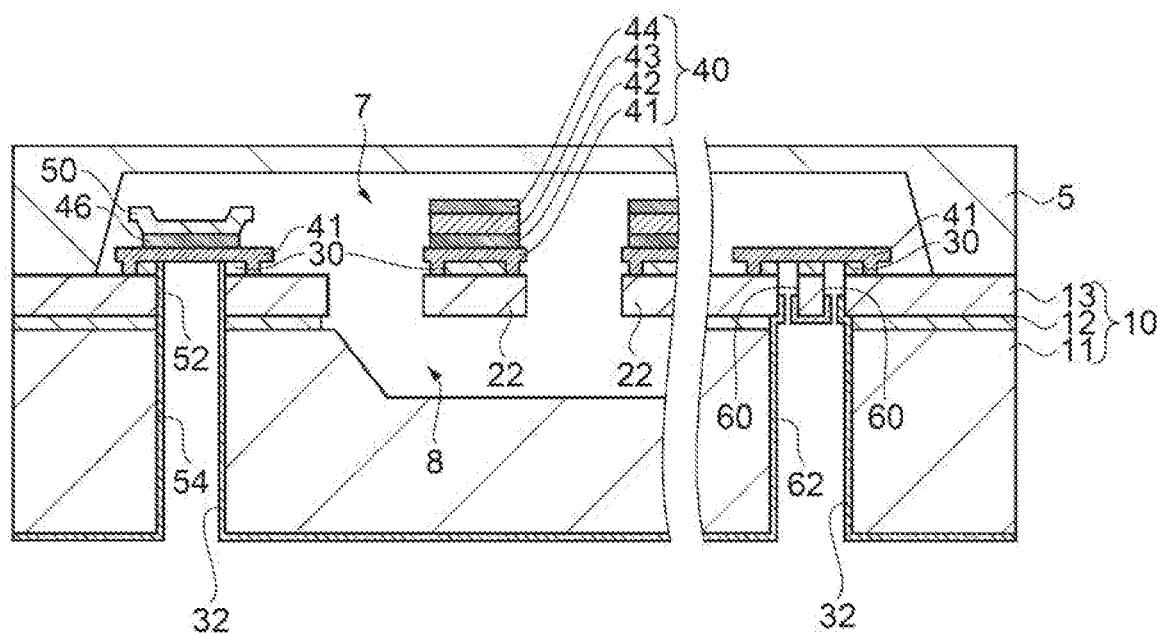
FIG. 14N is a schematic cross-sectional view corresponding to the position of the line P1-P1 in FIG. 10, which illustrates the manufacturing step of the MEMS element according to the seventh embodiment.

In a fourteenth step, as illustrated in FIG. 14N, the silicon oxide film 32 is formed on the surface of the silicon layer 11 opposite to the side on which the BOX layer 12 is disposed and the side walls in the first wiring through-hole 52, the second wiring through-hole 54, the first sealing hole 60, and the second sealing hole 62, by the CVD method. Thereafter, the silicon oxide film 32 formed on the polysilicon film 41 of the first wiring through-hole 52 and the first sealing hole 60 is removed by anisotropic dry etching such as reactive ion etching (RIE).

Figure 14O:
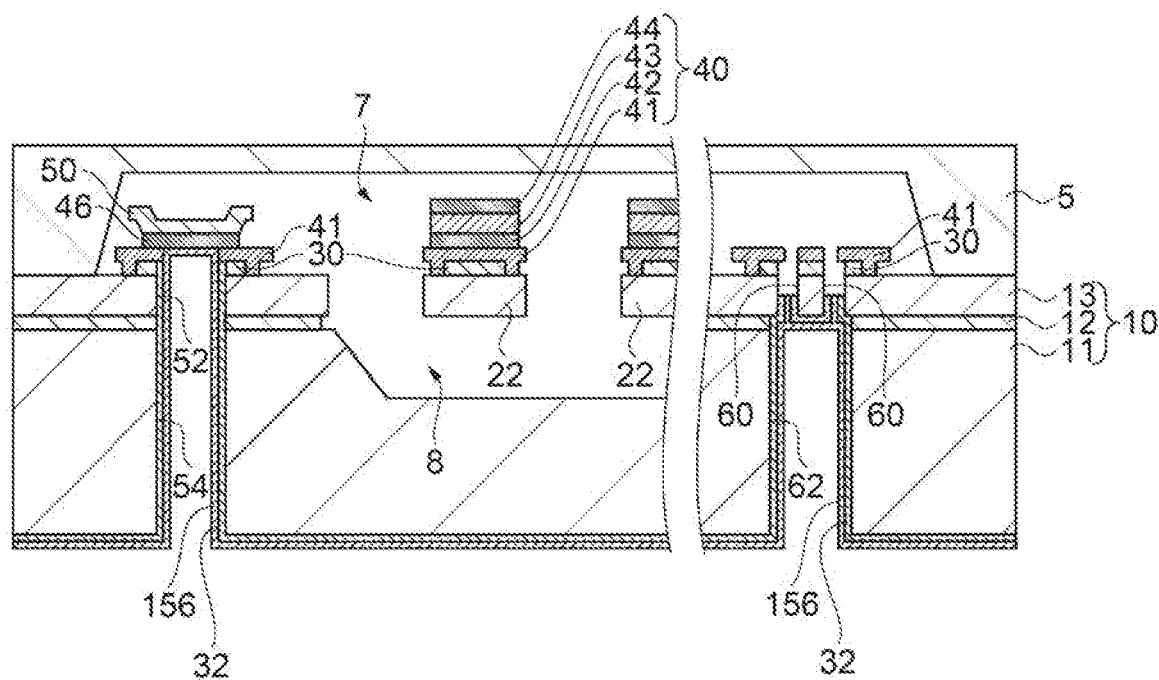
FIG. 14O is a schematic cross-sectional view corresponding to the position of the line P1-P1 in FIG. 10, which illustrates the manufacturing step of the MEMS element according to the seventh embodiment.

In a fifteenth step, as illustrated in FIG. 14O, in a vacuum (reduced pressure) atmosphere in a pre-processing chamber of a sputtering apparatus or the like, the polysilicon film 41 exposed to the first wiring through-hole 52 and the first sealing hole 60 is etched. With this, the polysilicon film 41 on the first wiring through-hole 52 is removed, and the wiring 46 is exposed to the first wiring through-hole 52. The polysilicon film 41 on the first sealing hole 60 is removed and a sealing hole is created in the polysilicon film 41 on the first sealing hole 60.

Thereafter, pressure in the internal space constituted with the cavities 7 and 8 is set to the same pressure as that of the pre-processing chamber and a metal layer of titanium (Ti), tungsten (W), nickel (Ni), chromium (Cr), titanium-tungsten (TiW) or the like which becomes the first underlying layer 56u (not illustrated in FIG. 14O, see FIGS. 11B and 11C) and a metal layer of titanium (Ti), tungsten (W), copper (Cu) or the like which becomes the first wiring electrode 156 are sputtered by continuous processing.

Figure 14P:
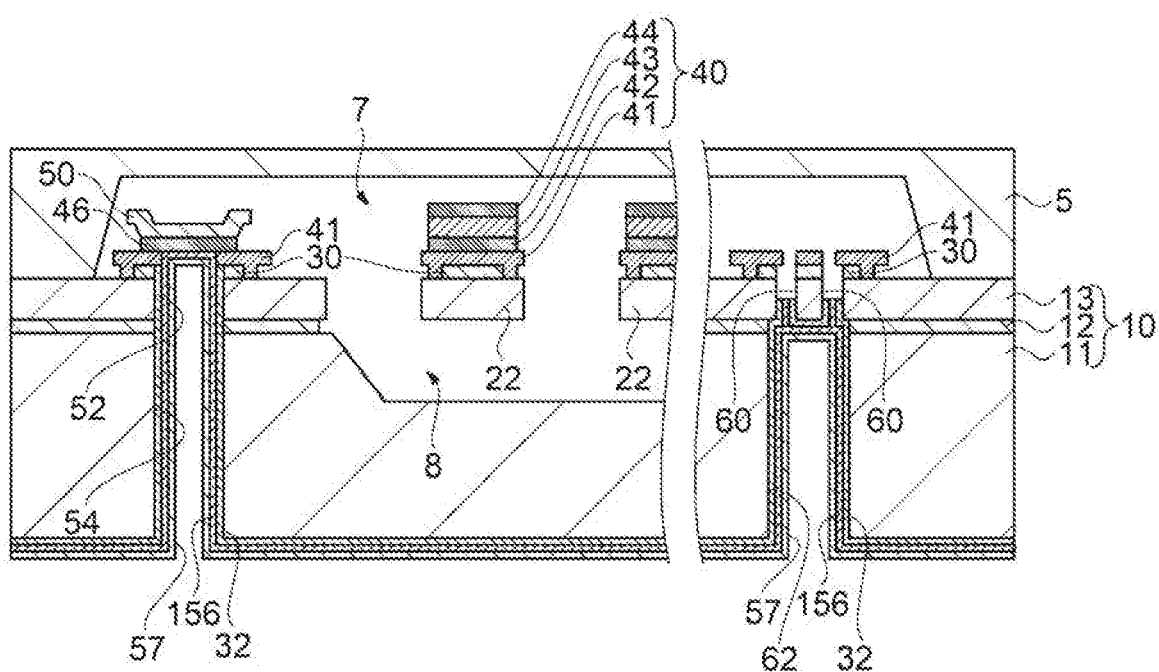
FIG. 14P is a schematic cross-sectional view corresponding to the position of the line P1-P1 in FIG. 10, which illustrates the manufacturing step of the MEMS element according to the seventh embodiment.

In a sixteenth step, as illustrated in FIG. 14P, pressure in the internal space constituted with the cavities 7 and 8 is set to the same pressure as that of the pre-processing chamber and a metal layer of titanium (Ti), tungsten (W), nickel (Ni), chromium (Cr), titanium-tungsten (TiW) or the like which becomes the second underlying layer 57u (not illustrated in FIG. 14P, see FIGS. 11B and 11C) and a metal layer of titanium (Ti), tungsten (W), copper (Cu) or the like which becomes the second wiring electrode 57 are sputtered onto the surface of the first wiring electrode 156 by continuous processing.

According to the fifteenth and sixteenth steps, the wiring electrode including the first wiring electrode 156 connected to the first electrode 42 and the second electrode 44 and the second wiring electrode 57 can be formed on the outer surface 11r of the silicon layer 11 on the side opposite to the side where the element 20 is formed. Also, in the fifteenth and sixteenth steps, since the first wiring electrode 156 and the second wiring electrode 57 close the first sealing hole 60, the internal space constituted with the cavities 7 and 8 in which the element 20 is formed can be sealed in a vacuum atmosphere (reduced-pressure atmosphere). Accordingly, the step of forming the first wiring electrode 156 and the second wiring electrode 57 in the first wiring through-hole 52 and the second wiring through-hole 54 and the step of closing the first sealing hole 60 with the first wiring electrode 156 and the second wiring electrode 57 and airtightly sealing the internal space can be performed at the same time.

Figure 14Q:
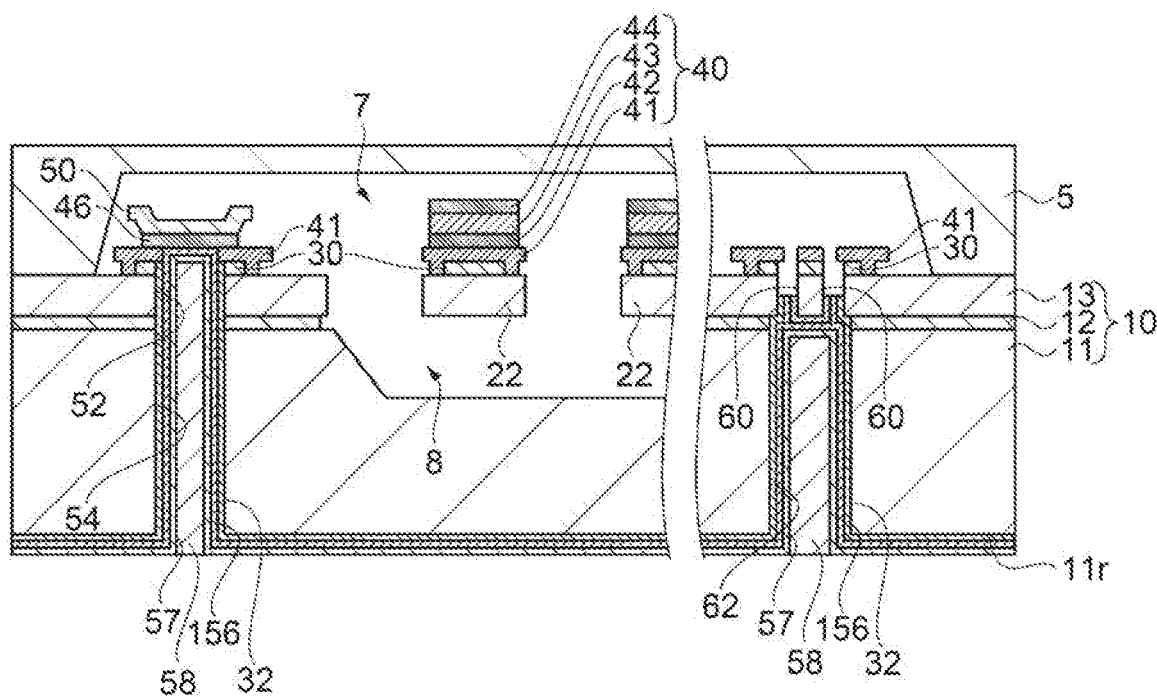
FIG. 14Q is a schematic cross-sectional view corresponding to the position of the line P1-P1 in FIG. 10, which illustrates the manufacturing step of the MEMS element according to the seventh embodiment.
Figure 14R:
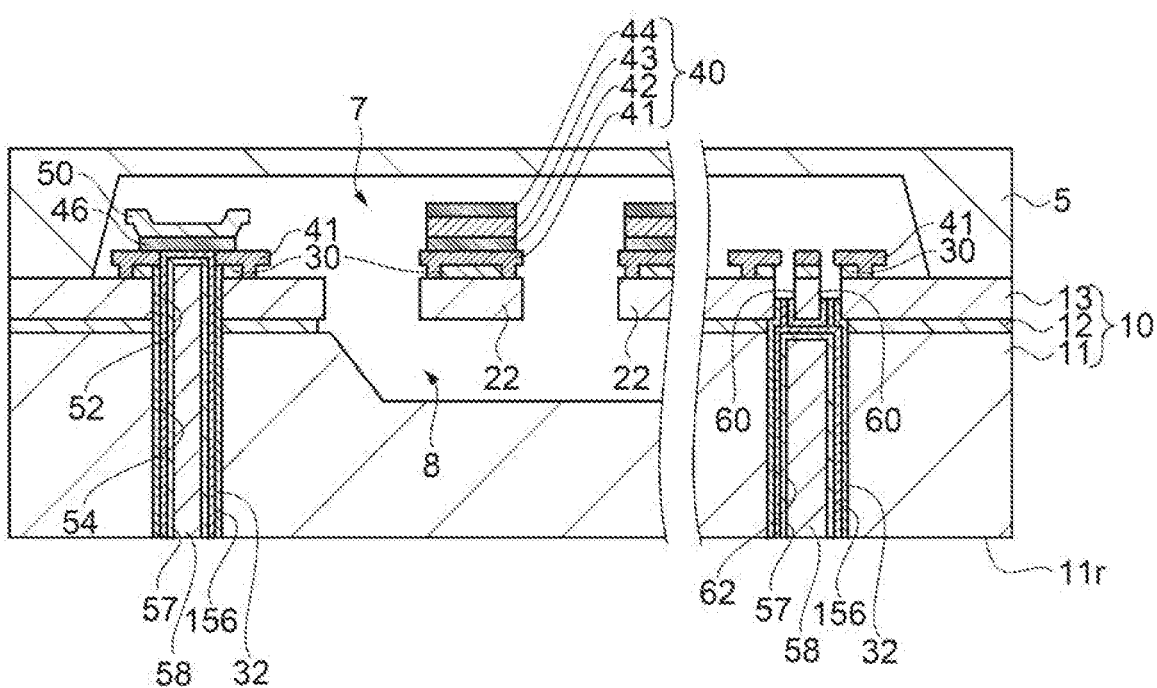
FIG. 14R is a schematic cross-sectional view corresponding to the position of the line P1-P1 in FIG. 10, which illustrates the manufacturing step of the MEMS element according to the seventh embodiment.

In a seventeenth step, as illustrated in FIG. 14Q, a metal layer equivalent to the metal layer used for the second wiring electrode 57 is stacked on the surface of the second wiring electrode 57 by a plating method or the like to create the wiring electrode 58. By completely covering the first wiring through-hole 52, the second wiring through-hole 54, and the second sealing hole 62, airtight sealing property, conductivity, and mechanical strength are improved and reliability is improved. It can be said that the first wiring electrode 156 and the second wiring electrode 57 are sputtered layers and the wiring electrode 58 is a plating layer.

In an eighteenth step, as illustrated in FIG. 14R, the MEMS element 101 which includes a sealing structure having improved airtight sealing property and has excellent reliability is completed by performing planarization processing on the surface of the SOI substrate 10 at a side opposite to the surface to which the lid 5 is bonded by a polishing apparatus or the like.

In the description of the manufacturing method described above, the step of providing two film formation layers of the first wiring electrode 156 (including the first underlying layer 56u) and the second wiring electrode 57 (including the second underlying layer 57u) has been described by way of example, but is not limited thereto. There may be one film formation layer, in that case, the sixteenth step described above becomes unnecessary, and the first wiring electrode 156 (first underlying layer 56u) is formed as the film formation layer in the fifteenth step described above, and thereafter, the processing sequence may proceed to the seventeenth step described above.

Eighth Embodiment

MEMS Element

Figure 15:
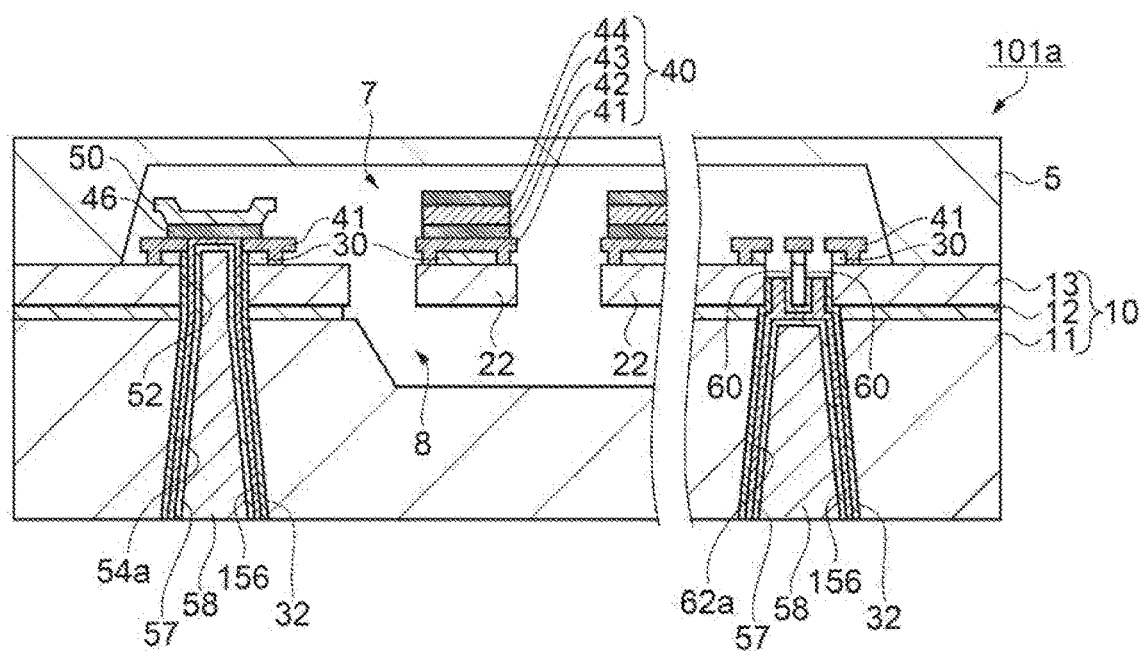
FIG. 15 is a schematic cross-sectional view corresponding to the position of the line P1-P1 in FIG. 10, which illustrates a manufacturing step of a MEMS element according to an eighth embodiment.

Next, a MEMS element 101a according to an eighth embodiment will be described with reference to FIG. 15. FIG. 15 is a schematic cross-sectional view corresponding to the position of the line P1-P1 in FIG. 10 illustrating manufacturing steps of the MEMS element 101a according to an eighth embodiment. Description will be mainly made on differences from the embodiment described above, and the same reference numerals are given to similar configurations, and description of similar matters will be omitted.

The MEMS element 101a according to the eighth embodiment differs from the MEMS element 101 as an example of the electronic device according to the seventh embodiment in structures of the second wiring through-hole 54a and the second sealing hole 62a.

As illustrated in FIG. 15, in the MEMS element 101a of the present embodiment, the second wiring through-hole 54a and the second sealing hole 62a disposed in the silicon layer 11 and the BOX layer 12 have a tapered portion tapered portion that expands toward a surface that faces another surface on which the surface silicon layer 13 of the silicon layer 11 and the BOX layer 12 is supported. In the present embodiment, the tapered portion is provided in the silicon layer 11 and the BOX layer 12, but may be provided only in the silicon layer 11. The tapered portion may be provided from the middle of the silicon layer 11.

As described above, according to the MEMS element 101a of the present embodiment, since the second wiring through-hole 54a has the tapered portion that expands toward the surface facing the surface silicon layer 13, the first wiring electrode 156 and the second wiring electrode 57 can be easily disposed on the wiring 46 connected to the first wiring through-hole 52 and the electrode pad 50. Since the second sealing hole 62a has a similar tapered portion, it becomes easier for the wiring electrode 156 which becomes the sealing film to reach the first sealing hole 60 and becomes easy to seal the first sealing hole 60.

In the MEMS element 101a according to the present embodiment, although a configuration in which the second wiring electrode 57 is provided, as a sealing film disposed on the second wiring through-hole 54a and the second sealing hole 62a, in addition to the first wiring electrode 156, similarly as in the seventh embodiment described above, is adopted, only the first wiring electrode 156 may be provided. A configuration in which at least one of the first underlying layer 56u and the second underlying layer 57u is provided can be adopted.

Electronic Apparatus

Next, an electronic apparatus to which the MEMS elements 1, 1a, 1b, 1c, 1d, 1e, 101, and 101a according to the embodiments are applied will be described with reference to FIGS. 16, 17, and 18. In the following description, a configuration to which the MEMS element 1 is applied will be described by way of example.

Figure 16:
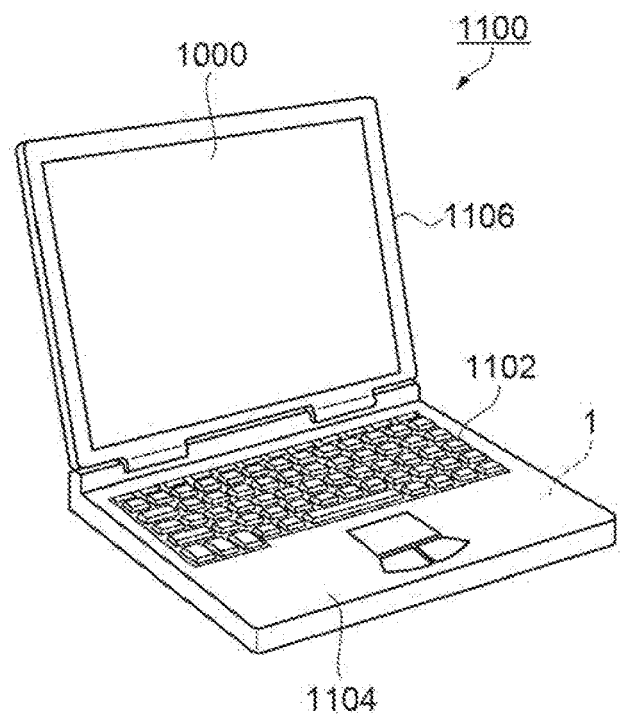
FIG. 16 is a perspective view illustrating a configuration of a mobile type (or notebook type) personal computer as an electronic apparatus including a MEMS element.

FIG. 16 is a perspective view illustrating a configuration of a mobile type (or notebook type) personal computer as an electronic apparatus including a MEMS element 1 according to the embodiment. In FIG. 16, a personal computer 1100 is constituted with a main body 1104 provided with a keyboard 1102 and a display unit 1106 provided with a display 1000, and the display unit 1106 is rotatably supported relative to the main body 1104 via a hinge structure portion. In such a personal computer 1100, the MEMS element 1 functioning as a reference clock or the like is built in such a personal computer 1100.

Figure 17:
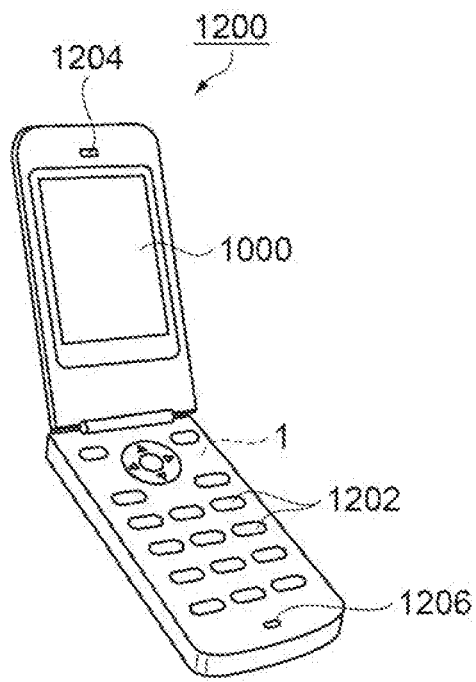
FIG. 17 is a perspective view illustrating a configuration of a mobile phone as an electronic apparatus including the MEMS element.

FIG. 17 is a perspective view illustrating an outline of a configuration of a mobile phone (including a personal handy-phone system (PHS) and a smartphone) as an electronic apparatus including the MEMS element 1 according to the embodiment. In FIG. 17, a mobile phone 1200 is provided with a plurality of operation buttons 1202, an earpiece 1204, and a mouthpiece 1206, and a display 1000 is disposed between the operation button 1202 and the earpiece 1204. The MEMS element 1 functioning as a reference clock or the like is built in such a mobile phone 1200.

Figure 18:
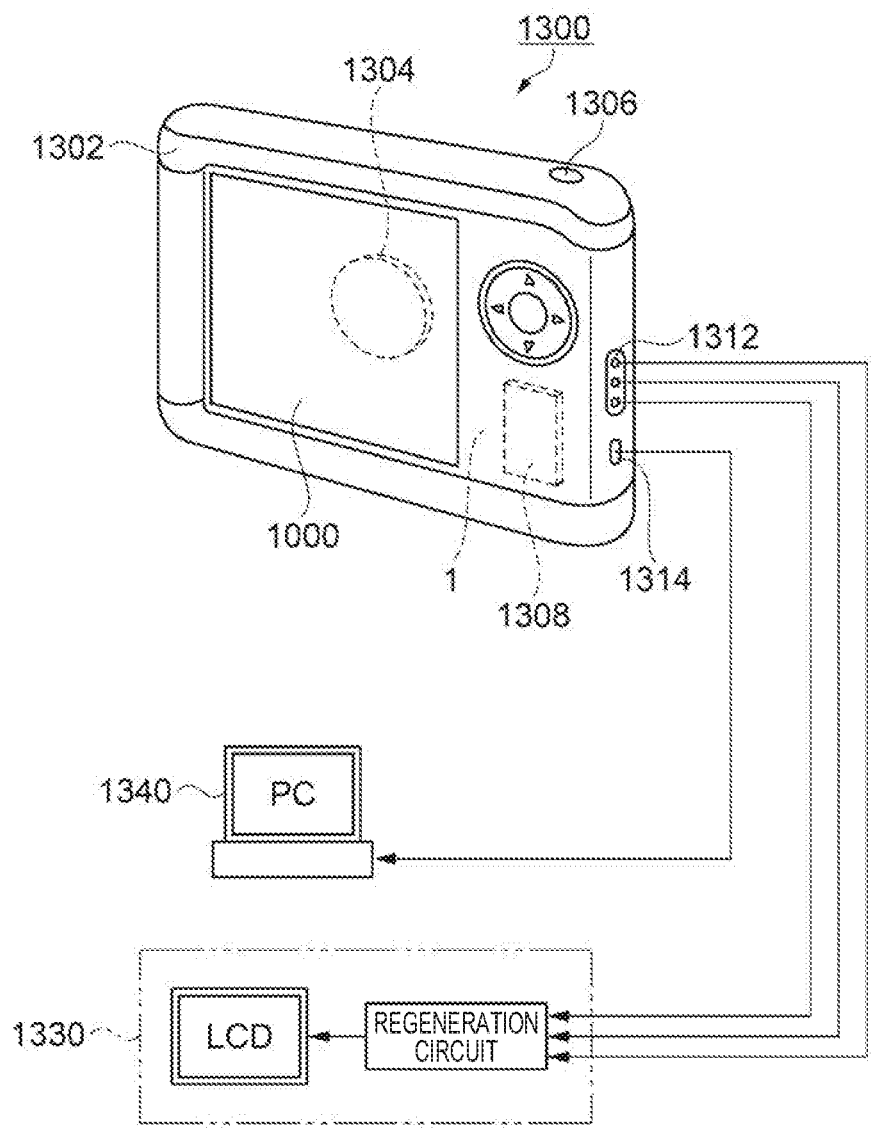
FIG. 18 is a perspective view illustrating a configuration of a digital camera as an electronic apparatus including the MEMS element.

FIG. 18 is a perspective view illustrating an outline of a configuration of a digital still camera as an electronic apparatus provided with the MEMS element 1 according to the embodiment. In FIG. 18, connection with an external device is also illustrated briefly. A digital still camera 1300 photo-electrically converts an optical image of a subject by an image-capturing element such as a charge coupled device (CCD) to generate a captured image signal (image signal).

A configuration in which a display 1000 is provided and display is performed based on the image signals captured by the CCD is adopted on the rear surface of a case (body) 1302 of the digital still camera 1300, and the display 1000 functions as a viewfinder for displaying the subject as an electronic image. A light receiving unit 1304 including an optical lens (image-capturing optical system), the CCD or the like is provided on the front side (rear side in the figure) of the case 1302.

When a photographer confirms a subject image displayed on the display 1000 and presses a shutter button 1306, the captured image signal of the CCD at that time is transferred to the memory 1308 to be stored. In the digital still camera 1300, a video signal output terminal 1312 and an input and output terminal 1314 for data communication are provided on a side surface of the case 1302. As illustrated in the figure, a television monitor 1330 is connected to the video signal output terminal 1312 and a personal computer 1340 is connected to the input and output terminal 1314 for data communication, as necessary. Furthermore, it is configured in such away that the captured image signal stored in a memory 1308 is output to the television monitor 1330 or the personal computer 1340 by a predetermined operation. The MEMS element 1 functioning as a reference clock or the like is built in such a digital still camera 1300.

As described above, it is possible to provide a high-performance electronic apparatus by using the MEMS element 1 having excellent reliability at low cost in an electronic apparatus.

The MEMS element 1 according to the embodiment can be applied to an electronic apparatus, for example, an inkjet type ejection apparatus (for example, an ink jet printer), a laptop type personal computer, a television, a video camera, a car navigation apparatus, a pager, an electronic notebook (including communication function), an electronic dictionary, a calculator, an electronic gaming machine, a workstation, a video phone, a television monitor for security, an electronic binocular, a point of sale (POS) terminal, medical equipment (for example, an electronic thermometer, a blood pressure monitor, a blood glucose meter, an electrocardiogram measurement device, an ultrasonic diagnostic device, an electronic endoscope), a fish finder, various measurement equipment, instruments (for example, instruments of vehicles, aircraft, ships), and flight simulators, in addition to the personal computer 1100 (mobile personal computer) of FIG. 16, the mobile phone 1200 of FIG. 17, and the digital still camera 1300 of FIG. 18.

Vehicle

Next, a vehicle to which the MEMS elements 1, 1a, 1b, 1c, 1d, 1e, and 101 according to the embodiments are applied will be described with reference to FIG. 19. In the following description, a configuration to which the MEMS element 1 is applied will be described by way of example.

Figure 19:
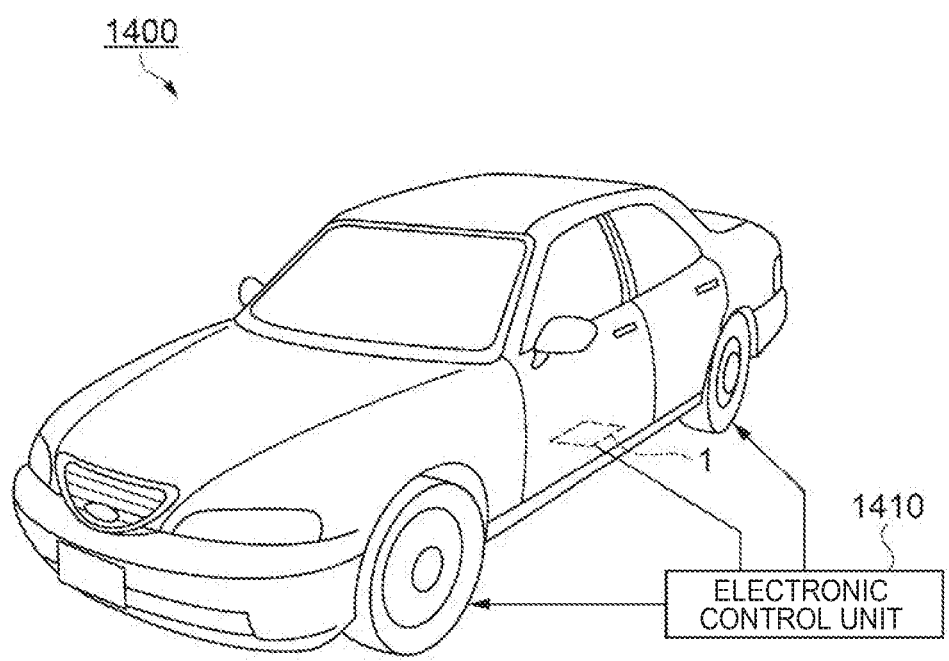
FIG. 19 is a perspective view illustrating a configuration of an automobile as a vehicle including the MEMS element.

FIG. 19 is a perspective view schematically illustrating an automobile 1400 as an example of the vehicle.

The MEMS element 1 is mounted on the automobile 1400. The MEMS element 1 can be widely applied to a keyless entry, an immobilizer, a navigation system, an air conditioner, an antilock brake system (ABS), an air bag, a tire pressure monitoring system (TPMS), an engine control, an electronic control unit (ECU) 1410 such as a battery monitor of a hybrid vehicle or an electric vehicle, and a body attitude control system and the like.

As described above, it is possible to provide a high-performance vehicle by utilizing the MEMS element 1 having excellent reliability at low cost in the vehicle.

As having been described above, although the MEMS elements 1, 1a, 1b, 1c, 1d, 1e, 101, and 101a, the electronic apparatus (1100, 1200, and 1300), and the vehicle (1400) have been described based on the illustrated embodiments, the invention is not limited thereto and the configuration of each portion can be replaced with any configuration having the same function. Any constitutional element may be added to the invention. Further, each of the embodiments described above may be appropriately combined.

In the embodiments described above, an example in which the element 20 is disposed so that the base portion 21 and the vibration portion 22 extend along the direction of one diagonal line of the rectangular SOI substrate 10, but is not limited thereto. As another disposition example, a configuration in which the element 20 is disposed such that the base portion 21 and the vibration portion 22 extend along the outer edge of the rectangular SOI substrate 10 may be adopted.

In the matters described above, the MEMS elements 1, 1a, 1b, 1c, 1d, 1e, and 101 provided with the element 20 as the functional element including the base portion 21, the vibration portion 22, and the like are described as an example of the MEMS element, but is not limited thereto. Other MEMS elements having the sealing structure described above may include the MEMS element provided with an acceleration sensor element having an acceleration detection function as a functional element, an angular velocity sensor element having an angular velocity detection function, a pressure sensor element having a pressure detection function, a weight sensor element having a weight detection function, or provided with a complex sensor in which these functional elements are combined and the like. Also, the MEMS element may be a vibrator, an oscillator, a frequency filter or the like having a vibration element as a functional element.

What is claimed is:

1. A Micro Electro Mechanical System (MEMS) element comprising:
    an element substrate on which an element is formed and an element electrode and an electrode pad connected to the element electrode are disposed;
    a support substrate supporting the element substrate; and
    a lid which is connected to the element substrate and forms an internal space with the element substrate and the support substrate, wherein:
    a first wiring through-hole is disposed at a position overlapping with the electrode pad of the element substrate in plan view,
    a second wiring through-hole communicating with the first wiring through-hole is disposed in the support substrate,
    a wiring electrode electrically connected to electrode pad is disposed in the first wiring through-hole,
    a first sealing hole that seals the internal space is disposed in the element substrate, and
    a second sealing hole communicating with the first sealing hole is provided in the support substrate.

2. The MEMS element according to claim 1, wherein an element adjustment layer is disposed between the element and the element electrode, and
    the element adjustment layer is also disposed between the electrode pad and the element substrate.

3. The MEMS element according to claim 1, wherein a metal layer comprised of the same material as the wiring electrode seals the first sealing hole.

4. The MEMS element according to claim 1, wherein the wiring electrode is a sputtered layer and has a plating layer stacked on the sputtered layer.

* * * * *